(12) United States Patent
Haukka et al.

(10) Patent No.: US 11,047,040 B2
(45) Date of Patent: *Jun. 29, 2021

(54) DUAL SELECTIVE DEPOSITION

(71) Applicant: ASM IP Holding B.V., Almere (NL)

(72) Inventors: Suvi P. Haukka, Helsinki (FI); Raija H. Matero, Helsinki (FI); Eva Tois, Helsinki (FI); Antti Niskanen, Helsinki (FI); Marko Tuominen, Helsinki (FI); Hannu Huotari, Helsinki (FI); Viljami J. Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/594,365

(22) Filed: Oct. 7, 2019

(65) Prior Publication Data
US 2020/0181766 A1 Jun. 11, 2020

Related U.S. Application Data

(63) Continuation of application No. 16/100,855, filed on Aug. 10, 2018, now Pat. No. 10,443,123, which is a (Continued)

(51) Int. Cl.
*C23C 16/04* (2006.01)
*C23C 16/455* (2006.01)
(Continued)

(52) U.S. Cl.
CPC .............. *C23C 16/04* (2013.01); *C23C 16/02* (2013.01); *C23C 16/06* (2013.01); *C23C 16/18* (2013.01); *C23C 16/22* (2013.01); *C23C 16/30* (2013.01); *C23C 16/402* (2013.01); *C23C 16/405* (2013.01); *C23C 16/407* (2013.01); *C23C 16/408* (2013.01); *C23C 16/45525* (2013.01); *C23C 16/56* (2013.01);
(Continued)

(58) Field of Classification Search
CPC ..................... C23C 16/04; C23C 16/45525
See application file for complete search history.

(56) References Cited

U.S. PATENT DOCUMENTS

| 4,804,640 A | 2/1989 | Kaganowicz |
| 4,863,879 A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

File History of U.S. Appl. No. 16/676,017, filed Nov. 6, 2019.
(Continued)

*Primary Examiner* — Elizabeth A Burkhart
(74) *Attorney, Agent, or Firm* — Knobbe, Martens, Olson & Bear LLP

(57) ABSTRACT

Methods are provided for dual selective deposition of a first material on a first surface of a substrate and a second material on a second, different surface of the same substrate. The selectively deposited materials may be, for example, metal, metal oxide, or dielectric materials.

18 Claims, 11 Drawing Sheets

Related U.S. Application Data continuation of application No. 14/687,833, filed on Apr. 15, 2015, now Pat. No. 10,047,435.

(60) Provisional application No. 61/980,373, filed on Apr. 16, 2014.

(51) Int. Cl.

| | | |
|---|---|---|
| *C23C 16/02* | (2006.01) | |
| *C23C 16/06* | (2006.01) | |
| *C23C 16/40* | (2006.01) | |
| *C23C 16/30* | (2006.01) | |
| *C23C 16/56* | (2006.01) | |
| *H01L 21/285* | (2006.01) | |
| *H01L 21/768* | (2006.01) | |
| *C23C 16/18* | (2006.01) | |
| *C23C 16/22* | (2006.01) | |

(52) U.S. Cl.
CPC .. *H01L 21/28562* (2013.01); *H01L 21/76829* (2013.01); *H01L 21/76849* (2013.01)

(56) References Cited

U.S. PATENT DOCUMENTS

| | | |
|---|---|---|
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,426,015 B1 | 7/2002 | Xia et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,852,635 B2 | 2/2005 | Satta et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,041,609 B2 | 5/2006 | Vaartstra |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,611,751 B2 | 11/2009 | Elers |
| 7,695,567 B2 | 4/2010 | Fu |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,293,597 B2 | 10/2012 | Raaijmakers |
| 8,293,658 B2 | 10/2012 | Shero et al. |
| 8,425,739 B1 | 4/2013 | Wieting |
| 8,466,052 B2 | 6/2013 | Baek et al. |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky M et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,349,687 B1 | 5/2016 | Gates et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,552,979 B2 | 1/2017 | Knaepen et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,047,435 B2 * | 8/2018 | Haukka ............... C23C 16/30 |
| 10,049,924 B2 | 8/2018 | Haukka et al. |
| 10,115,603 B2 | 10/2018 | Niskanen et al. |
| 10,157,786 B2 | 12/2018 | Haukka et al. |
| 10,186,420 B2 | 1/2019 | Fukazawa |
| 10,204,782 B2 | 2/2019 | Maes et al. |
| 10,343,186 B2 | 7/2019 | Pore et al. |
| 10,373,820 B2 | 8/2019 | Tois et al. |
| 10,428,421 B2 | 10/2019 | Haukka et al. |
| 10,443,123 B2 * | 10/2019 | Haukka ............... C23C 16/402 |
| 10,453,701 B2 | 10/2019 | Tois et al. |
| 10,480,064 B2 | 11/2019 | Longrie et al. |
| 10,546,741 B2 | 1/2020 | Murakami et al. |
| 10,695,794 B2 | 6/2020 | Pore et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121677 A1 | 6/2006 | Parekh et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Takatoshi et al. |
| 2006/0199399 A1 | 9/2006 | Muscat |
| 2006/0226409 A1 | 10/2006 | Burr et al. |
| 2006/0292845 A1 | 12/2006 | Chiang et al. |

(56) References Cited

U.S. PATENT DOCUMENTS

| | | |
|---|---|---|
| 2007/0014919 A1 | 1/2007 | Hamalainen et al. |
| 2007/0026654 A1 | 2/2007 | Huotari et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1* | 11/2010 | Dameron .......... H01L 21/31608 428/702 |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1* | 3/2012 | Marsh .................. C23C 16/0227 438/680 |
| 2012/0088369 A1 | 4/2012 | Weidman et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189837 A1* | 7/2013 | Haukka ............. H01L 21/02697 438/655 |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1* | 6/2015 | Romero ............ H01L 21/76816 438/641 |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0172189 A1 | 6/2016 | Tapily |
| 2016/0186004 A1 | 6/2016 | Hustad et al. |
| 2016/0190060 A1* | 6/2016 | Bristol .............. H01L 21/31058 257/635 |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2018/0040708 A1 | 2/2018 | Narayanan et al. |
| 2018/0080121 A1 | 3/2018 | Longrie et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2018/0233350 A1 | 8/2018 | Tois et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |

(56) References Cited

U.S. PATENT DOCUMENTS

2019/0341245 A1 11/2019 Tois et al.
2020/0051829 A1 2/2020 Tois et al.

FOREIGN PATENT DOCUMENTS

| EP | 1340269 | 2/2009 |
|---|---|---|
| JP | 2001127068 | 5/2001 |
| JP | 2011-187583 | 9/2011 |
| JP | 2014-93331 | 5/2014 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0920033 | 10/2009 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

File History of U.S. Appl. No. 16/605,475, filed Oct. 15, 2019.
File History of U.S. Appl. No. 16/773,064, filed Jan. 27, 2020.
File History of U.S. Appl. No. 16/033,952, filed Jul. 12, 2018.
File History of U.S. Appl. No. 16/399,328, filed Apr. 30, 2019.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
File History of U.S. Appl. No. 16/787,672, filed Feb. 11, 2020.
Aaltonen et al., "Atomic Layer Deposition of Iridium Thin Films", Journal of The Electrochemical Society, 151 (8) G489-G492 (2004).
Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via https://en.wikipedia.org/wiki/Benzotriazole; pp. 1-5, no date available.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton, B.B. et al., "Atomic Layer Deposition of MgO Using Bis(ethylcyclopentadienyl)magnesium and H20". J. Phys. Chem. C, 2009, 113, 1939-1946.
Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Carlsson, J., "Precursor Design for Chemical Vapour Deposition", Acta Chemica Scandinavica, vol. 45, 1991, pp. 864-869.
Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al. "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly(methyl methacrylate) Films as Mask Layers, J. Phys. Chem. C, 2008, 112, pp. 15791-15795. (Year: 2008).
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 15/432,263, filed Feb. 14, 2017.
File History of U.S. Appl. No. 16/158,780, filed Oct. 12, 2018.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 15/971,601, filed May 4, 2018.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of TiO2 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.

(56) References Cited

OTHER PUBLICATIONS

Hashemi et al., "Selective Deposition of Dielectrics: Limits and Advantages of Alkanethiol Blocking Agents on Metal-Dielectric Patterns", ACS Appl. Mater. Interfaces 2016, 8, pp. 33264-33272.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lee et al., Area-Selective Atomic Layor Deposition Using Self-Assembled Monolayer and Scanning Probe Lithography, Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M. "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-16102-3, 2010.
Mackus et al., "The use of atomic layer deposition in advanced nanopatterning", Nanoscale, 2014, 6, pp. 10941-10960.
Maluf et al., "Selective tungsten filling of sub-0.25µm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Schuiskly et al., "Atomic Layer Deposition of Thin Films Using O2 as Oxygen Source", Langmuir, vol. 17, No. 18, 2001, pp. 5508-5512.
Sundberg, et al.; Organic and Inorganic-Organic Thin Film Structures by Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov, et al.; Thermal Cyclodehydration of Polyamic Acid Initiated by UV-Irradiation; Iranian Polymer Journal; vol. 5, No. 1; pp. 1A323:C3286-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.
Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.
Vervuurt et al., "Area-selective atomic layer deposition of platinum using photosensitive polyimide", Nanotechnology 27, 2016, in 6 pages.
Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

(56) References Cited

OTHER PUBLICATIONS

Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.
File History of U.S. Appl. No. 16/588,600, filed Sep. 30, 2019.
File History of U.S. Appl. No. 16/836,151, filed Mar. 31, 2020.
File History of U.S. Appl. No. 16/987,990, filed Aug. 7, 2020.
File History of U.S. Appl. No. 17/135,001, filed Dec. 28, 2020.
File History of U.S. Appl. No. 17/113,383, filed Dec. 7, 2020.
File History of U.S. Appl. No. 17/064,865, filed Oct. 7, 2020.

\* cited by examiner

701

751

711

721

730                                    741

DUAL SELECTIVE DEPOSITION

CROSS-REFERENCE TO RELATED APPLICATIONS

This application is a continuation of U.S. application Ser. No. 16/100,855, filed Aug. 10, 2018, which is a continuation of U.S. application Ser. No. 14/687,833, filed on Apr. 15, 2015, now U.S. Pat. No. 10,047,435, which claims priority to U.S. Provisional Application No. 61/980,373, filed Apr. 16, 2014, each of which is hereby incorporated by reference in its entirety.

BACKGROUND OF THE INVENTION

Field of the Invention

The present application relates to selective deposition of two materials on two different surfaces of a substrate. In particular, a first material is selectively deposited on a first surface of a substrate relative to a second surface and a second material is selectively deposited on the second surface of the substrate relative to the first surface.

Description of the Related Art

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process.

In certain cases, the number of steps involved in manufacturing an integrated surface on a substrate may be reduced by utilizing a dual selective deposition process, wherein a first material is selectively deposited on a first surface of a substrate relative to a second surface and a second material is selectively deposited on the second surface of the substrate relative to the first, without the need, or with reduced need for subsequent processing. Methods are disclosed herein for dual selective deposition of a first material on a first surface of a substrate relative to a second surface and a second material on the second surface relative to the first surface.

SUMMARY OF THE INVENTION

According to some aspects of the present disclosure, selective deposition can be used to deposit a first material on a first surface of a substrate and a second material on a second surface of the same substrate. In some embodiments atomic layer deposition (ALD) type processes are used for selective deposition. In some embodiments chemical vapor deposition (CVD) type processes may be used for selective deposition. In some embodiments a metallic material is selectively deposited on a first surface of a substrate and a dielectric material is deposited on a second surface of the same substrate. In some embodiments a first metallic material is selectively deposited on a first surface of a substrate and a second metallic material is deposited on a second surface of the same substrate.

In some embodiments a first material is selectively deposited on a first surface of a substrate and a second material is selectively deposited on a second surface of the same substrate without an airbreak in between selective deposition of a first material and selective deposition of a second material. In some embodiments a first material is selectively deposited on a first surface of a substrate and a second material is selectively deposited on a second surface of the same substrate in the same reactor. In some embodiments a first material is selectively deposited on a first surface of a substrate and a second material is selectively deposited on a second surface of the same substrate without further processing in between selective deposition of a first material and selective deposition of a second material.

In some embodiments a first material is selectively deposited on a first surface of a substrate and a second material is selectively deposited on a second surface of the same substrate, with the selectivity of at least 80% for the selective deposition of the first material. In some embodiments a first material is selectively deposited on a first surface of a substrate and a second material is selectively deposited on a second surface of the same substrate, with a selectivity of at least 80% for the selective deposition of the second material.

In some embodiments selective deposition of a first material comprises at least one deposition cycle comprising alternately and sequentially contacting the substrate with a first metal precursor and a second reactant. In some embodiments selective deposition of a second material comprises at least one deposition cycle comprising alternately and sequentially contacting the substrate with a second precursor and a second reactant. In some embodiments a first material is selectively deposited on a first surface of a substrate and a second material is selectively deposited on a second surface of the same substrate, wherein up to 1-50 deposition cycles are carried out for selectively depositing the first material. In some embodiments a first material is selectively deposited on a first surface of a substrate and a second material is selectively deposited on a second surface of the same substrate, wherein up to 1-50 deposition cycles are carried out for selectively depositing the second material.

In some embodiments the first surface comprises Cu, Si—H, W, Ni, Co, Ru or another noble metal. In some embodiments the first surface is treated to inhibit deposition of a dielectric material thereon prior to selectively depositing a second dielectric material. In some embodiments the first surface is oxidized. In some embodiments the first surface is passivated. In some embodiments the first surface comprises a metal or semiconductor material.

In some embodiments the second surface comprises OH, $NH_x$ or $SH_x$-terminations. In some embodiments the second surface is the surface of a dielectric material. In some embodiments the second surface is treated to inhibit deposition of the first material thereon prior to selectively depositing the first material on the first surface of the same substrate. In some embodiments the second surface is treated to provide OH, $NH_x$ or $SH_x$-terminations thereon.

In some embodiments the first material is selected from Sb, Ge, Ru, noble metal, W, Cu, Al, Ni, and Co; and the second material is selected from $SbO_x$, $GeO_2$, $BiO_x$, MgO, $SiO_2$, $AlO_2$, and $TiO_2$. In some embodiments the first material comprises Ni, Ge, Fe, Co, or $TiO_2$; and the second material is Al or Cu.

In some embodiments a first material is selectively deposited on a first surface of a substrate and a second material is selectively deposited on a second surface of the same substrate, wherein selectively depositing a second material comprises using a passivation precursor. In some embodiments a passivation compound is selected from HCOOH, an alkylamine passivation compound, or both. In some embodiments passivation can occur during every deposition cycle of the second material.

BRIEF DESCRIPTION OF THE DRAWINGS

The invention will be better understood from the Detailed Description and from the appended drawings, which are meant to illustrate and not to limit the invention, and wherein.

DETAILED DESCRIPTION OF SOME EMBODIMENTS

Figure 1A:
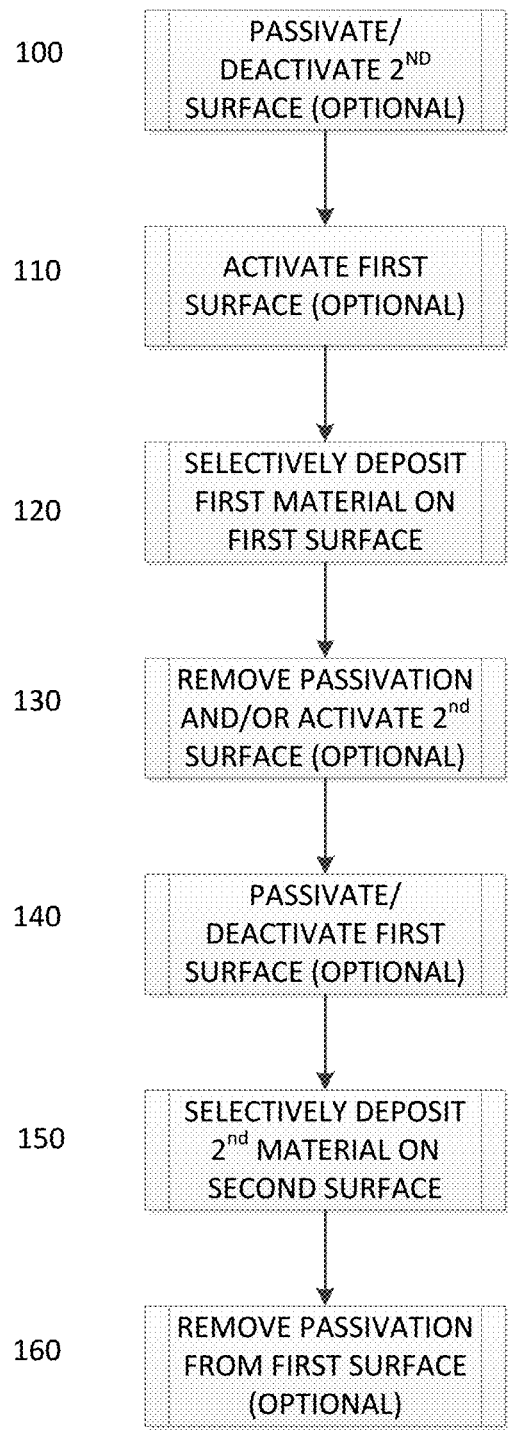
FIG. 1A illustrates a process flow for dual selective deposition of a first material on a first surface of a substrate and a second material on a second surface of the same substrate.

In some situations it is desirable to selectively deposit two different materials on two different surfaces of the same substrate. For example, in some situations a metal is to be deposited on a metal surface of a substrate and a dielectric is to be deposited on a dielectric surface of the same substrate. In other situations a material comprising metal is deposited on a metal surface of a substrate and a dielectric is deposited on an oxide, or dielectric surface of the same substrate. In other situations two different materials are to be deposited on either a dielectric OH terminated surface or HF etched Si surface (Si—H or hydrogen terminated silicon) surface of the same substrate. The two materials to be deposited can be two different metals to be deposited on adjacent surfaces of the same substrate. The ability to selectively deposit each material on the appropriate surface can provide advantages, such as faster processing times and reduced costs. One process for selective CVD of two different materials, including iron adjacent to sacrificial tungsten, is disclosed in Bien et al, Multiple Self-Aligned Iron Nanowires by a Dual Selective Chemical Vapor Deposition Process, *Electrochemical and Solid-State Letters,* 10 (9) H251-H253 (2007), which is hereby incorporated in its entirety.

Dual selective deposition processes as disclosed herein may be used in a variety of contexts, for example to form capping layers, barrier layers, etch stop layers, sacrificial and/or protective layers or for sealing pores, such as in porous low k materials. In some embodiments a metallic material may be deposited selectively on a first surface of a substrate preferentially over a second, different surface, such as a dielectric surface of the same substrate; and a dielectric material may be selectively deposited on the second surface relative to the first surface. In some embodiments deposition of the metallic material proceeds first, while in other embodiments deposition of the dielectric material is first. In some embodiments the first surface and the second surface are adjacent to each other on the substrate.

One or more surfaces may be treated in order to enhance deposition on one surface relative to one or more different surfaces. In some embodiments a first surface is treated, or activated, in order to enhance deposition on the first surface relative to a second, different surface on the same substrate. In some embodiments a second surface is treated, or deactivated, in order to decrease deposition on the second surface relative to a first, different surface on the same substrate. In some embodiments a first surface is treated to enhance deposition and a second surface is treated to decrease deposition, thereby increasing selective deposition on the first surface relative to the second surface. In some embodiments the deactivating treatment does not involve formation of a self-assembled monolayer (SAM) or a similar monolayer having a long carbon chain. In some embodiments the deactivating treatment is not treatment with an organic agent. For example, in some embodiments the deactivating treatment may be oxidation, reduction or halogenation, such as chlorination, of the surface. Deactivating can comprise in-situ passivation from gas phase reactants in the reactor using the organic group which is present in a precursor used to deposit one of the materials, such as dielectric. In case of any passivation either in-situ passivation with the organic groups or with SAMs, the passivation is preferably subject to removal at the deposition temperature with chemistry used to deposit the films or with additional chemistry, enabling passivation without dedicating a separate step for removing passivation. For instance passivation can be removed with $O_3$ pulse used to grow the second material or with an additional $O_3$ pulse.

For example, in some embodiments a dielectric material is deposited on a first dielectric surface of a substrate relative to a second surface, such as a conductive surface, metal surface, or H-terminated surface of the same substrate. The second surface may be oxidized prior to or at the beginning of the dielectric material deposition in order to decrease deposition of the dielectric material on the second surface relative to the dielectric surface. That is, selective deposition on the dielectric surface is increased relative to the treated second surface. In some embodiments the second surface is passivated, such as by treating the surface such that it comprises alkylsilyl groups. The passivation may facilitate selective deposition on the dielectric surface relative to the treated second surface. For example, deposition of an oxide on the second surface may be inhibited by the passivation. In some embodiments passivation does not include formation of a SAM or a similar monolayer having a long carbon chain on the second surface.

In some embodiments a dielectric surface may be treated to facilitate selective deposition of a metal on a second, different surface relative to the dielectric surface on the same substrate. For example, the dielectric surface may be treated to provide a hydrophilic OH-terminated surface. While an OH-terminated surface can be reactive to certain precursors, other precursors may not react with this termination. For example, an OH-terminated surface can be passive against adsorption of specific compounds like Cu-amidinate or ruthenium compounds that have two cyclopentadienyl (or derivative thereof) ligands. Thus, in some embodiments OH-termination can be used to inhibit deposition of a metal on a dielectric surface relative to a second, different surface, for example a conductive surface, metal surface, of H-terminated surface.

In some embodiments a dielectric surface can be passivated to inhibit deposition of a metal thereon. For example, the dielectric surface may be contacted with a chemical that provides a silylated (—Si—$(CH_3)_x$ or —$Si(CH_3)_3$) surface or a halogenated surface or a $SiH_3$ surface. In some embodiments the dielectric surface is chlorinated or fluorinated, such as a Si—Cl surface. A halogenated surface can be achieved by treating the surface with a halide chemical, such as $CCl_4$ or a metal halide, which is capable of forming volatile metal oxyhalides, such as $WF_6$, $NbF_5$, or $NbCl_5$, and leaving the halide, such as the chloride or fluoride on the surface. The passivation can be used to inhibit deposition of a metal on the dielectric surface relative to a metal surface on the same substrate. In some embodiments the passivation chemical is one or more of trimethylchlorosilane $(CH_3)_3SiCl$ (TMCS), trimethyldimethylaminosilane $(CH_3)_3SiN(CH_3)_2$ or another type of alkyl substituted silane having formula $R_{4-x}SiX_x$, wherein x is from 1 to 3 and each R can independently selected to be a C1-C5 hydrocarbon, such as methyl, ethyl, propyl or butyl, preferably methyl, and X is halide or X is another group capable of reacting with OH-groups, such as an alkylamino group —$NR_1R_2$, wherein each $R_1$ can be independently selected to be hydrogen or C1-C5 hydrocarbon, preferably methyl or ethyl, $R_2$ can be independently selected to be C1-C5 hydrocarbon, preferably methyl or ethyl, preferably X is chloride or dimethylamino. In some embodiments the passivation chemical can be a silane compound comprising at least one alkylamino group, such as bis(diethylamino)silane, or a silane compound comprising a $SiH_3$ group, or silazane, such hexamethyldisilazane (HMDS).

In some embodiments a semiconductor substrate is provided that comprises a first surface comprising a first material and a second surface comprising a second material that is different from the first material. In some embodiments the first surface and the second surface are adjacent to each other. In some embodiments the first surface is hydrophilic and may comprise an OH-terminated surface or a surface having some amount of OH-groups. In some embodiments the first surface may be, for example and without limitation, a low-k material, $SiO_2$ or $GeO_2$. In some embodiments the second surface is a metal surface. In some embodiments the second surface is a conductive surface. In some embodiments the second surface is an H-terminated surface. For example, the second surface may comprise, for example, Cu, Ni, Co, Al, W, Ru or another noble metal. Or it may comprise Si—H species (hydrogen-terminated silicon). In some embodiments the second surface comprises a metal selected individually from Cu, Ni, Co, Al, W, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal. In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive. For the purposes of the present disclosure, Sb and Ge are considered to be metals. In some embodiments the first surface is a metal surface, conductive surface, or Si—H surface and the second surface is a surface comprising OH-groups, such as a dielectric surface.

In some embodiments a first material is selectively deposited on a first surface relative to a second surface, and a second material is selectively deposited on the second surface relative to the first surface.

FIG. 1A illustrates an exemplary process flow for selectively depositing a first material on a first surface relative to a second surface and a second material on a second surface relative to the first surface of the same substrate. In some embodiments the first surface is a metal surface or semiconductor surface, the first material is a metallic material, the second surface is a hydrophilic surface, and the second material is a dielectric material. In some embodiments the first surface is a hydrophilic surface, the first material is a dielectric material, the second surface is a metal layer, and the second material is a metallic material. In other words, the two depositions (metallic and dielectric) can be conducted in either sequence. In some embodiments, the first material and/or the second material can be deposited by CVD, and selectivity can be achieved through selective decomposition of the precursor on the surface. In some embodiments at least one of the depositions is a cyclical vapor phase deposition, particularly atomic layer deposition (ALD), and selectivity can be achieved through selective adsorption of one of the reactants. In some embodiments the ALD process is not pure ALD process, but some CVD reactions can happen, if the selectivity is retained. For example, complete purging of the reactants from reaction space might not be necessarily needed, but some amount of gas phase reaction might occur and the selectivity can still be retained.

In some embodiments a first material is selectively deposited on a first surface relative to a second surface and a second material is selectively deposited on a second surface relative to the first surface of the same substrate without an airbreak or exposure to air. In some embodiments a first material is selectively deposited on a first surface relative to a second surface of the same substrate and a second material is selectively deposited on a second surface relative to the first surface of the same substrate within the same reactor. In some embodiments a dual selective deposition process may comprise selective deposition of a first material and selective deposition of a second material without an airbreak or exposure to air in between selective deposition processes. In some embodiments a dual selective deposition process is performed wherein a first material is deposited on a first surface and a second material is deposited on a second surface of the same substrate without further processing in between deposition of the first material and deposition of the second material. In some embodiments a dual selective deposition process may comprise selective deposition of a first material and selective deposition of a second material without further processing in between.

In some embodiments the process may start when the first material is selectively deposited on the first surface relative to the second surface. Prior to deposition, the second surface can be passivated or deactivated 100, for example as described herein, in order to inhibit deposition of the first material on the second surface, but in some embodiments such deactivation is not employed. The first surface can be activated 110, for example as described herein, in order to facilitate deposition of the first material on the first surface, but in some embodiments such activation is not employed. The first material is then selectively deposited 120 on the first surface relative to the second surface according to the methods disclosed herein.

In some embodiments, selective deposition of the first material on the first surface relative to the second surface comprises a vapor deposition process comprising at least one deposition cycle in which the substrate is alternately and sequentially contacted with a first reactant and a second reactant.

In some embodiments, the selective deposition of the first material continues until a desired thickness of first material is obtained on the first surface. In some embodiments selective deposition of the first material continues until a desired number of deposition cycles is completed. For example, in some embodiments up to about 1-50 deposition cycles for selectively depositing the first material are carried out.

In some embodiments after a desired thickness of the first material is deposited (or a desired number of cycles completed), any passivation can be removed from the second surface (if desired) and the second surface can be activated 130, but in some embodiments such activation is not employed. The first surface can be passivated or deactivated 140, for example as described herein, in order to inhibit deposition of the second material on the first surface, but in some embodiments such deactivation is not employed. The second material is then selectively deposited on the second surface relative to the first surface 150 according to methods disclosed herein. In some embodiments an passivation can optionally be removed 160 from the first surface (if desired).

In some embodiments, selective deposition of the second material on the second surface relative to the first surface comprises a vapor deposition process comprising at least one deposition cycle in which the substrate is alternately and sequentially contacted with a first reactant and a second reactant.

In some embodiments, the selective deposition of the second material continues until a desired thickness of second material is obtained on the second surface. In some embodiments selective deposition of the second material continues until a desired number of deposition cycles is completed. For example, in some embodiments up to about 1-50 deposition cycles for selectively depositing the second material are carried out.

In some embodiments deposition on the first surface of the substrate relative to the second surface of the substrate, and/or on the second surface of the substrate relative to the first surface of the substrate is at least about 90% selective, at least about 95% selective, at least about 96%, 97%, 98% or 99% or greater selective. In some embodiments deposition only occurs on the first surface and does not occur on the second surface or only occurs on the second surface and does not occur on the first surface.

In some embodiments deposition on the first surface of the substrate relative to the second surface of the substrate and/or on the second surface of the substrate relative to the first surface is at least about 80% selective, which may be selective enough for some particular applications. In some embodiments the deposition on the first surface of the substrate relative to the second surface of the substrate is at least about 50% selective, which may be selective enough for some particular application.

In some embodiments an etch may be used subsequent to or in the course of deposition to remove material that is non-selectively deposited. Although addition of an etch step would typically add cost and complexity to the process, in some situations it may be commercially desirable, for example if it is overall less expensive than other options. In some embodiments the etch process is preferably isotropic but may be a wet etch process or a dry etch process. In some embodiments a dry etch is preferable.

In some ALD embodiments deposition on the first surface of the substrate relative to the second surface of the substrate or on the second surface relative to the first surface can be performed up to about 500 deposition cycles before losing the selectivity, or up to about 50 deposition cycles, or up to about 20 deposition cycles, or up to about 10 deposition cycles, or up to about 5 deposition cycles before losing selectivity. In some embodiments even deposition of 1 or 2 cycles before losing selectivity can be useful.

A loss of selectivity can be understood to have occurred when the selectivities mentioned above are no longer met. Depending on the specific circumstances, a loss of selectivity may be considered to have occurred when deposition on the first surface of the substrate relative to the second surface of the substrate or on the second surface relative to the first surface is less than about 90% selective, less than about 95% selective, less than about 96%, 97%, 98% or 99% selective.

In some embodiments deposition on the first surface of the substrate relative to the second surface of the substrate or on the second surface relative to the first surface can be performed up to a thickness of about 50 nm before losing the selectivity, or up to about 10 nm, or up to about 5 nm, or up to about 3 nm, or up to about 2 nm, or up to about 1 nm before losing selectivity. In some embodiments even deposition of up to 3 Å or 5 Å before losing selectivity can be useful. Depending on the specific circumstances, a loss of selectivity may be considered to have occurred when deposition on the first surface of the substrate relative to the second surface of the substrate or on the second surface relative to the first surface is less than about 90% selective, less than about 95% selective, less than about 96%, 97%, 98% or 99% selective or greater.

In some embodiments it may be desirable to selectively deposit a metal oxide and subsequently reduce the metal oxide to metal. Methods for reduction of metal oxides to metals that may be used, such as by the use of a strong reducing agent like HCOOH, are described in U.S. Pat. No. 8,536,058, issued Sep. 17, 2013 and in U.S. Pat. No. 7,241,677, issued Jul. 10, 2007, the entire disclosure of each of which is incorporated herein by reference. In some embodiments a metal oxide is selectively deposited on a first surface of a substrate and is reduced to a metal prior to selective deposition of a second material on a second surface of the same substrate. In some embodiments a first material is selectively deposited on a first surface of a substrate and a metal oxide is selectively deposited on a second, different surface of the substrate. The metal oxide may then be reduced to a metal. In some embodiments a metal oxide is selectively deposited on a first surface of a substrate and a second material is selectively deposited on a second, different surface of the same substrate prior to reducing the metal oxide to a metal. In some embodiments the reducing agent, such as HCOOH, can also be used for passivation of a surface.

Figure 1B:
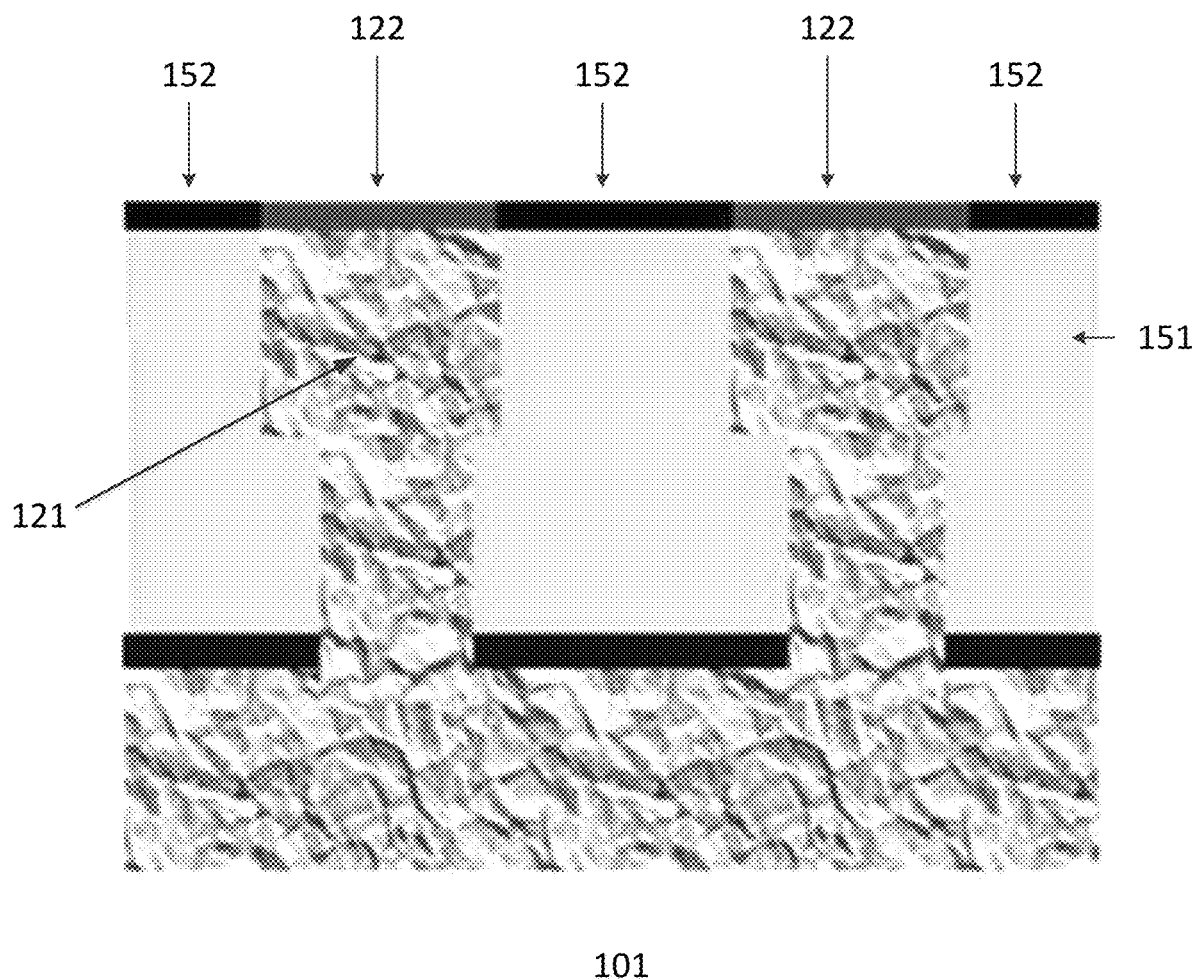
FIG. 1B illustrates dual selective deposition of a metallic material on a first metal surface and a dielectric material on a second different surface according to some embodiments.

FIG. 1B illustrates an example of dual selective deposition of a first metallic material 122 on a first metal surface 121 of a substrate 101, for example a Cu surface, and a second dielectric material 152 on a second different surface 151 of the same substrate 101, for example $SiO_2$ or a low-k surface.

ALD Type Processes

ALD type processes are based on controlled, self-limiting surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses.

Briefly, a substrate comprising a first surface and second, different surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the type of film being deposited and is preferably at or below about 400° C., more preferably at or below about 200° C. and most preferably from about 20° C. to about 200° C.

The surface of the substrate is contacted with a vapor phase first reactant. In some embodiments a pulse of vapor phase first reactant is provided to a reaction space containing the substrate. In some embodiments the substrate is moved to a reaction space containing vapor phase first reactant. Conditions are preferably selected such that no more than about one monolayer of the first reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

The surface of the substrate is contacted with a vapor phase second gaseous reactant. In some embodiments a pulse of a second gaseous reactant is provided to a reaction space containing the substrate. In some embodiments the substrate is moved to a reaction space containing the vapor phase second reactant. Excess second reactant and gaseous byproducts of the surface reaction, if any, are removed from the substrate surface. The steps of contacting and removing are repeated until a thin film of the desired thickness has been selectively formed on the first surface of substrate, with each cycle leaving no more than a molecular monolayer. Additional phases comprising alternately and sequentially contacting the surface of a substrate with other reactants can be included to form more complicated materials, such as ternary materials.

As mentioned above, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in a reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

Examples of suitable reactors that may be used include commercially available ALD equipment such as the F-120® reactor, Eagle® XP8, Pulsar® reactor and Advance® 400 Series reactor, available from ASM America, Inc. of Phoenix, Ariz., ASM Japan KK, Tokyo, Japan and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. patent application Ser. No. 10/929,348, filed Aug. 30, 2004 and Ser. No. 09/836,674, filed Apr. 16, 2001, the disclosures of which are incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Figure 2:
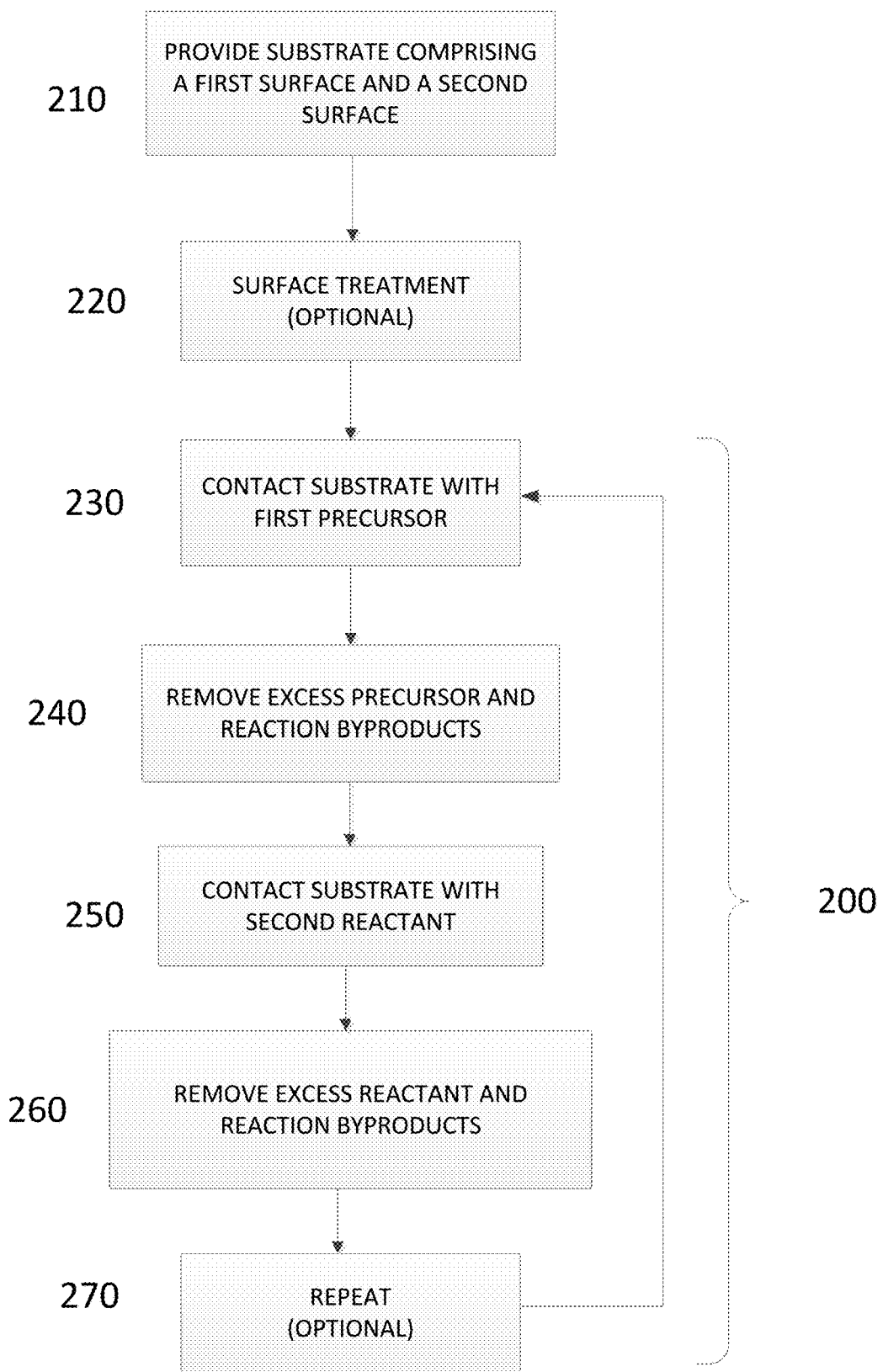
FIG. 2 illustrates a process flow for selectively depositing a material on a first surface of a substrate relative to a second, different surface of the same substrate.

Referring to FIG. 2 and according to some embodiments a substrate comprising a first surface and a second surface is provided at step 210 and a material is selectively deposited on a first surface of the substrate relative to a second surface by an ALD type deposition process 200 comprising multiple cycles, each cycle comprising:

contacting the surface of a substrate with a vaporized first precursor at step 230;

removing excess first precursor and reaction by products, if any, from the surface at step 240;

contacting the surface of the substrate with a second vaporized reactant at step 250;

removing from the surface, at step 260, excess second reactant and any gaseous by-products formed in the reaction between the first precursor layer on the first surface of the substrate and the second reactant, and;

repeating at step 270 the contacting and removing steps until a thin film comprising the selectively deposited material of the desired thickness has been formed.

As mentioned above, in some embodiments one or more surfaces of the substrate may be treated in order to enhance deposition on one surface relative to one or more different surfaces prior to beginning the deposition process 200. In FIG. 2 this is indicated by step 220.

Although the illustrated deposition cycle begins with contacting the surface of the substrate with the first precursor, in other embodiments the deposition cycle begins with contacting the surface of the substrate with the second reactant. It will be understood by the skilled artisan that contacting the substrate surface with the first precursor and second reactant are interchangeable in the ALD cycle.

In some embodiments, the reactants and reaction by-products can be removed from the substrate surface by stopping the flow of first precursor while continuing the flow of an inert carrier gas such as nitrogen or argon.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps, 240 and 260 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

Selective Deposition of Metal

As mentioned above, in some embodiments a metal is selectively deposited on a first surface of a substrate relative to a second, different surface, such as a dielectric surface of the same substrate. In some embodiments the first surface is a noble metal surface. In some embodiments the first metal surface is an Al, Cu, Ru, Ni, Co, or other noble metal surface. In some embodiments the first surface comprises a metal selected individually from Cu, Ni, Co, Al, W, Ru and other noble metals. In some embodiments the first surface is a Cu surface. In some embodiments the first surface is a Ni surface. In some embodiments the first surface is a Co surface. In some embodiments the first surface is an Al surface. In some embodiments the first surface is a Ru surface. In some embodiments the first surface comprises a noble metal.

In some embodiments the first surface comprises metal. In some embodiments the first surface is a conductive surface. In some embodiments the first surface is an H-terminated surface. For example, the first surface may comprise Si—H species (hydrogen-terminated silicon). In some embodiments the first surface is not a dielectric surface. In some embodiments the metal surface comprises an oxide such as CuOx, NiOx, CoOx or RuOx or another noble metal oxide. In some embodiments a metal surface may no longer be conductive after it has been treated. For example, a metal surface may be treated prior to or at the beginning of the selective deposition process, such as by oxidation, and the treated surface may no longer be conductive. In some embodiments the second, non-metal surface, is a hydrophilic, OH-terminated surface or contains some amount of OH-groups. In some embodiments the second, non-metal, surface is a dielectric surface. In some embodiments the second, non-metal surface is $SiO_2$, $GeO_2$, or low-k material.

In some embodiments the second, non-metal surface is deactivated, such as by a treatment to provide a surface on which metal deposition is inhibited. In some embodiments deactivation may comprise treatment with a passivation chemical. In some embodiments the deactivation treatment can occur prior to the deposition of a metal on a first metal surface. In some embodiments the deactivation treatment may be an in situ deactivation treatment. In some embodiments deactivation of the hydrophilic surface may comprise replacing at least OH-groups with other groups. In some embodiments deactivation can include treatment to increase the amount of OH-groups on the second, non-metal, surface.

In some embodiments the second surface is deactivated, such as by passivation prior to deposition of a metal. In some embodiments deactivation of the second surface may comprise replacing at least some OH-groups with other groups. In some embodiments the second surface is treated with a passivation chemical to form a passivated surface. For example, the second surface may be silylated or halogenated, such as chlorinated or fluorinated, prior to deposition of the metal. In some embodiments the second surface may be treated to form a silylated surface, such as a silylated —Si—$(CH_3)_x$ or —Si$(CH_3)_3$ surface. In some embodiments the second surface may be treated to form a halogenated surface, such as a chlorinated or fluorinated surface. For example, the halogenated surface may be a Si—Cl surface. In some embodiments the second surface may be treated to provide a H-terminated surface, for example a —$SiH_3$ surface. For example, in some embodiments the second surface may be contacted with a chemical that provides a —SiH₃ surface.

In some embodiments deposition on the first surface of the substrate relative to the second surface of the substrate is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

Selective Deposition of Sb by ALD

In some embodiments Sb is selectively deposited on a first surface comprising a metal on a substrate comprising a first surface and a second, different surface. In some embodiments the first surface is a hydrophilic surface. In some embodiments the first surface is a dielectric surface. In some embodiments, Sb is selectively deposited on a first surface of a substrate, such as a Cu, Ni, Co, Al, W, Ru, or another noble metal surface relative to a second, different surface of the same substrate. In some embodiments Sb is selectively deposited on Cu surface, relative to a second, different surface. In some embodiments Sb is selectively deposited on a Ni surface, relative to a second, different surface. In some embodiments Sb is selectively deposited on a Co surface, relative to a second, different surface. In some embodiments Sb is selectively deposited on a Al surface, relative to a second, different surface. In some embodiments Sb is selectively deposited on a Ru surface, relative to a second, different surface. In some embodiments Sb is selectively deposited on a noble metal surface, relative to a second, different surface.

In some embodiments the first surface comprises metal. In some embodiments the first surface is a conductive surface. In some embodiments the first surface is an H-terminated surface. For example, the first surface may comprise Si—H species (hydrogen-terminated silicon).

In some embodiments Sb is selectively deposited on a first hydrophilic surface of a substrate, relative to a second, different surface of the same substrate. In some embodiments the first hydrophilic surface may comprise at least some OH-groups. In some embodiments the first surface is a —NH$_x$ terminated surface. In some embodiments the first surface is a —SH$_x$ terminated surface. In some embodiments the hydrophilic surface is a dielectric surface. In some embodiments the hydrophilic surface may comprise $SiO_2$, a low k material, or $GeO_2$. In some embodiments the second, different surface comprises a metal surface or a dielectric surface comprising Si—H surface terminations as described herein.

In some embodiments the metal surface comprises an oxide such as CuOx, NiOx, CoOx or RuOx or another noble metal oxide. In some embodiments a metal surface may no longer be conductive after it has been treated. For example, a metal surface may be treated prior to or at the beginning of the selective deposition process, such as by oxidation, and the treated surface may no longer be conductive.

In some embodiments the second surface is a hydrophilic surface. In some embodiments the hydrophilic surface may comprise at least some OH-groups. In some embodiments the second surface is a —NH$_x$ terminated surface. In some embodiments the second surface is a —SH$_x$ terminated surface. In some embodiments the hydrophilic surface is a dielectric surface. In some embodiments the hydrophilic surface may comprise $SiO_2$, a low k material, or $GeO_2$.

As previously discussed, in some embodiments a hydrophilic surface is treated to facilitate selective deposition of Sb relative to the hydrophilic surface. For example, a surface may be treated to provide a hydrophilic OH-terminated surface. In some embodiments a hydrophilic OH-terminated surface may be treated to increase the amount of OH-groups on the surface. For example, the dielectric surface may be exposed to H2O vapor in order to increase the number of OH-groups at the surface. Another example includes exposing a dielectric surface to a carrier gas that has flowed through a bubbler at a temperature of between 25° C. and 40° C. In some embodiments the dielectric surface is exposed to air in order to provide a hydrophilic surface that comprises at least some OH-groups. In some embodiments a hydrophilic surface is not treated prior to deposition.

In some embodiments the hydrophilic surface is deactivated, such as by passivation prior to deposition of Sb. In some embodiments deactivation of the hydrophilic surface may comprise replacing at least OH-groups with other groups. In some embodiments the hydrophilic dielectric surface is treated with a passivation chemical to form a passivated surface. For example, the hydrophilic surface may be silylated or halogenated, such as chlorinated or fluorinated, prior to deposition of the Sb. In some embodiments the hydrophilic surface may be treated to form a silylated surface, such as a silylated —Si—(CH$_3$)$_x$ or —Si(CH$_3$)$_3$ surface. In some embodiments the hydrophilic surface may be treated to form a halogenated surface, such as a chlorinated or fluorinated surface. For example, the halogenated surface may be a Si—Cl surface. In some embodiments the hydrophilic surface may be treated to provide a H-terminated surface, for example a —SiH$_3$ surface. For example, in some embodiments the hydrophilic surface may be contacted with a chemical that provides a H-terminated surface. In some embodiments the hydrophilic surface may be contacted with HF to provide a H-terminated surface.

In some embodiments the passivation chemical is one or more of trimethylchlorosilane (CH$_3$)$_3$SiCl (TMCS), trimethyldimethylaminosilane (CH$_3$)$_3$SiN(CH$_3$)$_2$ or another type of alkyl substituted silane having formula $R_{4-x}SiX_x$, wherein x is from 1 to 3 and each R can independently selected to be a C1-C5 hydrocarbon, such as methyl, ethyl, propyl or butyl, preferably methyl, and X is halide or X is another group capable of reacting with OH-groups, such as an alkylamino group —NR$_1$R$_2$, wherein each R$_1$ can be independently selected to be hydrogen or C1-C5 hydrocarbon, preferably methyl or ethyl, R$_2$ can be independently selected to be C1-C5 hydrocarbon, preferably methyl or ethyl, preferably X is chloride or dimethylamino. In some embodiments the passivation chemical can be a silane compound comprising at least one alkylamino group, such as bis(diethylamino) silane, or a silane compound comprising a SiH$_3$ group, or silazane, such hexamethyldisilazane (HMDS).

In some embodiments Sb deposition on the first surface of the substrate relative to the second surface of the substrate is at least about 90% selective, at least about 95% selective, at least about 96%, 97%, 98% or 99% or greater selective. In some embodiments Sb deposition only occurs on the first surface and does not occur on the second surface. In some embodiments Sb deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments Sb is selectively deposited by an ALD type process. In some embodiments Sb is selectively deposited without the use of plasma. In some embodiments deposition may be carried out, for example, as described in U.S. Publication No. 2012/0329208 (U.S. application Ser. No. 13/504,079), which is hereby incorporated by reference.

In some embodiments a substrate comprising a first surface and a second surface is provided and a metal, here Sb, is selectively deposited on a first surface of a substrate by an ALD type deposition process comprising multiple cycles, each cycle comprising:

contacting the surface of a substrate with a vaporized first metal precursor, for example $SbCl_3$;

removing excess metal precursor and reaction by-products, if any, from the surface;

contacting the surface of the substrate with a second vaporized reactant, for example $Sb(SiEt_3)_3$;

removing from the surface, excess second reactant and any gaseous by-products formed in the reaction between the metal precursor layer on the first surface of the substrate and the second reactant, and;

repeating at the contacting and removing steps until a metal, here Sb, thin film of the desired thickness has been formed.

As mentioned above, in some embodiments one or more surfaces of the substrate may be treated in order to enhance deposition on one surface relative to one or more different surfaces prior to beginning the deposition process. In some embodiments the second, non-metal surface can be treated to provide an OH-terminated surface, or can be deactivated, such as by passivation, prior to deposition of the metal, here Sb.

Although the illustrated Sb deposition cycle begins with contacting the surface of the substrate with the first Sb precursor, in other embodiments the deposition cycle begins with contacting the surface of the substrate with the second reactant. It will be understood by the skilled artisan that contacting the substrate surface with the first Sb precursor and second reactant are interchangeable in the ALD cycle.

In some embodiments, the reactants and reaction by-products can be removed from the substrate surface by stopping the flow of the first precursor while continuing the flow of an inert carrier gas such as nitrogen or argon.

In some embodiments, the reactants and reaction by-products can be removed from the substrate surface by stopping the flow of second reactant while continuing the flow of an inert carrier gas such as nitrogen or argon.

In some embodiments the substrate is moved such that different reactants alternately and sequentially contact the surface of the substrate in a desired sequence for a desired time. In some embodiments the removing steps are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

In some embodiments the second reactant can comprise a Sb precursor. In some embodiments the second reactant is a second Sb precursor. In some embodiments the second reactant is a second Sb precursor that is different from the first Sb precursor.

In some embodiments the first Sb precursor has a formula of $SbX_3$, wherein X is a halogen element. In some embodiments the first Sb precursor is $SbCl_3$, $SbBr_3$ or $SbI_3$.

In some embodiments, the second reactant is not an oxygen source. The term "oxygen source" refers to reactants that comprise oxygen, such as water, ozone, alcohol, oxygen atoms, oxygen plasma and oxygen radicals, typically used in ALD for depositing metal oxides. In some embodiments the second reactant is not water, ozone or alcohol.

In some embodiments the second reactant to be used in combination with the Sb precursors disclosed herein is not an alkylaminogermanium precursor, such as tetraalkylminogermanium, or organotellurium precursor. In some embodiments the second reactant to be used in combination with the Sb precursors disclosed herein is not a chalcogenide precursor. In some embodiments the second reactant to be used in combination with the Sb precursors disclosed herein does not contain plasma or an excited species. In some embodiments the second reactant to be used in combination with the Sb precursors disclosed herein does not contain nitrogen. In some embodiments the second reactant to be used in combination with the Sb precursors disclosed herein is not an alkoxide substituted precursor. In some embodiments the second reactant to be used in combination with the Sb precursors disclosed herein is not an amino substituted precursor. In some embodiments the second reactant to be used in combination with the Sb precursors disclosed herein is not an alkyl substituted precursor. In some embodiments the second reactant to be used in combination with the Sb precursors disclosed herein does not contain a direct Sb—C bond.

The Sb center atoms of the Sb precursors disclosed herein can be bonded to Si, Ge, or Sn atoms. Sb is more electronegative than Si, Ge or Sn, which will create polarity in bonds and thus a partial negative charge on the Sb center atoms of the Sb precursors disclosed herein. In some embodiments, the Sb center atoms can have a negative oxidation state. It is believed, although not being bound to any theory, that the slight partial negative charge of the center atom in the precursors disclosed herein, for example the slight partial negative charge of Sb in $Sb(SiEt_3)_3$, combined with the partial positive charge of the center atom in the other precursor, for example the partial positive charge of Sb in $SbCl_3$, makes the precursor combination successful and film deposition possible.

In some embodiments the second reactant to be used in combination with the Sb precursors disclosed herein is not a reducing agent, such as hydrogen, $H_2$/plasma, amine, imine, hydrazine, silane, silyl chalcogenide, germane, ammonia, alkane, alkene or alkyne. As used herein a reducing agent refers to a compound capable of reducing an atom of the other reactant, usually the atom which will be deposited in the film in an ALD process and sometimes to elemental form. At the same time the reducing agent can be oxidized. It may be noted that with oxidative chemistry, for example with an oxidation agent, it is also possible to produce elemental films if the formal oxidation states of the atom, which will be deposited, are negative in the other precursor. In some embodiments the Sb precursors disclosed herein act as a reducing agent in an ALD process.

In some embodiments the second reactant to be used in combination with Sb precursors disclosed herein is an oxidizing precursor, such as $SbCl_3$. Preferably the oxidizing precursor is not water, alcohol or ozone. As used herein an oxidizing precursor is a precursor, which has a partial positive charge in the center atom of the molecule, such as Sb in case of $SbCl_3$, and thus center atoms can be considered to have positive oxidation states. The partial positive charge of the oxidizing precursors will be decreased in the deposited film i.e. the center atom of the molecule can be considered to be somewhat reduced although no real oxidation state increase has happened. In some embodiments the antimony deposition cycle only uses two reactive compounds.

Preferably, the second reactant is a Sb precursor with a formula of $Sb(SiR1R2R3)_3$, wherein R1, R2, and R3 are alkyl groups comprising one or more carbon atoms. The R1, R2, and R3 alkyl groups can be selected based on the desired physical properties of the precursor such as volatility, vapor pressure, toxicity, etc.

In some embodiments the first Sb precursor is $SbCl_3$ and the second Sb precursor is $Sb(SiEt_3)_3$.

The substrate temperature during selective Sb thin film deposition is preferably less than 250° C. and more preferably less than 200° C. and even more preferably below 150° C.

Pressure of the reactor can vary much depending from the reactor used for the depositions. Typically reactor pressures are below normal ambient pressure.

The skilled artisan can determine the optimal reactant evaporation temperatures based on the properties of the selected precursors. The evaporation temperatures for the second Sb precursor, such as $Sb(SiEt_3)_3$, or $Sb(SiMe_3)_3$ which can be synthesized by the methods described herein, is typically about 85° C., or about room temperature, respectively. The evaporation temperature for the first Sb precursor, such as $SbCl_3$, is typically about 30° C. to 50° C.

The skilled artisan can determine the optimal reactant contact times through routine experimentation based on the properties of the selected precursors and the desired properties of the deposited Sb thin film. Preferably the first and second Sb reactants are contacted for about 0.05 to 10 seconds, more preferably about 0.2 to 4 seconds, and most preferably about 1 to 2 seconds. The removal steps in which excess reactant and reaction by-products, if any, are removed are preferably about 0.05 to 10 seconds, more preferably about 0.2-4 seconds, and most preferably 1 to 2 seconds in length.

The growth rate of the elemental Sb thin films will vary depending on the reaction conditions. As described below, in initial experiments, the growth rate varied between about 0.3 and about 0.5 Å/cycle.

As previously discussed, in some embodiments Sb deposition on the first surface of the substrate relative to the second surface of the substrate is at least about 90% selective, at least about 95% selective, at least about 96%, 97%, 98% or 99% or greater selective. In some embodiments Sb deposition only occurs on the first surface and does not occur on the second surface. In some embodiments Sb deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

Sb Precursors

Precursors that may be used as a first or second reactant in ALD type selective deposition processes for Sb disclosed herein are discussed below.

In some embodiments the Sb precursors disclosed herein can be the first Sb precursor. In some embodiments the Sb precursors disclosed herein can be the second reactant. In some embodiments the Sb precursors disclosed herein can be the first Sb precursor or the second reactant. In some embodiments the Sb precursors disclosed herein can be the first Sb precursor and the second reactant. In some embodiments the first Sb precursor is a Sb precursor disclosed herein and the second reactant is a second, different Sb precursor disclosed herein.

In some embodiments Sb precursors that may be used as the first Sb precursor, the second reactant, or both include, Sb halides, such as $SbCl_3$ and $SbI_3$, Sb alkoxides, such as $Sb(OEt)_3$ and Sb amides.

In some embodiments a Sb precursor has Sb bound to at least one silicon atom, preferably at least to two silicon atoms and more preferably Sb is bound to three silicon atoms. For example it can have a general formula of $Sb(AR1R2R3)_3$, wherein A is Si or Ge, and R1, R2, and R3 are alkyl groups comprising one or more carbon atoms. Each of the R1, R2 and R3 ligands can be selected independently of each other. The R1, R2, and R3 alkyl groups can be selected independently of each other in each ligand based on the desired physical properties of the precursor such as volatility, vapor pressure, toxicity, etc. In some embodiments, R1, R2 and/or R3 can be hydrogen, alkenyl, alkynyl or aryl groups. In some embodiments, R1, R2, R3 can be any organic groups containing heteroatoms, such as N, O, F, Si, P, S, Cl, Br or I. In some embodiments R1, R2, R3 can be halogen atoms. In some embodiments the Sb precursor have a general formula of $Sb(SiR1R2R3)_3$, wherein R1, R2, and R3 are alkyl groups comprising one or more carbon atoms. In some embodiments, R1, R2 and/or R3 can be unsubstituted or substituted C1-C2 alkyls, such as methyl or ethyl groups. The R1, R2, and R3 alkyl groups can be selected independently of each other in each ligand based on the desired physical properties of the precursor such as volatility, vapor pressure, toxicity, etc. In some embodiments the Sb precursor is $Sb(SiMe_2tBu)_3$. In other embodiments the precursor is $Sb(SiEt_3)_3$ or $Sb(SiMe_3)_3$. In more preferred embodiments the precursor has a Sb—Si bond and most preferably a three Si—Sb bond structure.

In some embodiments a Sb precursor has a general formula of $Sb[A1(X1R1R2R3)_3][A2(X2R4R5R6)_3][A3(X3R7R8R9)_3]$ wherein A1, A2, A3 can be independently selected to be Si or Ge and wherein R1, R2, R3, R4, R5, R6, R7, R8, and R9, can be independently selected to be alkyl, hydrogen, alkenyl, alkynyl or aryl groups. In some embodiments, R1, R2, R3, R4, R5, R6, R7, R8, and R9 can be any organic groups containing also heteroatoms, such as N, O, F, Si, P, S, Cl, Br or I. In some embodiments one or more R1, R2, R3, R4, R5, R6, R7, R8, and R9 can be halogen atoms. In some embodiments X1, X2, and X3 can be Si, Ge, N, or O. In some embodiments X1, X2, and X3 are different elements. In embodiments when X is Si then Si will be bound to three R groups, for example $Sb[Si(SiR1R2R3)_3][Si(SiR4R5R6)_3][Si(SiR7R8R9)_3]$. In embodiments when X is N then nitrogen will only be bound to two R groups $Sb[Si(NR1R2)_3][Si(NR3R4)3][Si(NR5R6)3]$. In embodiments when X is O, the oxygen will only be bound to one R group, for example $Sb[Si(OR1)_3][Si(OR2)_3][Si(OR3)_3]$. R1, R2, R3, R4, R5, R6, R7, R8, and R9 groups can be selected independently of each other in each ligand based on the desired physical properties of the precursor such as volatility, vapor pressure, toxicity, etc.

Selective Deposition of Ge on Metal

In some embodiments Ge is selectively deposited on a first surface relative to a different surface of the same substrate. In some embodiments Ge is selectively deposited on a metal surface, such as a Ni, Co, Cu, Al, Ru, or other noble metal surface relative to a different surface of the same substrate, such as a passivated surface. In some embodiments the first surface is a hydrophilic surface. In some embodiments the first surface is a dielectric surface. In some embodiments Ge is selectively deposited on a Cu surface, relative to a second, different surface. In some embodiments Ge is selectively deposited on a Ni surface, relative to a second, different surface. In some embodiments Ge is selectively deposited on a Co surface, relative to a second, different surface. In some embodiments Ge is selectively deposited on a Al surface, relative to a second, different surface. In some embodiments Ge is selectively deposited on a Ru surface relative to a second, different surface. In some embodiments Ge is selectively deposited on a noble metal relative to a second, different surface.

In some embodiments the metal surface comprises an oxide such as CuOx, NiOx, CoOx or RuOx or another noble metal oxide. In some embodiments a metal surface may no longer be conductive after it has been treated. For example, a metal surface may be treated prior to or at the beginning of the selective deposition process, such as by oxidation, and the treated surface may no longer be conductive.

In some embodiments Ge is selectively deposited on a surface comprising metal, such as Ni, Co, Cu, Al, Ru, or other noble metal relative to a different surface of the same substrate. In preferred embodiments, however, Ge is selectively deposited on a dielectric, OH terminated surface through decomposition of for instance Ge alkoxide precursor, relative to Si—H terminated surface of the same substrate. The hydrophilic surface may comprise at least some OH-groups. In some embodiments the hydrophilic surface is a dielectric surface. In some embodiments the hydrophilic surface may comprise Si—OH or Ge—OH surface groups, SiO$_2$, a low k material, or GeO$_2$. In some embodiments Ge is selectively deposited by a cyclical deposition process. For example, the substrate may be alternately and sequentially contacted with a germanium reactant, such as a germanium alkoxide or alkylamine and a second reactant, such as a nitrogen reactant like NH$_3$. In some embodiments the Ge reactant is one of Ge(OEt)$_4$, Ge(OMe)$_4$, Ge(O$^i$Pr)$_4$ or Ge(O$^t$Bu)$_4$.

In some embodiments the first surface comprises metal. In some embodiments the first surface is a conductive surface. In some embodiments the first surface is an H-terminated surface. For example, the first surface may comprise Si—H species (hydrogen-terminated silicon).

In some embodiments Ge is selectively deposited by a process such as that described in U.S. application Ser. No. 14/135,383, filed Dec. 19, 2013, which is hereby incorporated by reference.

In some embodiments Ge deposition on the first surface of the substrate relative to the second surface of the substrate is at least about 90% selective, at least about 95% selective, at least about 96%, 97%, 98% or 99% or greater selective. In some embodiments Ge deposition only occurs on the first surface and does not occur on the second surface. In some embodiments Ge deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is a hydrophilic surface. In some embodiments the hydrophilic surface may comprise at least some OH-groups. In some embodiments the second surface is a —NH$_x$ terminated surface. In some embodiments the second surface is a —SH$_x$ terminated surface. In some embodiments the hydrophilic surface is a dielectric surface. In some embodiments the hydrophilic surface may comprise SiO$_2$, a low k material, or GeO$_2$. In some embodiments Ge is selectively deposited by an ALD type deposition process. For example, the substrate may be alternately and sequentially contacted with a germanium reactant, such as a germanium alkoxide or alkylamine and a second reactant, such as a nitrogen reactant like NH$_3$.

As previously discussed, in some embodiments the second surface is treated to facilitate selective deposition of Ge on a metal surface relative to the second surface. For example, the second surface may be treated to provide a hydrophilic OH-terminated surface. In some embodiments a hydrophilic OH-terminated surface may be treated to increase the amount of OH-groups on the surface. For example, the dielectric surface may be exposed to H2O vapor in order to increase the number of OH-groups at the surface. Another example includes exposing a dielectric surface to a carrier gas that has flowed through a bubbler at a temperature of between 25° C. and 40° C. In some embodiments the dielectric surface is exposed to air in order to provide a hydrophilic surface that comprises at least some OH-groups. In some embodiments a hydrophilic surface is not treated prior to deposition.

In some embodiments the hydrophilic surface is deactivated, such as by passivation prior to deposition of Ge. In some embodiments deactivation of the hydrophilic surface may comprise replacing at least OH-groups with other groups. In some embodiments the hydrophilic dielectric surface is treated with a passivation chemical to form a passivated surface. For example, the hydrophilic surface may be silylated or halogenated, such as chlorinated or fluorinated, prior to deposition of the Ge. In some embodiments the hydrophilic surface may be treated to form a silylated surface, such as a silylated —Si—(CH$_3$)$_x$ or —Si(CH$_3$)$_3$ surface. In some embodiments the hydrophilic surface may be treated to form a halogenated surface, such as a chlorinated or fluorinated surface. For example, the halogenated surface may be a Si—Cl surface. In some embodiments the hydrophilic surface may be treated to provide a H-terminated surface, for example a —SiH$_3$ surface. For example, in some embodiments the hydrophilic surface may be contacted with a chemical that provides a H-terminated surface.

As noted above, processes described herein enable use of ALD type deposition techniques to selectively deposit germanium. The ALD type deposition process is mostly surface-controlled (based on controlled reactions at the first substrate surface) and thus has the advantage of providing high conformality at relatively low temperatures. However, in some embodiments, the germanium precursor may at least partially decompose. Accordingly, in some embodiments the ALD type process described herein is a pure ALD process in which no decomposition of precursors is observed. In other embodiments reaction conditions, such as reaction temperature, are selected such that a pure ALD process is achieved and no precursor decomposition takes place.

Because of the variability in decomposition temperatures of different compounds, the actual reaction temperature in any given embodiment may be selected based on the specifically chosen precursors. In some embodiments the deposition temperature is below about 600° C. In some embodiments the deposition temperature is below about 500° C. In some embodiments the deposition temperature is below about 450° C. In some embodiments the deposition temperature is preferably below about 400° C. and even, in some cases, below about 375° C.

In some embodiments Ge is selectively deposited on a first surface of a substrate relative to a second, different surface of the substrate by an ALD type process comprising alternately and sequentially contacting the substrate with a first Ge precursor and a second reactant.

In some embodiments a substrate comprising a first surface and a second surface is provided and a metal, here Ge, is selectively deposited on a first surface of a substrate by an ALD type deposition process comprising multiple cycles, each cycle comprising:

contacting the surface of a substrate with a vaporized first metal precursor, for example TDMAGe;

removing excess metal precursor and reaction by products, if any, from the surface;

contacting the surface of the substrate with a second vaporized reactant, for example $NH_3$;

removing from the surface excess second reactant and any gaseous by-products formed in the reaction between the metal precursor layer on the first surface of the substrate and the second reactant, and;

repeating the contacting and removing steps until a metal, here Ge, thin film of the desired thickness has been formed.

As mentioned above, in some embodiments one or more surfaces of the substrate may be treated in order to enhance deposition on one surface relative to one or more different surfaces prior to beginning the deposition process. In some embodiments the second, non-metal surface can be treated to provide an OH-terminated surface, or can be deactivated, such as by passivation, prior to deposition of the metal, here Ge.

Although the illustrated Ge deposition cycle begins with contacting the substrate with the first Ge precursor, in other embodiments the deposition cycle begins with contacting the substrate with the second reactant. It will be understood by the skilled artisan that contacting the substrate surface with the first Ge precursor and second reactant are interchangeable in the ALD cycle.

When the Ge precursor contacts the substrate, the Ge precursor may form at least a monolayer, less than a monolayer, or more than a monolayer.

In some embodiments, a carrier gas is flowed continuously to a reaction space throughout the deposition process. In some embodiments in each deposition cycle the first germanium precursor is pulsed into a reaction chamber. In some embodiments excess germanium precursor is then removed from the reaction chamber. In some embodiments, the carrier gas comprises nitrogen. In some embodiments a separate purge gas is utilized.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

The Ge precursor employed in the ALD type processes may be solid, liquid, or gaseous material under standard conditions (room temperature and atmospheric pressure), provided that the Ge precursor is in vapor phase before it is contacted with the substrate surface.

Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. contacting times can be on the order of minutes in some cases. The optimum contacting time can be determined by the skilled artisan based on the particular circumstances. In some embodiments the substrate is moved such that different reactants alternately and sequentially contact the surface of the substrate in a desired sequence for a desired time. In some embodiments the substrate is moved from a first reaction chamber to a second, different reaction chamber. In some embodiments the substrate is moved within a first reaction chamber.

In some embodiments, for example for a 300 mm wafer in a single wafer reactor, the surface of a substrate is contacted with Ge precursor for from about 0.05 seconds to about 10 seconds, for from about 0.1 seconds to about 5 seconds or from about 0.3 seconds to about 3.0 seconds.

The surface of the substrate may be contacted with a second reactant for from about 0.05 seconds to about 10 seconds, from about 0.1 seconds to about 5 seconds, or for from about 0.2 seconds to about 3.0 seconds. However, contacting times for one or both reactants can be on the order of minutes in some cases. The optimum contacting time for each reactant can be determined by the skilled artisan based on the particular circumstances.

As mentioned above, in some embodiments the Ge precursor is a germanium alkoxide, for example $Ge(OEt)_4$ or $Ge(OMe)_4$. In some embodiments, the Ge precursor is TDMAGe. In some embodiments, the Ge precursor includes alkyl and/or alkylamine groups. In some embodiments the Ge-precursor is not a halide. In some embodiments the Ge-precursor may comprise a halogen in at least one ligand, but not in all ligands. The germanium precursor may be provided with the aid of an inert carrier gas, such as argon.

In some embodiments the second reactant comprises a nitrogen-hydrogen bond. In some embodiments the second reactant is ammonia ($NH_3$). In some embodiments, the second reactant is molecular nitrogen. In some embodiments the second reactant is a nitrogen containing plasma. In some embodiments, the second reactant comprises an activated or excited nitrogen species. In some embodiments the second reactant may be a provided in a nitrogen-containing gas pulse that can be a mixture of nitrogen reactant and inactive gas, such as argon.

In some embodiments, a nitrogen-containing plasma is formed in a reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

Irrespective of the second reactant used, in some embodiments of the present disclosure, the use of a second reactant does not contribute significant amounts of nitrogen to the deposited film. According to some embodiments, the resulting germanium film contains less than about 5-at %, less than about 2-at % or even less than about 1-at % nitrogen. In some embodiments, the nitrogen content of the germanium film is less than about 0.5-at % or even less than about 0.2-at %.

In some embodiments hydrogen reactants are not used in the deposition process. In some embodiments, no elemental hydrogen ($H_2$) is provided in at least one deposition cycle, or in the entire deposition process. In some embodiments, hydrogen plasma is not provided in at least one deposition cycle or in the entire deposition process. In some embodiments, hydrogen atoms or radicals are not provided in at least one deposition cycle, or in the entire deposition process.

In some embodiments the Ge precursor comprises at least one amine or alkylamine ligand, such as those presented in formulas (2) through (6) and (8) and (9), and the second reactant comprises $NH_3$.

Before starting the deposition of the film, the substrate is typically heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on. In some embodiments the deposition temperature is selected to be between the temperature where the germanium precursor does not decompose without the second precursor, at the lower end, and the temperature where the precursor does decompose by itself, at the upper end. As discussed elsewhere, in some embodiments the temperature may be less than about 600° C., less than about 450° C., less than about 400° C., and in some cases, less than about 375° C. In some embodiments using $Ge(OCH_2CH_3)_4$ and $NH_3$ as the germanium and second reactants, the temperature is about 350° C.

The processing time depends on the thickness of the layer to be produced and the growth rate of the film. In ALD, the growth rate of a thin film is determined as thickness increase per one cycle. One cycle consists of the contacting and removing steps of the precursors and the duration of one cycle is typically between about 0.2 seconds and about 30 seconds, more preferably between about 1 second and about 10 seconds, but it can be on order of minutes or more in some cases, for example, where large surface areas and volumes are present.

In some embodiments the growth rate of the germanium thin films may be greater than or equal to about 2 Å/cycle, greater than or equal to about 5 Å/cycle, greater than or equal to about 10 Å/cycle, and, in some embodiments, even greater than about 15 Å/cycle.

In some embodiments the germanium film formed is a relatively pure germanium film. Preferably, aside from minor impurities no other metal or semi-metal elements are present in the film. In some embodiments the film comprises less than 1-at % of metal or semi-metal other than Ge. In some embodiments, the germanium film comprises less than about 5-at % of any impurity other than hydrogen, preferably less than about 3-at % of any impurity other than hydrogen, and more preferably less than about 1-at % of any impurity other than hydrogen. In some embodiments a germanium film comprises less than about 5 at-% nitrogen, less than about 3 at-% nitrogen less than about 2 at-% nitrogen or even less than about 1 at-% nitrogen. In some embodiments, a pure germanium film comprises less than about 2-at % oxygen, preferably less than about 1-at % or less than about 0.5-at % and even less than about 0.25-at %.

In some embodiments a germanium precursor comprising oxygen is utilized and the germanium film comprises no oxygen or a small amount of oxygen as an impurity. In some embodiments the germanium film deposited using a germanium precursor comprising oxygen may comprise less than about 2 at-% oxygen, less than about 1 at-%, less than about 0.5 at-% or even less than about 0.25 at-%.

In some embodiments, the germanium film formed has step coverage of more than about 50%, more than about 80%, more than about 90%, or even more than about 95% on structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

Ge Precursors

A number of different Ge precursors can be used in the selective deposition processes. In some embodiments the Ge precursor is tetravalent (i.e. Ge has an oxidation state of +IV). In some embodiments, the Ge precursor is not divalent (i.e., Ge has an oxidation state of +II). In some embodiments, the Ge precursor may comprise at least one alkoxide ligand. In some embodiments, the Ge precursor may comprise at least one amine or alkylamine ligand. In some embodiments the Ge precursor is a metal-organic or organometallic compound. In some embodiments the Ge precursor comprises at least one halide ligand. In some embodiments the Ge precursor does not comprise a halide ligand.

In some embodiments the Ge precursor comprises a Ge—O bond. In some embodiments the Ge precursor comprises a Ge—N bond. In some embodiments the Ge precursor comprises a Ge—C bond. In some embodiments the Ge precursor does not comprise Ge—H bond. In some embodiments the Ge precursor comprises equal or less than two Ge—H bonds per one Ge atom.

In some embodiments the Ge precursor is not solid at room temperature (e.g., about 20° C.).

For example, Ge precursors from formulas (1) through (9) below may be used in some embodiments.

$$GeOR_4 \tag{1}$$

Wherein R is can be independently selected from the group consisting of alkyl and substituted alkyl;

$$Ge R_x A_{4-x} \tag{2}$$

Wherein the x is an integer from 1 to 4;

R is an organic ligand and can be independently selected from the group consisting of alkoxides, alkylsilyls, alkyl, substituted alkyl, alkylamines; and A can be independently selected from the group consisting of alkyl, substituted alkyl, alkoxides, alkylsilyls, alkyl, alkylamines, halide, and hydrogen.

$$Ge(OR)_x A_{4-x} \tag{3}$$

Wherein the x is an integer from 1 to 4;

R can be independently selected from the group consisting of alkyl and substituted alkyl; and A can be independently selected from the group consisting of alkyl, alkoxides, alkylsilyls, alkyl, substituted alkyl, alkylamines, halide, and hydrogen.

$$Ge(NR^I R^{II})_4 \tag{4}$$

Wherein $R^I$ can be independently selected from the group consisting of hydrogen, alkyl and substituted alkyl; and $R^{II}$ can be independently selected from the group consisting of alkyl and substituted alkyl;

$$Ge(NR^{I}R^{II})_{x}A_{4-x} \tag{5}$$

Wherein the x is an integer from 1 to 4;
$R^{I}$ can be independently selected from the group consisting of hydrogen, alkyl and substituted alkyl; and
$R^{II}$ can be independently selected from the group consisting of alkyl and substituted alkyl;
A can be independently selected from the group consisting of alkyl, alkoxides, alkylsilyls, alkyl, substituted alkyl, alkylamines, halide, and hydrogen.

$$Ge_{n}(NR^{I}R^{II})_{2n+2} \tag{6}$$

Wherein the n is an integer from 1 to 3;
$R^{I}$ can be independently selected from the group consisting of hydrogen, alkyl and substituted alkyl; and
$R^{II}$ can be independently selected from the group consisting of alkyl and substituted alkyl;

$$Ge_{n}(OR)_{2n+2} \tag{7}$$

Wherein the n is an integer from 1 to 3; and
Wherein R can be independently selected from the group consisting of alkyl and substituted alkyl;

$$Ge_{n}R_{2n+2} \tag{8}$$

Wherein the n is an integer from 1 to 3; and
R is an organic ligand and can be independently selected from the group consisting of alkoxides, alkylsilyls, alkyl, substituted alkyl, alkylamines.

$$A_{3-x}R_{x}Ge-GeR_{y}A_{3-y} \tag{9}$$

Wherein the x is an integer from 1 to 3;
y is an integer from 1 to 3;
R is an organic ligand and can be independently selected from the group consisting of alkoxides, alkylsilyls, alkyl, substituted alkyl, alkylamines; and
A can be independently selected from the group consisting of alkyl, alkoxides, alkylsilyls, alkyl, substituted alkyl, alkylamines, halide, and hydrogen.

Preferred options for R include, but are not limited to, methyl, ethyl, propyl, isopropyl, n-butyl, isobutyl, tertbutyl for all formulas, more preferred in ethyl and methyl. In some embodiments, the preferred options for R include, but are not limited to, $C_3$-$C_{10}$ alkyls, alkenyls, and alkynyls and substituted versions of those, more preferably $C_3$-$C_6$ alkyls, alkenyls, and alkenyls and substituted versions of those.

In some embodiments the Ge precursor comprises one or more halides. For example, the precursor may comprise 1, 2, or 3 halide ligands. However, as mentioned above, in some embodiments the Ge precursor does not comprise a halide.

In some embodiments a germane (GeH$_x$) is not used. In some embodiments a compound comprising Ge and hydrogen may be used. In some embodiments a germane may be used, including, but not limited to, one or more of GeH$_4$ and Ge$_2$H$_6$.

In some embodiments alkoxide Ge precursors may be used, including, but not limited to, one or more of Ge(OMe)$_4$, Ge(OEt)$_4$, Ge(O$^i$Pr)$_4$, Ge(O$^n$Pr)$_4$ and Ge(O$^t$Bu)$_4$. In some embodiments the Ge precursor is TDMAGe. In some embodiments the Ge precursor is TDEAGe. In some embodiments the Ge precursor is TEMAGe.

Selective Deposition of Ru and Other Noble Metals on Metal

In some embodiments noble metal, preferably Ru metal, is selectively deposited on a first metal surface of a substrate, such as a Cu, Ni, Co, Al, W, Ru, or other noble metal, relative to a second, non-metal surface of the same substrate.

In some embodiments noble metal may comprise one of Au, Pt, Ir, Pd, Os, Ag, Hg, Po, Rh, Ru, Cu, Bi, Tc, Re, and Sb, preferably Ru.

In some embodiments noble metal is selectively deposited on a first metal surface of a substrate, such as a Cu, Ni, Co, Al, W, Ru, or other noble metal surface, relative to a hydrophilic surface of the same substrate. In some embodiments the metal surface comprises an oxide such as CuOx, NiOx, CoOx or RuOx or another noble metal oxide. In some embodiments a metal surface may no longer be conductive after it has been treated. For example, a metal surface may be treated prior to or at the beginning of the selective deposition process, such as by oxidation, and the treated surface may no longer be conductive. In some embodiments an existing metal oxide surface may be treated prior to or at the beginning of the selective deposition process, such as by reduction, and the treated surface may then comprise metal.

In some embodiments noble metal is selectively deposited on a Cu surface relative to a second, different surface. In some embodiments noble metal is selectively deposited on a Ni surface relative to a second, different surface. In some embodiments noble metal is selectively deposited on a Co surface relative to a second, different surface. In some embodiments noble metal is selectively deposited on a Al surface relative to a second, different surface. In some embodiments noble metal is selectively deposited on a W surface relative to a second, different surface. In some embodiments noble metal is selectively deposited on a Ru surface relative to a second, different surface. In some embodiments noble metal is selectively deposited on a noble metal surface relative to a second, different surface.

In some embodiments the second surface is a hydrophilic surface. In some embodiments the second, hydrophilic surface may comprise at least some OH-groups. In some embodiments the second surface is a —NH$_x$ terminated surface. In some embodiments the second surface is a —SH$_x$ terminated surface. In some embodiments the hydrophilic surface is a dielectric surface. In some embodiments the hydrophilic surface may comprise SiO$_2$, a low k material, or GeO$_2$.

For example, Ru bis(cyclopentadienyl) compounds can be highly non-reactive toward hydrophilic oxide surfaces. The hydrophilic surface may comprise at least some OH-groups. In some embodiments the hydrophilic surface is a dielectric surface. In some embodiments the hydrophilic surface may comprise SiO$_2$, a low k material, or GeO$_2$. In some embodiments noble metal, preferably Ru is selectively deposited by a cyclical deposition process. In some embodiments Ru or other noble metal deposition on the first surface of the substrate relative to the second surface of the substrate is at least about 90% selective, at least about 95% selective, at least about 96%, 97%, 98% or 99% or greater selective. In some embodiments Ru or other noble metal deposition only occurs on the first surface and does not occur on the second surface. In some embodiments Ru or other noble metal deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the amount of impurities present in the selectively deposited noble metal film is low, which is essential when aiming at high conductivity of the film. In some embodiments the amounts of H, C and N impurities are typically in the order of 0.1 to 0.3 at-%. In some embodiments the amount of residual oxygen is typically in the range of 0.3 to 0.5 at-%.

In some embodiments Ru is selectively deposited by a process such as those described in U.S. Pat. No. 6,824,816, issued Nov. 30, 2002, the entire disclosure of which is attached hereto in the Appendix and hereby incorporated herein by reference.

In some embodiments Ru or another noble metal is deposited by a process such as those described in U.S. Pat. No. 7,666,773, issued Feb. 23, 2010, or as described in U.S. Pat. No. 8,025,922, issued Sep. 27, 2011, the entire disclosure of each of which is attached hereto in the Appendix and hereby incorporated herein by reference.

In some embodiments a noble metal is selectively deposited on a first surface of a substrate relative to a second, different surface of the substrate by an ALD type process comprising alternately and sequentially contacting the substrate with a first noble metal precursor and a second reactant.

In some embodiments a substrate comprising a first surface and a second surface is provided and a noble metal is selectively deposited on a first surface of a substrate by n ALD type deposition process comprising multiple cycles, each cycle comprising:

contacting the surface of a substrate with a vaporized first noble metal precursor;

removing excess noble metal precursor and reaction byproducts, if any, from the surface;

contacting the surface of the substrate with a second vaporized reactant;

removing from the surface excess second reactant and any gaseous by-products formed in the reaction between the noble metal precursor law on the first surface of the substrate and the second reactant, and;

repeating the contacting and removing steps until a noble metal thin film of the desired thickness has been formed.

As mentioned above, in some embodiments one or more surfaces of the substrate may be treated in order to enhance deposition on one surface relative to one or more different surfaces prior to beginning the deposition process. In some embodiments the first, metal surface can be treated to enhance deposition on the first surface relative to the second, non-metal surface. In some embodiments the first, metal surface can be activated, such as by surface modification. In some embodiments the second, non-metal surface can be treated to provide an OH-terminated surface, or can be deactivated, such as by passivation, prior to deposition of noble metal.

In some embodiments an existing metal oxide surface may be treated prior to or at the beginning of the selective deposition process, such as by reduction, and the treated surface may then comprise metal. In some embodiments the first surface comprising a metal oxide, for example CuO, may be exposed to a reducing agent. In some embodiments the reducing agent may comprise an organic compound. In some embodiments the reducing agent may comprise an organic compound containing at least one functional group selected from —OH, —CHO, and —COOH. In some embodiments, after pretreatment a first surface may no longer comprise a metal oxide, for example CuO, and may comprise a conductive metal surface, for example Cu. In some embodiments the first, metal surface, for example a W surface, is activated by, for example, treatment to form Si—H surface terminations thereon. In some embodiments activation of the first surface may comprise contacting the first surface with a chemical that provides Si—H surface terminations. In some embodiments activation of the first surface may comprise exposing the substrate to disilane to form Si—H surface terminations on the first surface.

In some embodiments the second, non-metal surface is deactivated, such as by a treatment to provide a surface on which metal deposition is inhibited. In some embodiments deactivation may comprise treatment with a passivation chemical. In some embodiments the deactivation treatment can occur prior to the deposition of a metal on a first metal surface. In some embodiments the deactivation treatment may be an in situ deactivation treatment. In some embodiments deactivation of the hydrophilic surface may comprise replacing at least OH-groups with other groups. In some embodiments deactivation can include treatment to increase the amount of OH-groups on the second, non-metal, surface.

In some embodiments a dielectric surface can be passivated to inhibit deposition of a metal thereon. For example, the dielectric surface may be contacted with a chemical that provides a silylated (—Si—$(CH_3)_x$ or —Si$(CH_3)_3$) surface or a halogenated surface or a —$SiH_3$ surface. In some embodiments the dielectric surface is chlorinated or fluorinated, such as a Si—Cl surface. A halogenated surface can be achieved by treating the surface with a halide chemical, such as $CCl_4$ or a metal halide, which is capable of forming volatile metal oxyhalides, such as $WF_6$, $NbF_5$, or $NbCl_5$, and leaving the halide, such as the chloride or fluoride on the surface. The passivation can be used to inhibit deposition of a metal on a dielectric surface relative to a metal surface. In some embodiments the passivation chemical is one or more of trimethylchlorosilane $(CH_3)_3SiCl$ (TMCS), trimethyldimethylaminosilane $(CH_3)_3SiN(CH_3)_2$ or another type of alkyl substituted silane having formula $R_{4-x}SiX_x$, wherein x is from 1 to 3 and each R can independently selected to be a C1-C5 hydrocarbon, such as methyl, ethyl, propyl or butyl, preferably methyl, and X is halide or X is another group capable of reacting with OH-groups, such as an alkylamino group —NR1R2, wherein each R1 can be independently selected to be hydrogen or C1-C5 hydrocarbon, preferably methyl or ethyl, R2 can be independently selected to be C1-C5 hydrocarbon, preferably methyl or ethyl, preferably X is chloride or dimethylamino. In some embodiments the passivation chemical can be a silane compound comprising at least one alkylamino group, such as bis(diethylamino) silane, or a silane compound comprising a $SiH_3$ group, or silazane, such hexamethyldisilazane (HMDS).

Although the illustrated noble metal deposition cycle begins with contacting the substrate with the first noble metal precursor, in other embodiments the deposition cycle begins with contacting the substrate with the second reactant. It will be understood by the skilled artisan that contacting the substrate surface with the first noble metal precursor and second reactant are interchangeable in the ALD cycle.

When the noble metal precursor contacts the substrate, the noble metal precursor may form at least a monolayer, less than a monolayer, or more than a monolayer.

In some embodiments, a carrier gas is flowed continuously to a reaction space throughout the deposition process. In some embodiments in each deposition cycle the first germanium precursor is pulsed into a reaction chamber. In some embodiments excess noble metal precursor is then removed from the reaction chamber. In some embodiments, the carrier gas comprises nitrogen. In some embodiments a separate purge gas is utilized.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

A noble metal precursor employed in the ALD type processes may be solid, liquid, or gaseous material under standard conditions (room temperature and atmospheric pressure), provided that a noble metal precursor is in vapor phase before it is contacted with the substrate surface.

Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances. In some embodiments the substrate is moved such that different reactants alternately and sequentially contact the surface of the substrate in a desired sequence for a desired time. In some embodiments the substrate is moved from a first reaction chamber to a second, different reaction chamber. In some embodiments the substrate is moved within a first reaction chamber.

In some embodiments "contacting" a substrate with a vaporized precursor may comprise the precursor vapor being conducted a the chamber for a limited period of time. Typically, the contacting time is from about 0.05 to 10 seconds. However, depending on the substrate type and its surface area, the contacting time may be even higher than 10 seconds. Preferably, for a 300 mm wafer in a single wafer ALD reactor, the substrate is contacted by noble metal precursor for from 0.05 to 10 seconds, more preferably for from 0.5 to 3 seconds and most preferably for about 0.5 to 1.0 seconds. In some embodiments the substrate is contacted by the second reactant for from about 0.05 to 10 seconds, more preferably for from 1 to 5 seconds, most preferably about for from 2 to 3 seconds. Contacting times can be on the order of minutes in some cases. The optimum contacting time can be readily determined by the skilled artisan based on the particular circumstances.

The mass flow rate of the noble metal precursor can be determined by the skilled artisan. In one embodiment, for deposition on 300 mm wafers the flow rate of noble metal precursor is preferably between about 1 and 1000 sccm without limitation, more preferably between about 100 and 500 sccm. The mass flow rate of the noble metal precursor is usually lower than the mass flow rate of oxygen, which is usually between about 10 and 10000 sccm without limitation, more preferably between about 100-2000 sccm and most preferably between 100-1000 sccm.

In some embodiments removing reaction byproducts can comprise evacuating the chamber with a vacuum pump and/or by replacing the gas inside the reactor with an inert gas such as argon or nitrogen. Typical removal times are from about 0.05 to 20 seconds, more preferably between about 1 and 10, and still more preferably between about 1 and 2 seconds.

In some embodiments before starting the deposition of the film, the substrate is typically heated to a suitable growth temperature. In some embodiments, the growth temperature of the noble metal thin film is between about 150° C. and about 450° C., more preferably between about 200° C. and about 400° C. In some embodiments the preferred deposition temperature may vary depending on a number of factors such as, and without limitation, the reactant precursors, the pressure, flow rate, the arrangement of the reactor, and the composition of the substrate including the nature of the material to be deposited on and the nature of the material on which deposition is to be avoided. The specific growth temperature may be selected by the skilled artisan using routine experimentation in view of the present disclosure to maximize the selectivity of the process.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be on order of minutes or more in some cases.

In some embodiments the noble metal thin film comprises multiple monolayers of a single noble metal. However, in some embodiments, the final metal structure may comprise noble metal compounds or alloys comprising two or more different noble metals. For example, the growth can be started with the deposition of platinum and ended with the deposition of ruthenium metal. Noble metals are preferably selected from the group consisting of Pt, Au, Ru, Rh, Ir, Pd and Ag.

Noble metals are well known in the art and include, for example, Ru, Rh, Pd, Ag, Re, Os, Ir, and Pt. Suitable noble metal precursors may be selected by the skilled artisan. In general, metal compounds where the metal is bound or coordinated to oxygen, nitrogen, carbon or a combination thereof are preferred. In some embodiments metallocene compounds, beta diketonate compounds and acetamidinato compounds are used.

In some embodiments noble metal precursors are cyclopentadienyl and acetylacetonate (acac) precursor compounds. In some embodiments a bis(ethylcyclopentadienyl) noble metal compound is used.

In some embodiments a noble metal precursor may be selected from the group consisting of bis(cyclopentadienyl) ruthenium, tris(2,2,6,6 tetramethyl 3,5-heptanedionato)ruthenium and tris(N,N'-diisopropylacetamidinato)ruthenium (III) and their derivatives, such as bis(N,N'-diisopropylacetamidinato)ruthenium(II) dicarbonyl, bis (ethylcyclopentadienyl)ruthenium, bis (pentamethylcyclopentadienyl)ruthenium and bis(2,2,6,6 tetramethyl 3,5-heptanedionato)(1,5 cyclooctadiene)ruthenium(II). In some embodiments, the precursor is bis(ethylcyclopentadienyl) ruthenium (Ru(EtCp)2).

In some embodiments noble metal precursors can include (trimethyl)methylcyclopentadienylplatinum(IV), platinum (II) acetylacetonato, bis(2,2,6,6 tetramethyl 3,5 heptanedionato)platinum(II) and their derivatives.

In some embodiments noble metal precursors can include tris(acetylacetonato)iridium(III) and derivatives thereof.

In some embodiments noble metal precursors can include bis(hexafluoroacetylacetonate)palladium(II) and derivatives thereof.

In some embodiments the second reactant comprises an oxygen containing reactant. In some embodiments the second reactant can comprise oxygen or a mixture of oxygen and another gas. In some embodiments the second reactant may comprises diatomic oxygen, or a mixture of diatomic oxygen and another gas. In some embodiments the second reactant may comprise an oxygen containing compound, such as $H_2O_2$, $N_2O$ and/or an organic peroxide. In some embodiments a second reactant may form oxygen inside a reaction chamber, for example by decomposing oxygen containing compounds. In some embodiments a second reactant may comprise catalytically formed oxygen. In some embodiments the catalytical formation of a second reactant comprising oxygen may include conducting a vaporized aqueous solution of $H_2O_2$ over a catalytic surface, for example platinum or palladium. In some embodiments a catalytic surface may be located inside a reaction chamber. In some embodiments a catalytic surface may not be located inside the reaction chamber.

In some embodiments the second reactant comprises free-oxygen or ozone, more preferably molecular oxygen. The second reactant is preferably pure molecular diatomic oxygen, but can also be a mixture of oxygen and inactive gas, for example, nitrogen or argon.

In some embodiments the second reactant preferably comprises a free-oxygen containing gas, more preferably a molecular oxygen-containing gas, and can therefore consist of a mixture of oxygen and inactive gas, for example, nitrogen or argon. In some embodiments preferred oxygen content of the second reactant is from about 10 to 25%. In some embodiments one preferred source of oxygen is air. In the case of relatively small substrates (e.g., up to 4 inch wafers) the mass flow rate of the second reactant may preferably between about 1 and 25 sccm, more preferably between about 1 and 8 sccm. In case of larger substrates the mass flow rate of the second reactant gas may be scaled up as is understood by one of skill in the art.

Examples of suitable arrangements of reactors used for the deposition of thin films according to the processes disclosed herein are, for instance, commercially available ALD equipment, such as the F-120 and Pulsar™ reactors, produced by ASM Microchemistry Ltd. In addition to these ALD reactors, many other kinds of reactors capable for ALD growth of thin films, including CVD reactors equipped with appropriate equipment and means for pulsing the precursors, can be employed for carrying out the processes disclosed herein. In some embodiments the growth processes can optionally be carried out in a cluster tool, where the substrate arrives from a previous process step, the metal film is produced on the substrate, and then the substrate is transported to the following process step. In a cluster tool, the temperature of the reaction space can be kept constant, which clearly improves the throughput compared to a reactor in which is the substrate is heated up to the process temperature before each run.

Selective Deposition of W on Metal

In some embodiments W is selectively deposited on a metal surface, such as Ni, Co, Cu, Al, W, Ru, or other noble metal relative to a hydrophilic surface of the same substrate, such as a passivated surface. In some embodiments W is selectively deposited on a Cu surface, relative to a second, different surface. In some embodiments W is selectively deposited on a Ni surface, relative to a second, different surface. In some embodiments W is selectively deposited on a Co surface, relative to a second, different surface. In some embodiments W is selectively deposited on a Al surface, relative to a second, different surface. In some embodiments W is selectively deposited on a Ru surface, relative to a second, different surface. In some embodiments W is selectively deposited on a noble metal surface, relative to a second, different surface.

In some embodiments W deposition on the first surface of the substrate relative to the second surface of the substrate is at least about 90% selective, at least about 95% selective, at least about 96%, 97%, 98% or 99% or greater selective. In some embodiments W deposition only occurs on the first surface and does not occur on the second surface. In some embodiments W deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is a hydrophilic surface. In some embodiments the hydrophilic surface may comprise at least some OH-groups. In some embodiments the second surface is a —NHx terminated surface. In some embodiments the second surface is a —SHx terminated surface. In some embodiments the hydrophilic surface is a dielectric surface. In some embodiments the hydrophilic surface may comprise $SiO_2$, a low k material, or $GeO_2$.

As previously discussed, in some embodiments the second surface is treated to facilitate selective deposition of W on a metal surface relative to the second surface. For example, the second surface may be treated to provide a hydrophilic OH-terminated surface. In some embodiments a hydrophilic OH-terminated surface may be treated to increase the amount of OH-groups on the surface. For example, the dielectric surface may be exposed to $H_2O$ vapor in order to increase the number of OH-groups at the surface. Another example includes exposing a dielectric surface to a carrier gas that has flowed through a bubbler at a temperature of between 25° C. and 40° C. In some embodiments the dielectric surface is exposed to air in order to provide a hydrophilic surface that comprises at least some OH-groups. In some embodiments a hydrophilic surface is not treated prior to deposition.

In some embodiments a dielectric surface can be passivated to inhibit deposition of a metal thereon. For example, the dielectric surface may be contacted with a chemical that provides a silylated (—Si—$(CH_3)_x$ or —Si$(CH_3)_3$) surface or a halogenated surface or a —$SiH_3$ surface. In some embodiments the dielectric surface is chlorinated or fluorinated, such as a Si—Cl surface. A halogenated surface can be achieved by treating the surface with a halide chemical, such as $CCl_4$ or a metal halide, which is capable of forming volatile metal oxyhalides, such as $WF_6$, $NbF_5$, or $NbCl_5$, and leaving the halide, such as the chloride or fluoride on the surface. The passivation can be used to inhibit deposition of a metal on a dielectric surface relative to a metal surface. In some embodiments the passivation chemical is one or more of trimethylchlorosilane $(CH_3)_3SiCl$ (TMCS), trimethyldimethylaminosilane $(CH_3)_3SiN(CH_3)_2$ or another type of alkyl substituted silane having formula $R_{4-x}SiX_x$, wherein x is from 1 to 3 and each R can independently selected to be a C1-C5 hydrocarbon, such as methyl, ethyl, propyl or butyl, preferably methyl, and X is halide or X is another group capable of reacting with OH-groups, such as an alkylamino group —NR1R2, wherein each R1 can be independently selected to be hydrogen or C1-C5 hydrocarbon, preferably methyl or ethyl, R2 can be independently selected to be C1-C5 hydrocarbon, preferably methyl or ethyl, preferably X is chloride or dimethylamino. In some embodiments the passivation chemical can be a silane compound comprising at least one alkylamino group, such as bis(diethylamino) silane, or a silane compound comprising a SiH$_3$ group, or silazane, such hexamethyldisilazane (HMDS). For example, in some embodiments the hydrophilic surface may be contacted with a chemical that provides an H-terminated surface. In some embodiments a hydrophilic surface is passivated against W deposition by forming a layer of Sb on the hydrophilic surface according to methods previously discussed in the present disclosure.

In some embodiments W is selectively deposited by a cyclical deposition process.

In some embodiments W is selectively deposited by a process such as that described in US Publication No. 2013/0196502, published Aug. 1, 2013, the disclosure of which is hereby incorporated in its entirety.

In some embodiments the methods comprise selectively depositing W on a substrate comprising a first metal surface and a second hydrophilic surface using a plurality of deposition cycles. The cycle comprises: contacting the substrate with a first precursor comprising silicon or boron to selectively form a layer of first material comprising Si or B over the first metal surface relative to the second dielectric surface; and converting the first material to a second metallic material by exposing the substrate to a second precursor comprising metal.

In some embodiments a substrate comprising a first surface and a second surface is provided and a metal, here W, is selectively deposited on a first surface of a substrate by a cyclical deposition process comprising multiple cycles, each cycle comprising:

contacting the surface of a substrate with a vaporized first precursor, for example comprising Si or B;

removing excess first precursor and reaction by products, if any, from the surface;

contacting the surface of the substrate with a second vaporized precursor, for example WF$_6$;

removing from the surface excess second precursor and any gaseous by-products formed in the reaction between the first precursor layer on the first surface of the substrate and the second precursor, and;

repeating the contacting and removing steps until a metal, here W, thin film of the desired thickness has been formed.

As mentioned above, in some embodiments one or more surfaces of the substrate may be treated in order to enhance deposition on one surface relative to one or more different surfaces prior to beginning the deposition process. In some embodiments the second, non-metal surface can be treated to provide an OH-terminated surface, or can be deactivated, such as by passivation, prior to deposition of the metal, here W.

Although the illustrated W deposition cycle begins with contacting the substrate with the first W precursor, in other embodiments the deposition cycle begins with contacting the substrate with the second reactant. It will be understood by the skilled artisan that contacting the substrate surface with the first W precursor and second reactant are interchangeable in the deposition cycle.

First Precursors

In some embodiments a first precursor is provided to the substrate such that a layer is selectively formed on a first metal surface of the substrate relative to a second different surface of the substrate. In some embodiments the first precursor preferably comprises silicon or boron. In some embodiments a 0.05-4 nm thick layer of Si or B is formed on the first surface of the substrate. In some embodiments a 0.1-2 nm thick layer of Si or B is formed on the first surface of the substrate. In some embodiments less than 1 nm of Si or B can be used. Without being bound to a theory, it is believed that the first metal surface on the substrate can catalyze or assist in the adsorption or decomposition of the first precursor in comparison to the reactivity of the second surface or insulator. In some embodiments the formation of silicon or boron on the first surface is self-limiting, such that up to a monolayer is formed upon exposure to the reactant. In some embodiments the silicon or boron source chemical can decompose on the first surface.

In some embodiments, the silicon source chemical is selected from the silane family Si$_n$H$_{2n+2}$ (n is equal to or greater than 1) or the cyclic silane family Si$_n$H$_{2n}$ (n is equal to or greater than 3). In some embodiments the silicon source comprises silane or disilane. Most preferably the silane is disilane Si$_2$H$_6$ or trisilane Si$_3$H$_8$. In some embodiments the silicon source can be selected from silane compounds having the formula: SiH$_x$L$_y$, where L is a ligand selected from the groups including: alkyl, alkenyl, alkynyl, alkoxide, and amine. In some cases L is a ligand selected from the halide group: F, Cl, Br and I.

In some embodiments the first precursor comprises boron. In some embodiments the first precursor is diborane (B$_2$H$_6$). Diborane has similar properties to some of the silane based compounds. For example, diborane has a lower decomposition temperature than disilane but similar thermal stability to trisilane (silcore).

Other precursors comprising boron could also be used. The availability of a vast number of boron compounds makes it possible to choose one with the desired properties. In addition, it is possible to use more than one boron compound. Preferably, one or more of the following boron compounds is used:

Boranes according to formula I or formula II.

$$B_nH_{n+x} \qquad (I)$$

Wherein n is an integer from 1 to 10, preferably from 2 to 6, and x is an even integer, preferably 4, 6 or 8.

$$B_nH_m \qquad (II)$$

Wherein n is an integer from 1 to 10, preferably form 2 to 6, and m is an integer different than n, from 1 to 10, preferably from 2 to 6.

Of the above boranes according to formula I, examples include nido-boranes (B$_n$H$_{n+4}$), arachno-boranes (B$_n$H$_{n+6}$) and hyph-boranes (B$_n$H$_{n+8}$). Of the boranes according to formula II, examples include conjuncto-boranes (B$_n$H$_m$). Also, borane complexes such as (CH$_3$CH$_2$)$_3$N—BH$_3$ can be used.

Borane halides, particularly fluorides, bromides and chlorides. An example of a suitable compound is B$_2$H$_5$Br. Further examples comprise boron halides with a high boron/halide ratio, such as B$_2$F$_4$, B$_2$Cl$_4$ and B$_2$Br$_4$. It is also possible to use borane halide complexes.

Halogenoboranes according to formula III.

$$B_nX_n \qquad (III)$$

Wherein X is Cl or Br and n is 4 or an integer from 8 to 12 when X is Cl, or n is an integer from 7 to 10 when X is Br.

Carboranes according to formula IV.

$$C_2B_nH_{n+x} \qquad (IV)$$

Wherein n is an integer from 1 to 10, preferably from 2 to 6, and x is an even integer, preferably 2, 4 or 6.

Examples of carboranes according to formula IV include closo-carboranes ($C_2B_nH_{n+2}$), nido-carboranes ($C_2B_nH_{n+4}$) and arachno-carboranes ($C_2B_nH_{n+6}$).

Amine-borane adducts according to formula V.

$$R_3NBX_3 \qquad (V)$$

Wherein R is linear or branched C1 to C10, preferably C1 to C4 alkyl or H, and X is linear or branched C1 to C10, preferably C1 to C4 alkyl, H or halogen.

Aminoboranes where one or more of the substituents on B is an amino group according to formula VI.

$$R_2N \qquad (VI)$$

Wherein R is linear or branched C1 to C10, preferably C1 to C4 alkyl or substituted or unsubstituted aryl group.

An example of a suitable aminoborane is $(CH_3)_2NB(CH_3)_2$.

Cyclic borazine $(—BH—NH—)_3$ and its volatile derivatives.

Alkyl borons or alkyl boranes, wherein the alkyl is typically linear or branched C1 to C10 alkyl, preferably C2 to C4 alkyl.

In some embodiments the first precursor comprises germanium. In some embodiments, the germanium source chemical is selected from the germane family $Ge_nH_{2n+2}$ (n is equal to or greater than 1) or the cyclic germane family $Ge_nH_2n$ (n is equal to or greater than 3). In some preferred embodiments the germanium source comprises germane $GeH_4$. In some embodiments the germanium source can be selected from germane compounds having the formula: $GeH_xL_y$, where L is a ligand selected from the groups including: alkyl, alkenyl, alkynyl, alkoxide, and amine. In some cases L is a ligand selected from the halide group: F, Cl, Br and I.

W Precursors

In some embodiments the second precursor preferably comprises W. In some embodiments the second precursor comprises a W halide (F, Cl, Br, I). In some embodiments the second precursor preferably comprises fluorine. In some embodiments, the second precursor comprises $WF_6$.

Selective Deposition of Al on Metal

In some embodiments Al is selectively deposited on a metal surface, such as Ni, Co, Cu, Al, W, Ru, or other noble metal relative to a hydrophilic surface of the same substrate, such as a passivated surface. In some embodiments Al is selectively deposited on a Cu surface, relative to a second, different surface. In some embodiments Al is selectively deposited on a Ni surface, relative to a second, different surface. In some embodiments Al is selectively deposited on a Co surface, relative to a second, different surface. In some embodiments Al is selectively deposited on a Al surface, relative to a second, different surface. In some embodiments Al is selectively deposited on a Ru surface, relative to a second, different surface. In some embodiments Al is selectively deposited on a noble metal surface, relative to a second, different surface.

In some embodiments Al deposition on the first surface of the substrate relative to the second surface of the substrate is at least about 90% selective, at least about 95% selective, at least about 96%, 97%, 98% or 99% or greater selective. In some embodiments Al deposition only occurs on the first surface and does not occur on the second surface. In some embodiments Al deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is a hydrophilic surface. In some embodiments the hydrophilic surface may comprise at least some OH-groups. In some embodiments the second surface is a —NHx terminated surface. In some embodiments the second surface is a —SHx terminated surface. In some embodiments the hydrophilic surface is a dielectric surface. In some embodiments the hydrophilic surface may comprise $SiO_2$, a low k material, or $GeO_2$.

As previously discussed, in some embodiments the second surface is treated to facilitate selective deposition of Al on a metal surface relative to the second surface. For example, the second surface may be treated to provide a hydrophilic OH-terminated surface. In some embodiments a hydrophilic OH-terminated surface may be treated to increase the amount of OH-groups on the surface. For example, the dielectric surface may be exposed to $H_2O$ vapor in order to increase the number of OH-groups at the surface. Another example includes exposing a dielectric surface to a carrier gas that has flowed through a bubbler at a temperature of between 25° C. and 40° C. In some embodiments the dielectric surface is exposed to air in order to provide a hydrophilic surface that comprises at least some OH-groups. In some embodiments a hydrophilic surface is not treated prior to deposition.

In some embodiments the hydrophilic surface is deactivated, such as by passivation prior to deposition of Al. In some embodiments deactivation of the hydrophilic surface may comprise replacing at least OH-groups with other groups. In some embodiments the hydrophilic dielectric surface is treated with a passivation chemical to form a passivated surface. For example, the hydrophilic surface may be silylated or halogenated, such as chlorinated or fluorinated, prior to deposition of the Al. In some embodiments the hydrophilic surface may be treated to form a silylated surface, such as a silylated —Si—$(CH_3)x$ or —Si$(CH_3)_3$ surface. In some embodiments the hydrophilic surface may be treated to form a halogenated surface, such as a chlorinated or fluorinated surface. For example, the halogenated surface may be a Si—Cl surface. In some embodiments the hydrophilic surface may be treated to provide a H-terminated surface, for example a —$SiH_3$ surface. For example, in some embodiments the hydrophilic surface may be contacted with a chemical that provides an H-terminated surface.

As noted above, processes described herein enable use of ALD type deposition techniques to selectively deposit Al. The ALD type deposition process is mostly surface-controlled (based on controlled reactions at the first substrate surface) and thus has the advantage of providing high conformality at relatively low temperatures. However, in some embodiments, the Al precursor may at least partially decompose. Accordingly, in some embodiments the ALD type process described herein is a pure ALD process in which no decomposition of precursors is observed. In other embodiments reaction conditions, such as reaction temperature, are selected such that a pure ALD process is achieved and no precursor decomposition takes place.

In some embodiments Al is selectively deposited by a vapor deposition process. In some embodiments an aluminum precursor comprising an Al—H compound is used. In some embodiments Al is selectively deposited by a process such as that described in The Chemistry of Metal CVD, edited by Toivo Kodas and Mark Hampden-Smith, Weinheim; VCH, 1994, ISBN 3-527-29071-0, section 2.6.6, pp.

57 and 83, the disclosure of which is incorporated herein in its entirety. Other methods of vapor deposition of Al are known in the art and can be adapted to selectively deposit Al on a first metal surface relative to a second, different surface.

In some embodiments Al is selectively deposited by a vapor deposition process. In some embodiments Al is selectively deposited by a cyclical deposition process. In some embodiments Al is selectively deposited on a first surface of a substrate relative to a second, different surface of the substrate by an ALD type process comprising alternately and sequentially contacting the substrate with a first Al precursor and a second reactant.

In some embodiments a substrate comprising a first surface and a second surface is provided and a metal, here Al, is selectively deposited on a first surface of a substrate by a cyclical deposition process comprising multiple cycles, each cycle comprising:

contacting the surface of a substrate with a vaporized first metal precursor, for example DMAH or DMEAA;

removing excess metal precursor and reaction by products, if any, from the surface;

contacting the surface of the substrate with a second vaporized reactant, for example $H_2$;

removing from the surface excess second reactant and any gaseous by-products formed in the reaction between the metal precursor layer on the first surface of the substrate and the second reactant, and;

repeating the contacting and removing steps until a metal, here Al, thin film of the desired thickness has been formed.

As mentioned above, in some embodiments one or more surfaces of the substrate may be treated in order to enhance deposition on one surface relative to one or more different surfaces prior to beginning the deposition process. In some embodiments the second, non-metal surface can be treated to provide an OH-terminated surface, or can be deactivated, such as by passivation, prior to deposition of the metal, here Al.

Although the illustrated Al deposition cycle begins with contacting the substrate with the first Al precursor, in other embodiments the deposition cycle begins with contacting the substrate with the second reactant. It will be understood by the skilled artisan that contacting the substrate surface with the first Al precursor and second reactant are interchangeable in the deposition cycle.

When the Al precursor contacts the substrate, the Al precursor may form at least a monolayer, less than a monolayer, or more than a monolayer.

In some embodiments the Al precursor comprises an Al—H compound. In some embodiments the Al precursor comprises an alane. In some embodiments the Al precursor comprises at least one of trimethylamine alane (TMAA), trimethylamine alane (TEAA), and dimethylethylamine alane (DMEAA). In some embodiments the Al precursor is selected from trimethylaluminum (TMA), triethylaluminum (TEA), triisobutylaluminum (TIBA), diethyaluminum chloride (DEACl), Dimethylaluminum hydride (DMAH), trimethylamine alane (TMAA), trimethylamine alane (TEAA), dimethylethylamine alane (DMEAA), and trimethylamine alumina borane (TMAAB). The Al precursor may be provided with the aid of an inert carrier gas, such as argon.

In some embodiments the second reactant comprises hydrogen. In some embodiments the second reactant comprises hydrogen gas.

Selective Deposition of Cu on Metal

In some embodiments Cu is selectively deposited on a metal surface, such as Ni, Co, Cu, Al, Ru, or other noble metal relative to a hydrophilic surface of the same substrate, such as a passivated surface. In some embodiments Cu is selectively deposited on a Cu surface, relative to a second, different surface. In some embodiments Cu is selectively deposited on a Ni surface, relative to a second, different surface. In some embodiments Cu is selectively deposited on a Co surface, relative to a second, different surface. In some embodiments Cu is selectively deposited on a Al surface, relative to a second, different surface. In some embodiments Cu is selectively deposited on a Ru surface, relative to a second, different surface. In some embodiments Cu is selectively deposited on a noble metal surface, relative to a second, different surface.

In some embodiments Cu deposition on the first surface of the substrate relative to the second surface of the substrate is at least about 90% selective, at least about 95% selective, at least about 96%, 97%, 98% or 99% or greater selective. In some embodiments Cu deposition only occurs on the first surface and does not occur on the second surface. In some embodiments Cu deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is a hydrophilic surface. In some embodiments the hydrophilic surface may comprise at least some OH-groups. In some embodiments the second surface is a —$NH_x$ terminated surface. In some embodiments the second surface is a —$SH_x$ terminated surface. In some embodiments the hydrophilic surface is a dielectric surface. In some embodiments the hydrophilic surface may comprise $SiO_2$, a low k material, or $GeO_2$.

As previously discussed, in some embodiments the second surface is treated to facilitate selective deposition of Cu on a metal surface relative to the second surface. For example, the second surface may be treated to provide a hydrophilic OH-terminated surface. In some embodiments a hydrophilic OH-terminated surface may be treated to increase the amount of OH-groups on the surface. For example, the dielectric surface may be exposed to $H_2O$ vapor in order to increase the number of OH-groups at the surface. Another example includes exposing a dielectric surface to a carrier gas that has flowed through a bubbler at a temperature of between 25° C. and 40° C. In some embodiments the dielectric surface is exposed to air in order to provide a hydrophilic surface that comprises at least some OH-groups. In some embodiments a hydrophilic surface is not treated prior to deposition.

In some embodiments the hydrophilic surface is deactivated, such as by passivation prior to deposition of Cu. In some embodiments deactivation of the hydrophilic surface may comprise replacing at least OH-groups with other groups. In some embodiments the hydrophilic dielectric surface is treated with a passivation chemical to form a passivated surface. For example, the hydrophilic surface may be silylated or halogenated, such as chlorinated or fluorinated, prior to deposition of the Cu. In some embodiments the hydrophilic surface may be treated to form a silylated surface, such as a silylated —Si—$(CH_3)$x or —Si$(CH_3)_3$ surface. In some embodiments the hydrophilic surface may be treated to form a halogenated surface, such as a chlorinated or fluorinated surface. For example, the halogenated surface may be a Si—Cl surface. In some embodiments the hydrophilic surface may be treated to provide a H-terminated surface, for example a —$SiH_3$ surface. For example, in some embodiments the hydrophilic surface may be contacted with a chemical that provides an H-terminated surface.

As noted above, processes described herein enable use of ALD type deposition techniques to selectively deposit Cu. The ALD type deposition process is mostly surface-controlled (based on controlled reactions at the first substrate surface) and thus has the advantage of providing high conformality at relatively low temperatures. However, in some embodiments, the Cu precursor may at least partially decompose. Accordingly, in some embodiments the ALD type process described herein is a pure ALD process in which no decomposition of precursors is observed. In other embodiments reaction conditions, such as reaction temperature, are selected such that a pure ALD process is achieved and no precursor decomposition takes place.

In some embodiments Cu is selectively deposited by a cyclical deposition process. In some embodiments Cu can be selectively deposited by decomposing Cu(I) N,N'-di-sec-butylacetamidinate [Cu(sec-Bu2-AMD)]2, as disclosed in Booyong S Lim, Antti Rahtu, Roy G Gordon, Nature Materials, Vol. 2, November 2003, www.nature.com/naturematerials, the disclosure of which is incorporated herein in its entirety.

In some embodiments Cu is selectively deposited by an ALD type deposition process. In some embodiments Cu is selectively deposited by a cyclical deposition process. In some embodiments Cu is selectively deposited on a first surface of a substrate relative to a second, different surface of the substrate by an ALD type process comprising alternately and sequentially contacting the substrate with a first Cu precursor and a second reactant.

In some embodiments a substrate comprising a first surface and a second surface is provided and a metal, here Cu, is selectively deposited on a first surface of a substrate by an ALD type deposition process comprising multiple cycles, each cycle comprising:
  contacting the surface of a substrate with a vaporized first metal precursor, for example Cu acetamidinate;
  removing excess metal precursor and reaction by products, if any, from the surface;
  contacting the surface of the substrate with a second vaporized reactant, for example $H_2$;
  removing from the surface excess second reactant and any gaseous by-products formed in the reaction between the metal precursor layer on the first surface of the substrate and the second reactant, and;
  repeating the contacting and removing steps until a metal, here Cu, thin film of the desired thickness has been formed.

As mentioned above, in some embodiments one or more surfaces of the substrate may be treated in order to enhance deposition on one surface relative to one or more different surfaces prior to beginning the deposition process. In some embodiments the second, non-metal surface can be treated to provide an OH-terminated surface, or can be deactivated, such as by passivation, prior to deposition of the metal, here Cu.

Although the illustrated Cu deposition cycle begins with contacting the substrate with the first Cu precursor, in other embodiments the deposition cycle begins with contacting the substrate with the second reactant. It will be understood by the skilled artisan that contacting the substrate surface with the first Cu precursor and second reactant are interchangeable in the ALD cycle.

When the Cu precursor contacts the substrate, the Cu precursor may form at least a monolayer, less than a monolayer, or more than a monolayer.

In some embodiments the Cu precursor comprises a Cu acetamidinate or a derivative thereof. In some embodiments the Cu precursor comprises Cu(I) N,N'-di-sec-butylacetamidinate [Cu(sec-Bu2-AMD)]2. The Cu precursor may be provided with the aid of an inert carrier gas, such as argon.

In some embodiments the second reactant comprises hydrogen. In some embodiments the second reactant comprises hydrogen gas.

Selective Deposition of Metal or Metal Oxide on Dielectric

As mentioned above, in some embodiments a metal or metal oxide material is selectively deposited on a first hydrophilic surface of a substrate relative to a second, different surface, such as a conductive surface, metal surface, or H-terminated surface of the same substrate.

In some embodiments metal or metal oxide deposition on the first surface of the substrate relative to the second surface of the substrate is at least about 90% selective, at least about 95% selective, at least about 96%, 97%, 98% or 99% or greater selective. In some embodiments metal or metal oxide deposition only occurs on the first surface and does not occur on the second surface. In some embodiments metal or metal oxide deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is treated, or deactivated, to inhibit deposition of a metal or metal oxide thereon. For example, a metal surface may be treated by oxidation to provide a metal oxide surface. In some embodiments a Cu, Ru, W, Al, Ni, Co, or other noble metal surface is oxidized to facilitate selective deposition on a dielectric surface relative to the Cu, Ru, W, Al, Ni, Co, or other noble metal surface. In some embodiments the second surface comprises a metal selected individually from Cu, Ni, Co, Al, W, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a W surface. In some embodiments the second surface is a Ru surface. In some embodiments the second surface comprises a noble metal.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second surface is not a hydrophilic surface. In some embodiments a hydrophilic surface may be treated so that it is no longer a hydrophilic surface. In some embodiments the second surface is a Si surface. In some embodiments the second surface is an H-terminated surface. In some embodiments the second surface is treated, for example by contacting with a chemical that provides a —$SiH_3$ terminated surface. In some embodiments a Si surface is treated prior to deposition of a metal or metal oxide on a first surface.

In some embodiments the second, metal, surface is oxidized prior to deposition of a metal or metal oxide on a first surface. In some embodiments the second, metal, surface is oxidized at the beginning of the deposition process, for example, during the first phase of a deposition cycle. In some embodiments the second, metal, surface is oxidized prior to the first phase of a deposition cycle.

In some embodiments the second surface may be passivated to inhibit deposition thereon. In some embodiments, for example, the second surface may be passivated with alkylsilyl-groups. For example, in some embodiments a second surface is passivated such that it comprises alkylsilyl-groups, in order to facilitate selective deposition on a dielectric surface relative to the second surface. The passivation may facilitate selective deposition on the dielectric surface relative to a treated metal surface. For example, deposition of an oxide on the metal surface may be inhibited by the passivation. In some embodiments passivation does not include formation of a SAM or a similar monolayer having a long carbon chain on the metal surface.

In some embodiments the material selectively deposited on a first surface of a substrate relative to a second surface is a metal. In some embodiments the material selectively deposited on a first surface of a substrate relative to a second surface is a metal oxide. In some embodiments the metal selectively deposited is Fe. In some embodiments the metal oxide selectively deposited is a Ni, Fe, or Co oxide. In some embodiments the metal selectively deposited is Ni. In some embodiments the metal selectively deposited is Co. In some embodiments selective deposition of a metal oxide may be achieved by oxidation of a selectively deposited metal. In some embodiments a metal is first selectively deposited and subsequently oxidized to form a metal oxide. In some embodiments a metal is not oxidized after being selectively deposited. In some embodiments oxidation of a selectively deposited metal to form a metal oxide may also result in OH surface terminations on the metal oxide. In some embodiments oxidation may result in OH surface terminations on the substrate. In some embodiments oxidation may result in OH surface terminations on both the metal oxide surface and the second surface of the substrate.

ALD type selective deposition processes, such as the process as shown in FIG. 2 and described above can be used to selectively deposit a metal or metal oxide on a first surface of a substrate relative to a second surface. In some embodiments the first precursor is a first metal precursor. In some embodiments the first precursor is a first metal oxide precursor. In some embodiments the second reactant comprises an oxygen source. In some embodiments the second reactant comprises an oxygen source as described herein in relation to selective deposition of a dielectric on a dielectric.

In some embodiments a metal is selective deposited on a first surface of a substrate relative to a second, different surface of the same substrate. In some embodiments a metal is selectively deposited by decomposition of a metal precursor. In some embodiments a metal oxide is selectively deposited by adsorption of metal compounds, followed by oxidation of the metal compound to form a metal oxide. In some embodiments a metal oxide is selectively deposited by self-limiting adsorption of metal compounds, followed by oxidation of the metal compound to form up to a molecular layer of metal oxide.

In some embodiments Ni is selectively deposited on a second surface of the substrate relative to a dielectric surface of the same substrate. In some embodiments Ni is selectively deposited by decomposition of bis(4-N-ethylamino-3-penten-2-N-ethyliminato)nickel (II). In some embodiments NiO is selectively deposited by adsorption of Ni compounds, such as bis(4-N-ethylamino-3-penten-2-N-ethyliminato)nickel (II) followed by oxidation of the Ni compound to form NiO. In some embodiments NiO is selectively deposited by self-limiting adsorption of Ni compounds, such as bis(4-N-ethylamino-3-penten-2-N-ethyliminato)nickel (II) followed by oxidation of the Ni compound to form up to molecular layer of NiO.

Suitable nickel precursors may be selected by the skilled artisan. In general, nickel compounds where the metal is bound or coordinated to oxygen, nitrogen, carbon or a combination thereof are preferred. In some embodiments the nickel precursors are organic compounds. In some embodiments the nickel precursor is a metalorganic compound. In some embodiments the nickel precursor is a metal organic compound comprising bidentate ligands. In some embodiments the nickel precursor is bis(4-N-ethylamino-3-penten-2-N-ethyliminato)nickel (ii).

In some embodiments, nickel precursors can be selected from the group consisting of nickel betadiketonate compounds, nickel betadiketiminato compounds, nickel aminoalkoxide compounds, nickel amidinate compounds, nickel cyclopentadienyl compounds, nickel carbonyl compounds and combinations thereof. In some embodiments, X(acac)y or X(thd)y compounds are used, where X is a metal, y is generally, but not necessarily between 2 and 3 and thd is 2,2,6,6-tetramethyl-3,5-heptanedionato. Some examples of suitable betadiketiminato (e.g., Ni(pda)2) compounds are mentioned in U.S. Patent Publication No. 2009-0197411 A1, the disclosure of which is incorporated herein in its entirety. Some examples of suitable amidinate compounds (e.g., Ni(iPr-AMD)2) are mentioned in U.S. Patent Publication No. 2006-0141155 A1, the disclosure of which is incorporated herein in its entirety.

The nickel precursor may also comprise one or more halide ligands. In preferred embodiments, the precursor is a nickel betadiketiminato compound, such bis(4-N-ethylamino-3-penten-2-N-ethyliminato)nickel (II) [Ni(EtN-EtN-pent)2], nickel ketoiminate, such bis(3Z)-4-nbutylamino-pent-3-en-2-one-nickel(II), nickel amidinate compound, such as methylcyclopentadienyl-isopropylacetamidinate-nickel (II), nickel betadiketonato compound, such as Ni(acac)2, Ni(thd)2 or nickel cyclopentadienyl compounds, such Ni(Cp)2, Ni(MeCp)2, Ni(EtCp)2 or derivatives thereof, such as methylcyclopentadienyl-isopropylacetamidinate-nickel (II). In more preferred embodiment, the precursor is bis(4-N-ethylamino-3-penten-2-N-ethyliminato)nickel (II).

In some embodiments the first Ni precursor is bis(4-N-ethylamino-3-penten-2-N-ethyliminato)nickel (II).

In some embodiments the first precursor used in a selective deposition process for depositing Co or Co oxide on a first surface of a substrate relative to a second surface is a Co precursor. In some embodiments the Co precursor is a Co beta-diketoiminato compound. In some embodiments the Co precursor is a Co ketoiminate compound. In some embodiments the Co precursor is a Co amidinate compound. In some embodiments the Co precursor is a Co beta-diketonate compound. In some embodiments the Co precursor contains at least one ketoimine ligand or a derivative thereof. In some embodiments the Co precursor contains at least one amidine ligand or a derivative thereof. In some embodiments the Co precursor contains at least one ketonate ligand or a derivative thereof.

In some embodiments the first precursor used in a selective deposition process for depositing Fe or Fe oxide on a first surface of a substrate relative to a second surface is a Fe precursor. In some embodiments the Fe precursor is $Cp_2Fe$ or derivative thereof. In some embodiments the Fe precursor contains at least one cyclopentadienyl ligand (Cp), substituted cyclopentadienyl ligand or a derivative thereof. In some embodiments the Fe precursor contains at least one carbonyl ligand (—CO) or a derivative thereof. In some embodiments the Fe precursor contains at least one carbonyl ligand (—CO) and at least one organic ligand, such as a cyclopentadienyl ligand (Cp) or a substituted cyclopentadienyl ligand or a derivative thereof. In some embodiments the Fe precursor is Fe(acac)$_2$. In some embodiments the Fe precursor is Fe-alkoxide, such as iron(III) tert-butoxide (Fe$_2$(O$^t$Bu)$_6$). In some embodiments the Fe precursor is Fe(CO)$_5$.

In some embodiments the second reactant in an ALD process for selectively depositing a metal or metal oxide is selected from hydrogen and forming gas. In other embodiments the second reactant may be an alcohol, such as EtOH.

In some embodiments the second reactant is an organic reducing agent. The organic reducing agents preferably have at least one functional group selected from the group consisting of alcohol (—OH), as mentioned above, or aldehyde (—CHO), or carboxylic acid (—COOH).

Reducing agents containing at least one alcohol group may be selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

[R1-OH                            (I)

[wherein R1 is a linear or branched C1-C20 alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

(II)

OH
|
R1—CH—R1 wherein each R1 is selected independently from the group of linear or branched C1-C20 alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

(III)

OH
|
R1—C—R1
|
R1 wherein each R1 is selected independently from the group of linear or branched C1-C20 alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

CHnX3-n-R2-OH                  (IV)

wherein X is selected from the group consisting of F, Cl, Br and I, n is an integer from 0 to 2 and R2 is selected from the group of linear or branched C1-C20 alkyl and alkenyl groups, preferably methyl, ethyl, propyl, butyl, pentyl or hexyl. More preferably X is selected from the group consisting of F and Cl and R2 is selected from the group consisting of methyl and ethyl. An example of a preferred halogenated alcohol is 2,2,2-trifluoroethanol.

Other derivatives of alcohols that may be used include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in some embodiments reducing agents are aldehydes having the general formula (V):

R3-CHO                          (V)

wherein R3 is selected from the group consisting of hydrogen and linear or branched C1-C20 alkyl and alkenyl groups, preferably methyl, ethyl, propyl, butyl, pentyl or hexyl. More preferably, R$_3$ is selected from the group consisting of methyl or ethyl. Examples of preferred compounds according to formula (V) are formaldehyde, acetaldehyde and butyraldehyde.

In other embodiments reducing agents are aldehydes having the general formula (VI):

OHC—R4-CHO                  (VI)

wherein R4 is a linear or branched C1-C20 saturated or unsaturated hydrocarbon. Alternatively, the aldehyde groups may be directly bonded to each other (R4 is null).

Reducing agents containing at least one —COOH group may be selected from the group consisting of compounds of the general formula (VII), polycarboxylic acids, halogenated carboxylic acids and other derivatives of carboxylic acids.

Thus, in some embodiment preferred reducing agents are carboxylic acids having the general formula (VII):

R5-COOH                     (VII)

wherein R5 is hydrogen or linear or branched C1-C20 alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

Selective Deposition of Dielectric on Dielectric

As mentioned above, in some embodiments a dielectric material is selectively deposited on a first dielectric surface of a substrate relative to a second, different surface, such as a conductive surface, metal surface, or H-terminated surface of the same substrate.

In some embodiments dielectric deposition on the first surface of the substrate relative to the second surface of the substrate is at least about 90% selective, at least about 95% selective, at least about 96%, 97%, 98% or 99% or greater selective. In some embodiments dielectric deposition only occurs on the first surface and does not occur on the second surface. In some embodiments dielectric deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments the second surface is treated, or deactivated, to inhibit deposition of a dielectric thereon. For example, a metal surface may be treated by oxidation to provide a metal oxide surface. In some embodiments a Cu, Ru, Al, Ni, Co, or other noble metal surface is oxidized to facilitate selective deposition on a dielectric surface relative to the Cu, Ru, Al, Ni, Co, or other noble metal surface. In some embodiments the second surface comprises a metal selected individually from Cu, Ni, Co, Al, W, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is oxidized prior to deposition of a dielectric on a first surface. In some embodiments the second, metal, surface is oxidized at the beginning of the deposition process, for example, during the first phase of a deposition cycle. In some embodiments the second, metal surface is oxidized prior to the first phase of a deposition cycle. In some embodiments the second, metal, surface is purposefully oxidized with an oxygen source. In some embodiments the second, metal, surface is oxidized in the ambient air and/or contains native oxide. In some embodiments the second, metal, surface contains an oxide which has been deposited.

In some embodiments the second surface may be passivated to inhibit deposition thereon. In some embodiments, for example, the second surface may be passivated with alkylsilyl-groups. For example, in some embodiments a second surface is passivated such that it comprises alkylsilyl-groups, in order to facilitate selective deposition on a dielectric surface relative to the second surface. The passivation may facilitate selective deposition on the dielectric surface relative to the treated metal surface. For example, deposition of an oxide on the first metal surface may be inhibited by the passivation. In some embodiments passivation does not include formation of a SAM or a similar monolayer having a long carbon chain on the metal surface.

As mentioned above, in some embodiments a dielectric material is selectively deposited on a first dielectric surface of a substrate relative to a second, different surface, such as a metal surface of the same substrate. In some embodiments the second, metal surface is treated, or deactivated, to inhibit deposition of a dielectric thereon. For example, a metal surface may be treated by oxidation to provide a metal oxide surface. In some embodiments a Cu, Ru or other noble metal surface is oxidized to facilitate selective deposition on a dielectric surface relative to the Cu or Ru surface. In some embodiments the metal surface may be passivated, for example with alkylsilyl-groups. For example, in some embodiments a Sb surface is passivated such that it comprises alkylsilyl-groups, in order to facilitate selective deposition on a dielectric surface relative to the Sb surface.

Selective Deposition of $GeO_2$ on Dielectric $GeO_2$ may be deposited by an ALD type process on a first dielectric surface of a substrate relative to a second, different surface of the same substrate. In some embodiments the second surface may be a conductive surface, a metal surface, or an H-terminated surface. In some embodiments the $GeO_2$ is deposited by a method as described in U.S. application Ser. No. 13/802,393, filed Mar. 13, 2013, which is hereby incorporated by reference. In some embodiments the dielectric surface is a hydrophilic OH-terminated surface. However, in some embodiments the dielectric surface may comprise Si—H groups. For example, the dielectric surface can be a $SiO_2$ surface, a low-k surface comprising OH-groups, a Si—H surface, or a $GeO_2$ surface. The second surface may be, for example, a Cu, Ru, Al, Ni, Co, or other noble metal surface. In some embodiments the second surface comprises a metal selected individually from Cu, Ni, Co, Al, W, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal. As discussed above, in some embodiments a dielectric surface may be treated to increase the amount of OH-groups on the surface. In some embodiments the second surface may be an oxide. In some embodiments the second surface may be a metal surface that has been oxidized.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is purposefully oxidized with an oxygen source. In some embodiments the second, metal, surface has oxidized in the ambient air and/or contains native oxide. In some embodiments the second, metal, surface contains an oxide which has been deposited.

As previously discussed, in some embodiments, the metal surface is oxidized prior to deposition in order to facilitate selective deposition of $GeO_2$ on the dielectric surface relative to the metal surface. In some embodiments a second reactant in a selective deposition process may serve to oxidize the metal surface. Thus, in some embodiments the second reactant is provided first in the initial ALD cycle, or prior to the first ALD cycle. In some embodiments the metal surface is oxidized prior to beginning the selective deposition process.

In some embodiments the metal surface is passivated prior to deposition in order to facilitate selective deposition of $GeO_2$ on the dielectric surface relative to the other surface, such as a surface comprising metal. For example, a metal surface can be provided with alkylsilyl groups. In some embodiments the other surface can be passivated, preferably with an alkylamine passivation compound prior to selective deposition of GeO₂ on a dielectric surface. In some other embodiments the other surface can be passivated, preferably with an alkylamine passivation precursor during the deposition on GeO₂ on a dielectric surface. In some embodiments an alkylamine passivation precursor may be pulsed into a reaction chamber in between pulses of Ge-precursor and a second reactant, or prior to or after each cycle, or prior to or after every $n^{th}$ cycle, where n is a number that may depend on the process conditions, reactors, substrate surfaces, and properties of the desired selectively deposited film. The needed frequency of passivation may depend on the process conditions, reactors, substrate surfaces, and properties of the selectively deposited film. In some embodiments surface passivation can be performed during each GeO₂ selective deposition cycle, for example an alkylamine precursor may contact the substrate during a GeO₂ selective deposition cycle, or HCOOH may contact the substrate during a GeO₂ selective deposition cycle, or both a precursor comprising an alkylamine and HCOOH may contact the substrate during a GeO₂ deposition cycle. In some embodiments more than one passivation precursor may be used. Exemplary alkylamine passivation precursors for use in passivation can be of the formula:

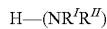

Wherein $R^I$ can be independently selected from the group consisting of hydrogen, alkyl and substituted alkyl, preferably C1-C4 alkyl; and $R^{II}$ can be independently selected from the group consisting of alkyl and substituted alkyl, preferably C1-C4 alkyl.

Specific exemplary alkylamine passivation precursors include H—N(Me₂), H—N(EtMe) and H—N(Et)₂.

In some embodiments GeO₂ deposition on the first surface of the substrate relative to the second surface of the substrate is at least about 90% selective, at least about 95% selective, at least about 96%, 97%, 98% or 99% or greater selective. In some embodiments GeO₂ deposition only occurs on the first surface and does not occur on the second surface. In some embodiments GeO₂ deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In some embodiments a substrate comprising a first surface and a second surface is provided and a dielectric, here GeO₂, is selectively deposited on a first surface of a substrate by an ALD-type process comprising multiple cycles, each cycle comprising:

contacting the surface of a substrate with a vaporized first precursor, for example a Ge-alkylamide;

removing excess first precursor and reaction by products, if any, from the surface;

contacting the surface of the substrate with a second vaporized reactant, for example H₂O;

removing from the surface excess second reactant and any gaseous by-products formed in the reaction between the first precursor layer on the first surface of the substrate and the second reactant, and;

repeating the contacting and removing steps until a dielectric, here GeO₂, thin film of the desired thickness has been formed on a first surface of the substrate.

As mentioned above, in some embodiments one or more surfaces of the substrate may be treated in order to enhance deposition on one surface relative to one or more different surfaces prior to beginning the deposition process. In some embodiments the second, metal surface is deactivated, such as by passivation or oxidation prior to the deposition of the dielectric, here GeO₂.

In some embodiments germanium oxide, preferably GeO₂, is deposited from alternately and sequentially contacting the substrate with a Ge precursor and a second reactant, such as water, ozone, oxygen plasma, oxygen radicals, or oxygen atoms. In some embodiments the second reactant is not water. The Ge precursor preferably comprises Ge(OEt)4 or TDMAGe.

The Ge precursor employed in the ALD type processes may be solid, liquid, or gaseous material under standard conditions (room temperature and atmospheric pressure), provided that the Ge precursor is in vapor phase before it is contacted with the substrate surface. Contacting the surface of a substrate with a vaporized precursor means that the precursor vapor is in contact with the surface of the substrate for a limited period of time. Typically, the contacting time is from about 0.05 seconds to about 10 seconds. However, depending on the substrate type and its surface area, the contacting time may be even higher than about 10 seconds.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

Preferably, for a 300 mm wafer in a single wafer ALD reactor, the substrate surface is contacted with a Ge precursor for from about 0.05 seconds to about 10 seconds, more preferably for from about 0.1 seconds to about 5 seconds and most preferably for from about 0.3 seconds to about 3.0 seconds. The substrate surface is contacted with the second precursor preferably for from about 0.05 seconds to about 10 seconds, more preferably for from about 0.1 seconds to about 5 seconds, most preferably for from about 0.2 seconds to about 3.0 seconds. However, contacting times can be on the order of minutes in some cases. The optimum contacting time can be readily determined by the skilled artisan based on the particular circumstances.

As mentioned above, in some embodiments the Ge precursor is Ge(OEt)₄ or TDMAGe. In some embodiments, where the Ge precursor is an ethoxide precursor, the first surface may comprise Si—H groups. Other possible germanium precursors that can be used in some embodiments are described below. In some embodiments, the Ge precursor is Ge(OMe)₄. In some embodiments the Ge-precursor is not a halide. In some embodiments the Ge-precursor may comprise a halogen in at least one ligand, but not in all ligands.

In certain preferred embodiments GeO₂ is selectively deposited on a first surface of a substrate relative to a second, different surface of the substrate by an ALD type process, comprising multiple cycles, each cycle comprising alternately and sequentially contacting the substrate with vapor phase Ge-alkylamide and a second reactant comprising water.

In certain preferred embodiments $GeO_2$ is selectively deposited on a first surface of a substrate relative to a second, different surface of the substrate by an ALD type process, comprising multiple cycles, each cycle comprising alternately and sequentially contacting the substrate with a vapor phase Ge precursor with the formula $Ge(NR^{I}R^{II})_4$, and a second reactant comprising water, wherein $R^{I}$ can be independently selected from the group consisting of hydrogen, alkyl and substituted alkyl, wherein $R^{I}$ can be preferably independently selected from the group consisting of C1-C3 alkyls, such as methyl, ethyl, n-propyl, and i-propyl, most preferably methyl or ethyl; and wherein $R^{II}$ can be independently selected from the group consisting of alkyl and substituted alkyl, wherein $R^{I}$ can be preferably independently selected from the group consisting of C1-C3 alkyls, such as methyl, ethyl, n-propyl, and i-propyl, most preferably methyl or ethyl.

The second reactant may be an oxygen-containing gas pulse and can be a mixture of oxygen and inactive gas, such as nitrogen or argon. In some embodiments the second reactant may be a molecular oxygen-containing gas. The preferred oxygen content of the second reactant gas is from about 10% to about 25%. Thus, in some embodiments the second reactant may be air. In some embodiments, the second reactant is molecular oxygen. In some embodiments, the second reactant comprises an activated or excited oxygen species. In some embodiments, the second reactant comprises ozone. The second reactant may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the second reactant is oxygen plasma.

In some embodiments, the surface of the substrate is contacted with ozone or a mixture of ozone and another gas. In other embodiments, ozone is formed inside a reactor, for example by conducting oxygen containing gas through an arc. In other embodiments, an oxygen containing plasma is formed in a reactor. In some embodiments, a plasma may be formed in situ on top of the substrate or in close proximity to the substrate. In other embodiments, a plasma is formed upstream of a reaction chamber in a remote plasma generator and plasma products are directed to the reaction chamber to contact the substrate. As will be appreciated by the skilled artisan, in the case of a remote plasma, the pathway to the substrate can be optimized to maximize electrically neutral species and minimize ion survival before reaching the substrate.

In some embodiments the second reactant is a second reactant other than water. Thus, in some embodiments water is not provided in any ALD cycle for selectively depositing $GeO_2$.

A number of different Ge precursors can be used in the selective deposition processes. In some embodiments the Ge precursor is tetravalent (i.e. Ge has an oxidation state of +IV). In some embodiments, the Ge precursor is not divalent (i.e., Ge has an oxidation state of +II). In some embodiments, the Ge precursor may comprise at least one alkoxide ligand. The Ge precursor may comprise at least one amine or alkylamine ligand. In some embodiments the Ge precursor is a metal-organic or organometallic compound. In some embodiments the Ge precursor comprises at least one halide ligand. In some embodiments the Ge precursor does not comprise a halide ligand.

For example, Ge precursors from formulas (1) through (9), as previously discussed above, may be used in some embodiments.

In some embodiments the Ge precursor comprises at least one amine or alkylamine ligand, such as those presented in formulas (2) through (6) and (8) and (9), and the oxygen precursor comprises water.

In some embodiments the Ge precursor comprises at least one alkoxy, amine or alkylamine ligand. In some embodiments the $GeO_2$ is deposited by an ALD process using water and a Ge-alkylamine precursor. In some embodiments the Ge precursor is $Ge(NMe_2)_4$ or $Ge(NEt_2)_4$ or $Ge(NEtMe)_4$.

Before starting the deposition of the film, the substrate is typically heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on.

The processing time depends on the thickness of the layer to be produced and the growth rate of the film. In ALD, the growth rate of a thin film is determined as thickness increase per one cycle. One cycle consists of the contacting and removing steps of the precursors and the duration of one cycle is typically between about 0.2 seconds and about 30 seconds, more preferably between about 1 second and about 10 seconds, but it can be on order of minutes or more in some cases, for example, where large surface areas and volumes are present.

In some embodiments the $GeO_2$ film formed is a pure $GeO_2$ film. Preferably, aside from minor impurities no other metal or semi-metal elements are present in the film. In some embodiments the film comprises less than 1-at % of metal or semi-metal other than Ge. In some embodiments the $GeO_2$ film is stoichiometric. In some embodiments, a pure $GeO_2$ film comprises less than about 5-at % of any impurity other than hydrogen, preferably less than about 3-at % of any impurity other than hydrogen, and more preferably less than about 1-at % of any impurity other than hydrogen.

In some embodiments, the $GeO_2$ film formed has step coverage of more than about 80%, more preferably more than about 90%, and most preferably more than about 95% in structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

Selective Deposition of $SiO_2$ on Dielectric $SiO_2$ may be deposited by an atomic layer deposition type process on a first dielectric surface of a substrate relative to a second surface of the same substrate. In some embodiments the dielectric surface is a hydrophilic OH-terminated surface. For example, the dielectric surface can be a $SiO_2$ surface, a low-k surface, preferably comprising OH-groups, or $GeO_2$ surface. In some embodiments the second surface may be a conductive surface, a metal surface, or a H-terminated surface. The second surface may be, for example, a Cu, Ru, Al, Ni, Co, or other noble metal surface. In some embodiments the second surface comprises a metal selected individually from Cu, Ni, Co, Al, W, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal. As discussed above, in some embodiments a dielectric surface may be treated to increase the amount of OH-groups on the surface.

In some embodiments the conductive surface comprises an oxide such as CuOx, NiOx, CoOx or RuOx or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is purposefully oxidized with an oxygen source. In some embodiments the second, metal, surface has oxidized in the ambient air and/or contains native oxide. In some embodiments the second, metal, surface contains an oxide which has been deposited.

In some embodiments $SiO_2$ deposition on the first surface of the substrate relative to the second surface of the substrate is at least about 90% selective, at least about 95% selective, at least about 96%, 97%, 98% or 99% or greater selective. In some embodiments $SiO_2$ deposition only occurs on the first surface and does not occur on the second surface. In some embodiments $SiO_2$ deposition on the first surface of the substrate relative to the second surface of the substrate is at least about 80% selective, which may be selective enough for some particular applications. In some embodiments deposition on the first surface of the substrate relative to the second surface of the substrate is at least about 50% selective, which may be selective enough for some particular applications.

In a preferred embodiment $SiO_2$ is selectively deposited by an ALD type process using an aminosilane as the Si precursor and ozone as the second reactant. In some embodiments the $SiO_2$ is deposited by an ALD process using ozone and an aminosilane, such as bis(diethylamino)silane precursor. Such methods are known in the art and can be adapted to deposit selectively on the dielectric material relative to a metal.

In some embodiments, the metal surface is oxidized prior to deposition in order to facilitate selective deposition of $SiO_2$ on the dielectric surface relative to the metal surface. In some embodiments an oxygen source in a selective deposition process may serve to oxidize the metal surface. Thus, in some embodiments the second reactant is provided first in the initial ALD cycle, or prior to the first ALD cycle. In some embodiments the metal surface is oxidized prior to beginning the selective deposition process.

In some embodiments the metal surface is passivated prior to deposition in order to facilitate selective deposition of $SiO_2$ on the dielectric surface relative to the metal surface. For example, the metal surface can be provided with alkylsilyl groups.

In some embodiments a substrate comprising a first surface and a second surface is provided and a dielectric, here $SiO_2$, is selectively deposited on a first surface of a substrate by an ALD-type process comprising multiple cycles, each cycle comprising:

contacting the surface of a substrate with a vaporized first precursor, for example an aminosilane;

removing excess first precursor and reaction by products, if any, from the surface;

contacting the surface of the substrate with a second vaporized reactant, for example ozone;

removing from the surface excess second reactant and any gaseous by-products formed in the reaction between the first precursor layer on the first surface of the substrate and the second reactant, and;

repeating and removing steps until a dielectric, here $SiO_2$, thin film of the desired thickness has been formed on a first surface of the substrate.

As mentioned above, in some embodiments one or more surfaces of the substrate may be treated in order to enhance deposition on one surface relative to one or more different surfaces prior to beginning the deposition process. In some embodiments the second, metal surface is deactivated, such as by passivation or In some embodiments the deposition process is operated at a temperature lower than 450° C. In some embodiments the deposition process if operated at 400° C. In some embodiments the entire deposition process is carried out at the same temperature.

In some embodiments the $SiO_2$ selective deposition can be carried out at a wide range of pressure conditions, but it is preferred to operate the process at reduced pressure. The pressure in a reaction chamber is typically from about 0.01 to about 500 mbar or more. However, in some cases the pressure will be higher or lower than this range, as can be readily determined by the skilled artisan. The pressure in a single wafer reactor is preferably maintained between about 0.01 mbar and 50 mbar, more preferably between about 0.1 mbar and 10 mbar. The pressure in a batch ALD reactor is preferably maintained between about 1 mTorr and 500 mTorr, more preferably between about 30 mTorr and 200 mTorr.

In some embodiments the $SiO_2$ deposition temperature is kept low enough to prevent thermal decomposition of the gaseous source chemicals. On the other hand, the deposition temperature is kept high enough to provide activation energy for the surface reactions, to prevent the physisorption of source materials and minimize condensation of gaseous reactants in the reaction space. Depending on the reactants and reactors, the deposition temperature is typically about 20° C. to about 500° C., preferably about 150° C. to about 350° C., more preferably about 250° C. to about 300° C.

The silicon source temperature is preferably set below the deposition or substrate temperature. This is based on the fact that if the partial pressure of the source chemical vapor exceeds the condensation limit at the substrate temperature, controlled layer-by-layer growth of the thin film is compromised. In some embodiments, the silicon source temperature is from about 30 to about 150° C. In some embodiments the silicon source temperature is greater than about 60° C. during the deposition. In some embodiments, where greater doses are needed, for example in batch ALD, the silicon source temperature is from about 90° C. to about 200° C., preferably from about 130° C. to about 170° C.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

In some embodiments SiO$_2$ is selectively deposited using an ALD type process as described herein.

In some embodiments the growth rate of the thin film comprising silicon dioxide is preferably above 0.7 Å/cycle. In other embodiments the growth rate is above 0.8 Å/cycle and in still other embodiments the growth rate is above 1.0 Å/cycle, and preferably in the range of 1.0 to 1.2 Å/cycle.

In some embodiments the selectively deposited silicon dioxide has less than 2 at-% of nitrogen as an impurity. In other embodiments the SiO$_2$ comprise less than 1 at-% of nitrogen, or even less than 0.5 at-% nitrogen as an impurity. Similarly, in some embodiments the SiO$_2$ comprise less than 1 at-% carbon as an impurity and in some cases less than 0.5 at-% carbon as an impurity.

In some embodiments the selectively deposited silicon oxide has a step coverage of more than 80%, in other embodiments preferably more than 90% and in other embodiments preferably more than 95%.

In certain preferred embodiments SiO$_2$ is selectively deposited on a first surface of a substrate relative to a second, different surface of the substrate by an ALD type process, comprising multiple cycles, each cycle comprising alternately and sequentially contacting the substrate with vapor phase BDEAS and a second reactant comprising ozone.

For the simplicity, SiO$_2$, silicon oxide, silica, and silicon dioxide are interchangeable as used herein and generally refer to the same compound.

Si Precursors

In some embodiments the silicon precursor can comprise silane, siloxane, or silazane compounds. In some embodiments the SiO$_2$ is deposited using precursors as described in U.S. Pat. No. 7,771,533, which is hereby incorporated by reference. For example, the Si precursor from the formulas (1) through (3) below may be used in some embodiments.

$$Si_m L_{2m+2} \quad (1)$$

$$Si_y O_{y-1} L_{2y+2} \quad (2)$$

$$Si_y NH_{y-1} L_{2y+2} \quad (3)$$

Wherein L can be independently selected from the group consisting of F, Cl, Br, I, alkyl, aryl, alkoxy, vinyl, cyano, amino, silyl, alkylsilyl, alkoxysilyl, silylene an alkylsiloxane. In some embodiments alkyl and alkoxy groups can be linear or branched and contain at least one substituent. In some embodiments alkyl and alkoxy groups contain 1-10 carbon atoms, preferably 1-6 carbon atoms.

In some embodiments the silicon precursor can preferably comprise amino-substituted silanes and silazanes, such as 3-aminoalkyltrialkoxy silanes, for example 3-aminopropyltriethoxy silane NH$_2$—CH$_2$CH$_2$CH$_2$—Si(O—CH$_2$CH$_3$)$_3$ (AMTES) and 3-aminopropyltrimethoxy silane (NH$_2$—CH$_2$CH$_2$CH$_2$—Si(O—CH$_3$)$_3$ (AMTMS) and hexa-alkyldisilazane (CH$_3$)$_3$Si—NH—Si(CH$_3$)$_3$ (HMDS).

In some embodiments the SiO$_2$ is deposited using precursors as described in U.S. Pat. No. 8,501,637 which is hereby incorporated by reference. In some embodiments, the silicon precursor is preferably a disilane and has a Si—Si bond. Organic compounds having a Si—Si bond and an NH$_x$ group either attached directly to silicon (to one or more silicon atoms) or to a carbon chain attached to silicon are used in some embodiments. In some embodiments organosilicon compounds are used, which may or may not comprise Si—Si bonds. More preferably the silicon compound has the formula:

$$R^{III}_{3-x}(R^{II}R^{I}N)_x\text{—Si—Si—}(N\text{—}R^{I}R^{II})_y R^{III}_{3-y} \quad (I)$$

wherein, x is selected from 1 to 3;
y is selected from 1 to 3;
$R^I$ is selected from the group consisting of hydrogen, alkyl, and substituted alkyl;
$R^{II}$ is selected from the group consisting of alkyl and substituted alkyl; and
$R^{III}$ is selected from the group consisting of hydrogen, hydroxide (—OH), amino (—NH$_2$), alkoxy, alkyl, and substituted alkyl;
and wherein the each x, y, $R^{III}$, $R^{II}$ and $R^I$ can be selected independently from each other.

In some embodiments the silicon compound is hexakis (monoalkylamino)disilane:

$$(R^{II}\text{—NH})_3\text{—Si—Si—}(NH\text{—}R^{II})_3 \quad (II)$$

In other embodiments the silicon compound is hexakis (ethylamino)disilane:

$$(Et\text{-N H})_3\text{—Si—Si—}(NH\text{-Et})_3 \quad (II)$$

In other embodiments the silicon compound is (CH$_3$—O)$_3$—Si—Si—(O—CH$_3$)$_3$ (IV)

In some embodiments, the silicon compound is hexakis (monoalkylamino)disilane ($R^{II}$—NH)$_3$—Si—Si—(NH—$R^{II}$)$_3$ and $R^{II}$ is selected from the group consisting of alkyl and substituted alkyl.

In some embodiments the SiO$_2$ is deposited using precursors as described in U.S. Publication No. 2009/0232985 which is hereby incorporated by reference. In some embodiments the deposition temperature can be as low as room temperature and up to 500° C., with an operating pressure of 0.1-100 Torr (13 to 13300 Pa). High quality films, with very low carbon and hydrogen contents, are preferably deposited between 200 and 400° C. at a pressure between 0.1-10 Torr (13 to 1330 Pa).

In some embodiments the Si precursor can be selected from the group consisting of:
Bis(diethylamino) silane SiH$_2$(NEt$_2$)$_2$
BDMAS Bis(dimethylamino) silane SiH$_2$(NMe$_2$)$_2$
TriDMAS Tris(diethylamino) silane SiH(NMe$_2$)$_3$
Bis(trimethylsilylamino)silane SiH$_2$(NHSiMe$_3$)$_2$
TEAS Tetrakis(ethylamino)silaneSi(NHEt)$_4$
[TEOS Tetrakis(ethoxy)silane Si(OEt)$_4$
BTESE Bis(triethoxysilyl)ethane (EtO)$_3$Si—CH$_2$—CH$_2$—Si(OEt)$_3$ In some embodiments the Si precursor is an aminosilane of the general formula (R1R2N)nSiH$_{4-x}$, where x is comprised between 1 and 4, where R1 and R2 are independently H or a C1-C6 linear, branched or cyclic carbon chains. Preferably the Si precursor is an aminosilane of the general formula (R1R2N)nSiH$_2$, where R1 and R2 are preferably independently selected from C1-C4 linear, branched or cyclic carbon chains. In some embodiments the alkylaminosilane is bis(diethylamino)silane (BDEAS), bis(dimethylamino)silane (BDMAS) or tris(dimethylamino)silane (TriDMAS).

In some embodiments the Si precursor is a silane (silane, disilane, trisilane, trisilylamine) of the general formula (SiH$_3$)xR where may vary from 1 to 4 and wherein R is selected from the comprising H, N, O, CH$_2$, CH$_2$—CH$_2$, SiH$_2$, SiH, Si with the possible use of a catalyst in ALD regime. Preferably the silane is a C-free silane. Most preferably, the silane is trisilylamine. In some embodiments a very small amount (<1%) of catalyst may introduced into the reactor. The silanes described above can be difficult to use in ALD conditions, as their adsorption on a silicon wafer is not favorable. In some embodiments the use of a catalyst helps the adsorption of silane on the first surface of the substrate or the underlying layer. In some embodiments, the introduction of the catalyst is simultaneous with the silane. In some embodiments the catalyst is an amine or a metal-containing molecule, preferably a molecule containing an early transition metal, most preferably a hafnium-containing molecule, such as Hf(NEt$_2$)4. In some embodiments, the catalyst is C-free.

In some embodiments the SiO$_2$ is deposited using precursors as described in U.S. Publication No. 2007/0275166 which is hereby incorporated by reference.

In some embodiments the Si precursor used in the selective deposition process is an organoaminosilane precursor and it is represented by formula A as follows:

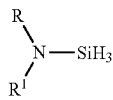

A

In this class of compounds R and R$^1$ are selected from the group consisting of C$_2$-C$_{10}$ alkyl groups, linear, branched, or cyclic, saturated or unsaturated, aromatic, alkylamino groups, heterocyclic, hydrogen, silyl groups, with or without substituents, and R and R$^1$ also being combinable into a cyclic group. Representative substituents are alkyl groups and particularly the C$_{1-4}$ alkyl groups, such as ethyl, propyl and butyl, including their isomeric forms, cyclic groups such as cyclopropyl, cyclopentyl, and cyclohexyl. Illustrative of some of the preferred compounds within this class are represented by the formulas:

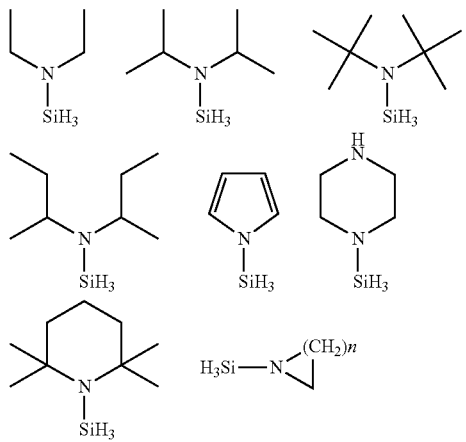

where n is 1-6, preferably 4 or 5.

In some embodiments the silicon precursor is an organoaminosilane which has two silyl groups pendant from a single nitrogen atom as represented by formula B.

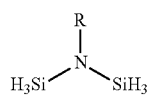

B

As with the R groups of the Class A compounds, R is selected from the group consisting of C$_2$-C$_{10}$ alkyl groups, linear, branched, or cyclic, saturated or unsaturated, aromatic, alkylamino groups, and heterocyclic. Specific R groups include methyl, ethyl, propyl, allyl, butyl, dimethylamine group, and cyclic groups such as cyclopropyl, cyclopentyl, and cyclohexyl. Illustrative compounds are represented by the formulas:

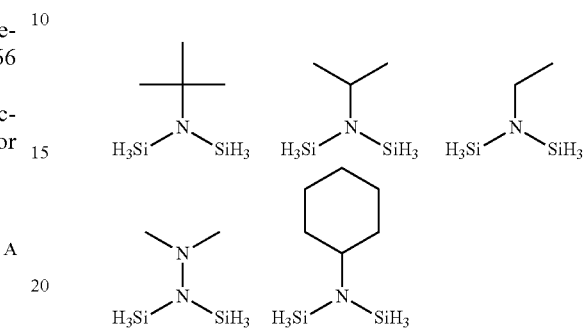

It has been found though that even though the above organoaminosilanes are suitable for producing silicon oxide films on a first surface of a substrate, organoaminosilanes of formula A are preferred.

In some embodiments the silicon precursor can be formed during the ALD type deposition process. In some embodiments a new vapor phase silicon precursor is formed which is then also able to adsorb onto a first surface of the substrate. This can be referred to as in situ formation of silicon precursors In some embodiments in situ formed silicon precursors can be a silane compound, for example with the formula SiL$_1$L$_2$L$_3$L$_4$, wherein L$_1$ represents an amino group, such as an alkyl amino group and L$_2$-L$_4$ represent alkyl or alkoxy group. This silane compound is formed, for example when the first surface of a substrate is contacted with hexa-alkyldisilazane at 350-450° C. at a pressure of 0.1-50 mbar.

Second Reactants

In some embodiments a second reactant as previously disclosed for use in a GeO$_2$ selective deposition process can be used with the above mentioned Si precursors. In some embodiments the second reactant is ozone. In some embodiments the second reactant is molecular oxygen. In some embodiments the second reactant is one or more of the following compounds:

oxides of nitrogen, such as N$_2$O, NO and NO$_2$;

oxyhalide compounds, for example chlorodioxide (ClO$_2$) and perchloroacid (HClO$_4$);

peracids, for example perbenzoic acid and peracetic acid;

alcohols, such as methanol and ethanol;

various radicals, for example oxygen radicals (O) or hydroxyl radical (OH); and hydrogen peroxide (H$_2$O$_2$).

In some embodiments the oxygen precursor is not plasma. In some embodiments the oxygen precursor comprises oxygen radicals. As discussed above, in some embodiments the selective deposition processes disclosed herein do not utilize plasma, such as direct plasma as the direct plasma can harm the second surface of the substrate. In some instances, however, a selective deposition process could utilize radicals made by plasma as a reactant which are not too energetic, for example oxygen radicals made by plasma that do not destroy or degrade a surface of the substrate.

According to some embodiments, at least one compound or the at least one oxygen containing gas is on the first surface of the substrate prior to contacting the surface with another compound and/or at least one oxygen containing gas.

In some embodiments, contacting the substrate surface with each compound and/or oxygen containing gas is followed by the removal of the compound and/or oxygen containing gas from the surface of the substrate, for example by injection of a purge gas, such as an inert gas, into a reaction chamber, while in some embodiments contacting the surface of the substrate with compounds and/or gas is repeated until the desired $SiO_2$ film thickness is obtained. The pressure inside a reaction chamber shall be preferably below 100 Torr, more preferably below 2 Torr. Preferably, the H content in the selectively deposited $SiO_2$ film is less than 8.1021 atoms/cc.

In some embodiments, an ozone containing gas is a gas mixture comprising oxygen and ozone with a ratio $O_3/O_2$ below 30% vol., preferably between 5% and 20% vol. Preferably, the oxygen/ozone gas mixture is diluted into an inert gas, preferably nitrogen.

Selective Deposition of $TiO_2$ on Dielectric

In some embodiments $TiO_2$ may be deposited by an ALD type process on a first dielectric surface of a substrate relative to a second, different surface of the same substrate. In some embodiments the second surface may be a conductive surface, a metal surface, or an H-terminated surface. In some embodiments $TiO_2$ is deposited by a method as described in Viljami Pore, dissertation "Atomic Layer Deposition and Photocatalytic Properties of Titanium Dioxide Thin Films", 2010, page 29, available at http://helda.helsinki.fi/bitstream/handle/10138/21126/atomicla.pdf?sequence=1, which is hereby incorporated by reference. In some embodiments the dielectric surface is a hydrophilic OH-terminated surface. For example, the dielectric surface can be a $SiO_2$ surface, a low-k surface, preferably comprising OH-groups, or a $GeO_2$ surface. The second surface may be, for example, a Cu, Ru, Al, Ni, Co, or other noble metal surface. In some embodiments the second surface comprises a metal selected individually from Cu, Ni, Co, Al, W, Ru and other noble metals. In some embodiments the second surface is a Cu surface. In some embodiments the second surface is a Ni surface. In some embodiments the second surface is a Co surface. In some embodiments the second surface is an Al surface. In some embodiments the second surface is a Ru surface. In some embodiments the second surface comprises a noble metal.

As discussed above, in some embodiments a dielectric surface may be treated to increase the amount of OH-groups on the surface. In some embodiments the second surface may be an oxide. In some embodiments the second surface may be a metal surface that has been oxidized.

In some embodiments the conductive surface comprises an oxide such as $CuO_x$, $NiO_x$, $CoO_x$ or $RuO_x$ or another noble metal oxide. In some embodiments a conductive surface may no longer be conductive after it has been treated. For example, a conductive surface may be treated prior to or at the beginning of the selective deposition process, such as by oxidation, and the treated surface may no longer be conductive.

In some embodiments the second, metal, surface is purposefully oxidized with an oxygen source. In some embodiments the second, metal, surface has oxidized in the ambient air and/or contains native oxide. In some embodiments the second, metal, surface contains an oxide which has been deposited.

As previously discussed, in some embodiments, the metal surface is oxidized prior to deposition in order to facilitate selective deposition of $TiO_2$ on the dielectric surface relative to the metal surface. In some embodiments a second reactant in a selective deposition process may serve to oxidize the metal surface. Thus, in some embodiments the second reactant is provided first in the initial ALD cycle, or prior to the first ALD cycle. In some embodiments the metal surface is oxidized prior to beginning the selective deposition process.

In some embodiments the metal surface is passivated prior to deposition in order to facilitate selective deposition of $TiO_2$ on the dielectric surface relative to the metal surface. For example, the metal surface can be provided with alkylsilyl groups.

In some embodiments $TiO_2$ deposition on the first surface of the substrate relative to the second surface of the substrate is at least about 90% selective, at least about 95% selective, at least about 96%, 97%, 98% or 99% or greater selective. In some embodiments $TiO_2$ deposition only occurs on the first surface and does not occur on the second surface. In some embodiments $TiO_2$ deposition on the first surface of the substrate relative to the second surface of the substrate is at least about 80% selective, which may be selective enough for some particular applications. In some embodiments deposition on the first surface of the substrate relative to the second surface of the substrate is In some embodiments $TiO_2$ is deposited by an ALD type process using, for example, $Ti(OMe)_4$ as a titanium reactant and water as a second reactant. In some embodiments $TiO_2$ is deposited by an ALD type process using, for example, $TiF_4$ as a titanium reactant and water as a second reactant. In some embodiments $TiO_2$ is deposited by an ALD type process using, for example, $TiCl_4$ as a titanium reactant and water as a second reactant. Methods for depositing $TiO_2$ by ALD are known in the art and can be adapted to selectively deposit $TiO_2$ on a dielectric surface relative to a second, different surface.

In some embodiments $TiO_2$ is selectively deposited by an ALD type process on a first surface of a substrate. In some embodiments a substrate comprising a first surface and a second, different surface is provided and a dielectric, here TiO2, is selectively deposited on a first surface of a substrate by an ALD-type process comprising multiple cycles, each cycle comprising:

contacting the surface of a substrate with a vaporized first precursor, for example a Ti alkylamine precursor;

removing excess first precursor and reaction by products, if any, from the surface;

contacting the surface of the substrate with a second vaporized reactant, for example $H_2O$, or ozone;

removing from the surface excess second reactant and any gaseous by-products formed in the reaction between the first precursor layer on the first surface of the substrate and the second reactant, and;

repeating the contacting and removing steps until a dielectric, here TiO2, thin film of the desired thickness has been formed on a first surface of the substrate.

As mentioned above, in some embodiments one or more surfaces of the substrate may be treated in order to enhance deposition on one surface relative to one or more different surfaces prior to beginning the deposition process.

Suitable titanium reactant may be selected by the skilled artisan. In some embodiments the titanium precursor may comprise a titanium halide. In some embodiments the titanium precursor may be at least one of $TiCl_4$, $TiI_4$, and $TiF_4$. In some embodiments the titanium precursor may comprise a titanium alkoxide. In some embodiments the titanium precursor may be at least one of Ti(OME)$_4$, Ti(OEt)$_4$, and Ti(O$^i$Pr)$_4$. In some embodiments that titanium precursor may comprise a titanium alkylamide. In some embodiments the titanium precursor may comprise a titanium alkylamine compound. In some embodiments the titanium precursor may be at least one of Ti(NMe$_2$)$_4$, Ti(NEt$_2$)$_4$, and Ti(NMeEt)$_4$. In some embodiments that titanium precursor may comprise a heteroleptic precursor. In some embodiments the titanium precursor may be at least one of Ti(O$^i$Pr)$_2$(dmae)$_2$, Ti(Me$_5$Cp)(OMe)$_3$, Ti(MeCp)(OMe)$_3$, TiCp(NMe$_2$)$_3$, TiMesCp(NMe$_2$)$_3$, and Ti(O$^i$Pr)$_2$(thd)$_2$. In some embodiments the titanium precursor may comprises a titanium alkylamine.

In some embodiments the second reactant may comprise an oxygen containing reactant. In some embodiments the second reactant can comprise oxygen or a mixture of oxygen and another gas. In some embodiments the second reactant may comprises diatomic oxygen, or a mixture of diatomic oxygen and another gas. In some embodiments the second reactant may comprise ozone. In some embodiments the second reactant may comprise a mixture of ozone and another gas, for example a carrier gas. In some embodiments the second reactant may comprise an oxygen containing compound, such as H$_2$O$_2$, H$_2$O and/or an organic peroxide. In some embodiments the second precursor comprises water. In some embodiments the second precursor comprises water plasma.

In some embodiments a second reactant may form oxygen inside a reaction chamber, for example by decomposing oxygen containing compounds. In some embodiments a second reactant may comprise catalytically formed oxygen. In some embodiments the catalytical formation of a second reactant comprising oxygen may include conducting a vaporized aqueous solution of H$_2$O$_2$ over a catalytic surface, for example platinum or palladium. In some embodiments a catalytic surface may be located inside a reaction chamber. In some embodiments a catalytic surface may not be located inside the reaction chamber.

In some embodiments the second reactant comprises free-oxygen or ozone, or molecular oxygen. In some embodiments the second reactant is pure molecular diatomic oxygen, but can also be a mixture of oxygen and inactive gas, for example, nitrogen or argon. In some embodiments, the surface of the substrate is contacted with ozone or a mixture of ozone and another gas. In other embodiments, ozone is formed inside a reactor, for example by conducting oxygen containing gas through an arc. In other embodiments, an oxygen containing plasma is formed in a reactor. In some embodiments, a plasma may be formed in situ on top of the substrate or in close proximity to the substrate. In other embodiments, a plasma is formed upstream of a reaction chamber in a remote plasma generator and plasma products are directed to the reaction chamber to contact the substrate. As will be appreciated by the skilled artisan, in the case of a remote plasma, the pathway to the substrate can be optimized to maximize electrically neutral species and minimize ion survival before reaching the substrate.

In some embodiments the second precursor is not plasma. In some embodiments the second precursor comprises oxygen radicals. As discussed above, in some embodiments the selective deposition processes disclosed herein do not utilize plasma, such as direct plasma as the direct plasma can harm the second surface of the substrate. In some instances, however, a selective deposition process could utilize radicals made by plasma as a reactant which are not too energetic, for example oxygen radicals made by plasma that do not destroy or degrade a surface of the substrate.

Methods for depositing TiO$_2$ by ALD type processes are known in the art and can be adapted to selectively deposit TiO$_2$.

In some embodiments the Ti alkoxide is decomposed from Ti alkoxide precursor on an OH terminated surface to form TiO$_2$ directly.

As noted above, processes described herein enable use of ALD type deposition techniques to selectively deposit TiO$_2$. The ALD type deposition process is mostly surface-controlled (based on controlled reactions at the first substrate surface) and thus has the advantage of providing high conformality at relatively low temperatures. However, in some embodiments, the titanium precursor may at least partially decompose. Accordingly, in some embodiments the ALD type process described herein is a pure ALD process in which no decomposition of precursors is observed. In other embodiments reaction conditions, such as reaction temperature, are selected such that a pure ALD process is achieved and no precursor decomposition takes place.

In some embodiments TiO$_2$ is selectively deposited by a vapor deposition process on a first surface of a substrate. In some embodiments a substrate comprising a first surface comprising surface —OH groups and a second, different surface is provided. As discussed above, in some embodiments one or more surfaces of the substrate may be treated in order to enhance selective deposition on one surface relative to one or more different surface prior to beginning the deposition process, for example by increasing the amount of —OH groups on the first dielectric surface. In some embodiments TiO$_2$ is selectively deposited on a first surface of a substrate by a vapor deposition process comprising:

contacting the surface of the substrate comprising OH, NH$_x$, or SH$_x$ terminations with a vaporized first precursor, for example a titanium alkoxide, and;

decomposing titanium alkoxide on the surface to form TiO$_2$.

Dual Selective Growth of Ru Metal and Dielectric

Figure 3A:
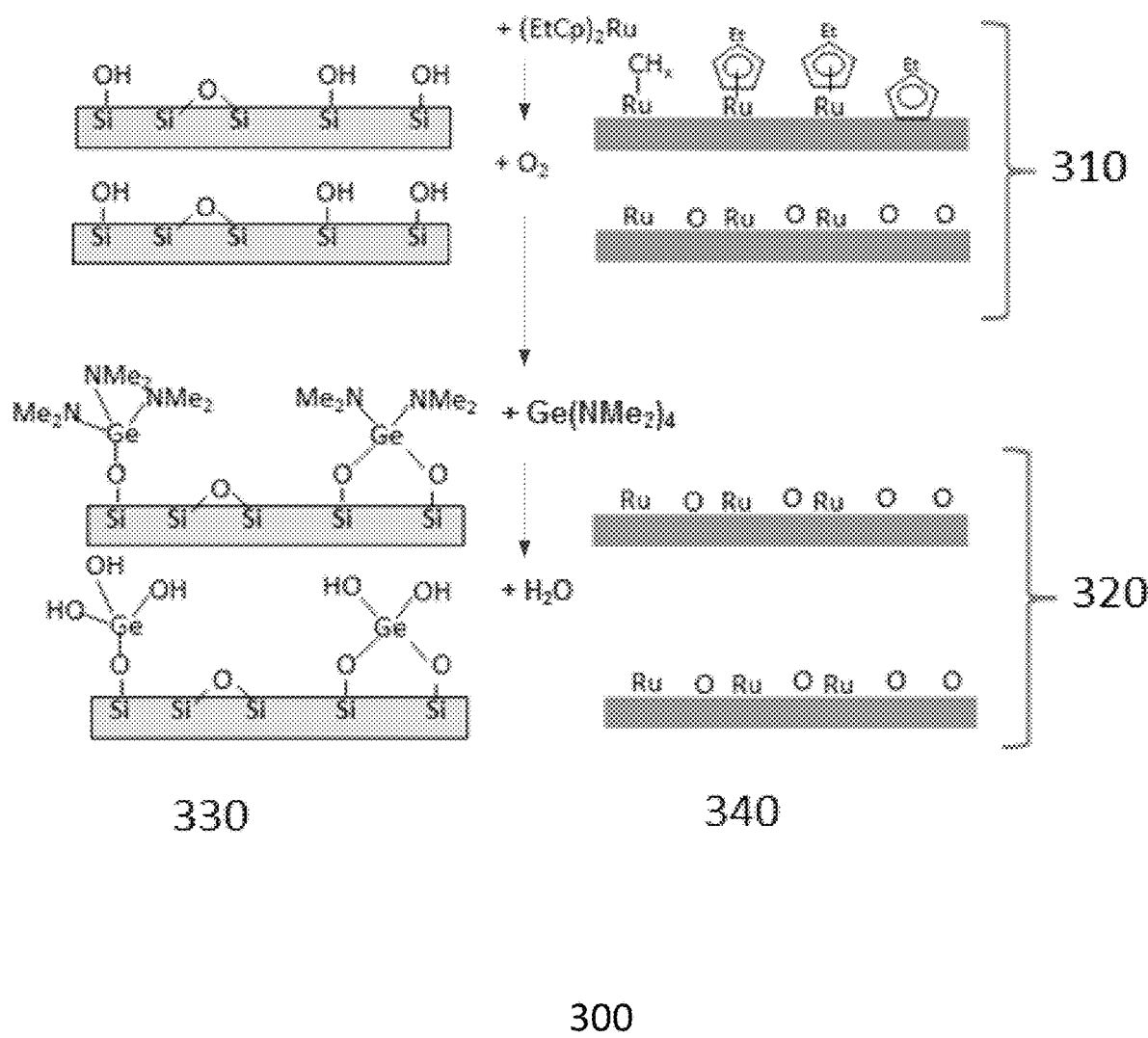
FIG. 3A illustrates dual selective deposition of Ru on a first surface of a substrate and $GeO_2$ on a second surface of the same substrate according to an embodiment.
Figure 3B:
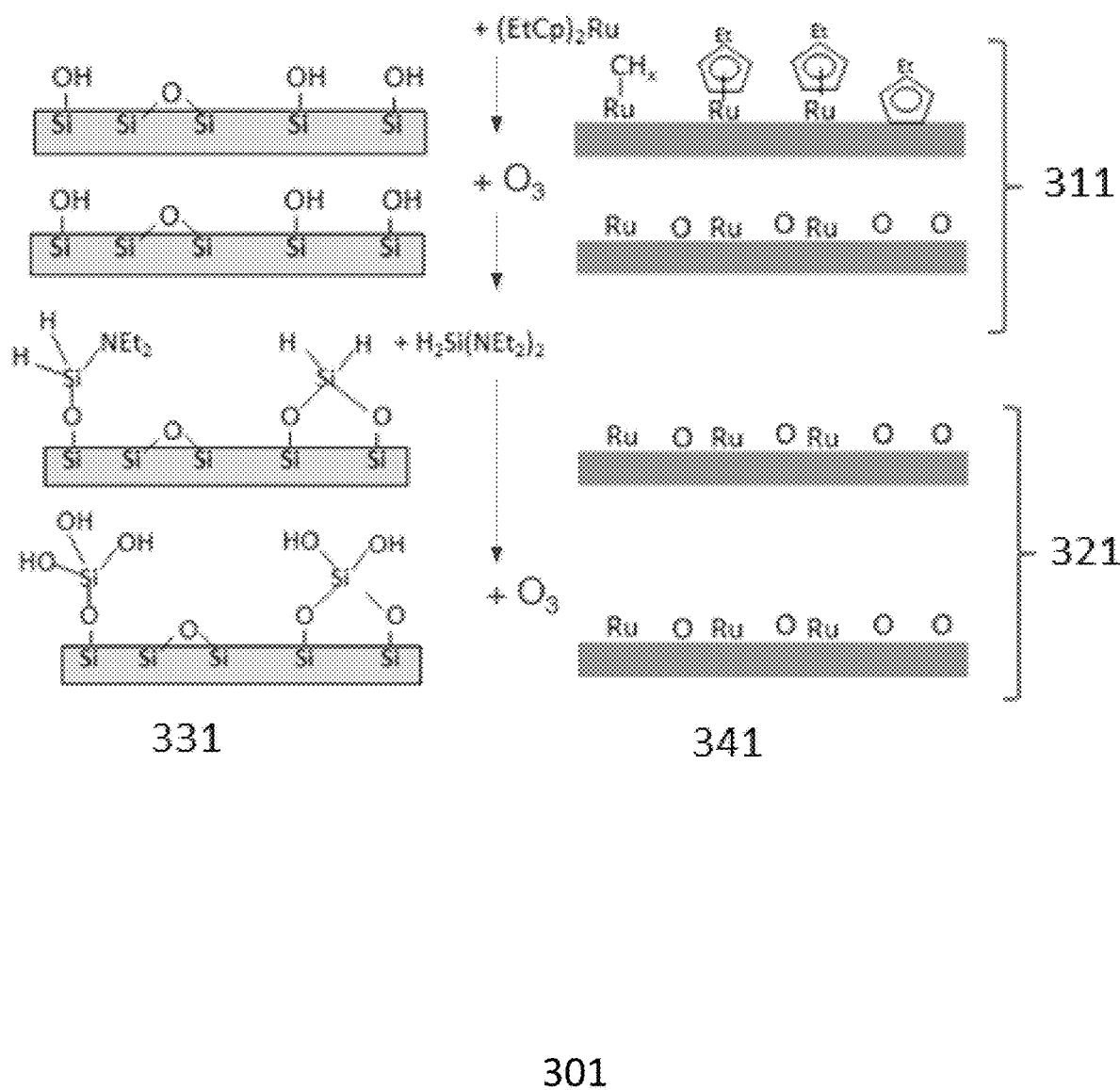
FIG. 3B illustrates dual selective deposition of Ru on a first surface of a substrate and $SiO_2$ on a second surface of the same substrate according to an embodiment.

Referring to FIGS. 3A and 3B, and in some embodiments dual selective deposition of a Ru film and a dielectric film 300, 301 can be accomplished on a substrate comprising a first metal surface 340, 341 and a second dielectric surface 330, 331. In some embodiments Ru can be selectively deposited on the first metal surface 340, 341 by a selective deposition process 310, 311 as described herein above. In some embodiments the Ru precursor used in the dual selective deposition process is a Cp-based ruthenium precursor, such as Ru(EtCp)$_2$, while the second reactant comprises at least one of O$_2$ and O$_3$.

In some embodiments Ru is selectively deposited on a first metal surface 340, 341 of a substrate. In some embodiments the first metal surface 340, 341 comprises a CuO surface. In some embodiments the CuO surface is reduced to a Cu surface prior to selective deposition of Ru by exposure to a reducing agent according to methods described herein above. In some embodiments the first surface 340, 341 may comprise a W surface.

In some embodiments the first surface 340, 341 may comprise a CuO surface, which is reduced to a Cu surface, and a thin W layer is selectively deposited on the Cu surface prior to beginning the selective deposition of Ru. In some embodiments the first surface 340,341 may comprise a Cu surface on which a thin W layer is selectively deposited prior to beginning selective deposition of Ru. In some embodiments a thin W layer is selectively deposited on a first surface 340, 341 according to method described herein above prior to beginning selective deposition of Ru 310, 311. In some embodiments a thin W layer is selectively deposited on a first metal surface 340, 341 by a selective deposition process described herein above, wherein disilane is the first precursor and $WF_6$ is the W precursor. In some embodiments a second, dielectric surface 330, 331 of the substrate is deactivated prior to selectively depositing a thin W layer on the first surface of the substrate. In some embodiments the second surface 330, 331 is deactivated by removing OH groups from the second surface. In some embodiments the second surface 330, 331 is deactivated by exposing the substrate to a silylation compound, for example $Me_3SiNMe_2$.

In some embodiments the second surface 330, 331 of the substrate may comprise a dielectric surface as described herein above. In some embodiments the second surface 330, 331 of the substrate may comprise, for example a $SiO_2$, MgO, $GeO_2$, or $Al_2O_3$ surface. In some embodiments the second surface 330, 331 of the substrate may comprise OH, $NH_x$, or $SH_x$ terminations.

In some embodiments, the selective deposition of Ru 310, 311 continues until a desired thickness of Ru is obtained on the first surface. In some embodiments selective deposition of the Ru 310, 311 continues until a desired number of deposition cycles is completed. For example, in some embodiments up to about 1-50 deposition cycles for selectively depositing Ru are carried out.

In some embodiments, after Ru has been selectively deposited on a first surface 340, 341 of a substrate relative to a second, dielectric surface 330, 331 of the same substrate, the Ru surface may optionally be passivated against deposition of a dielectric by any of the methods described herein above. Additionally, in some embodiments any passivation treatment that was optionally provided on the second surface 330, 331 may optionally be removed. In some embodiments the second surface 330, 331 may optionally be activated according to methods described herein above.

After any optional surface treatment has been provided, a dielectric is selectively deposited 320, 321 on the second surface 330, 331 of the substrate relative to the selectively deposited Ru surface of the same substrate according to methods described herein above. Referring to FIG. 3A, and in some embodiments the selectively deposited dielectric may comprise $GeO_2$. Referring to FIG. 3B, and in some embodiments the selectively deposited dielectric may comprise $SiO_2$. In some embodiments $GeO_2$ is selectively deposited 320 on a second surface 330 of the substrate using a selective deposition process as described above wherein the Ge precursor comprises $Ge(NMe_2)_4$ and the second reactant comprises $H_2O$. In some embodiments $SiO_2$ is selectively deposited 321 on a second surface 331 of the substrate using a selective deposition process as described above wherein the Si precursor comprises $H_2Si(NEt_2)_2$ and the second reactant comprises $O_3$.

In some embodiments, the selective deposition of the dielectric 320, 321 continues until a desired thickness of dielectric material is obtained on the second surface. In some embodiments selective deposition of the dielectric material 320, 321 continues until a desired number of deposition cycles is completed. For example, in some embodiments up to about 1-50 deposition cycles for selectively depositing the dielectric material are carried out.

In some embodiments deposition on the first surface 340, 341 of the substrate relative to the second surface 330, 331 of the substrate, and/or on the second surface of the substrate 330, 331 relative to the first surface of the substrate 340, 341 is at least about 90% selective, at least about 95% selective, at least about 96%, 97%, 98% or 99% or greater selective. In some embodiments deposition only occurs on the first surface and does not occur on the second surface or only occurs on the second surface and does not occur on the first surface.

In some embodiments deposition on the first surface of the substrate 340, 341 relative to the second surface of the substrate 330, 331 and/or on the second surface of the substrate relative to the first surface is at least about 80% selective, which may be selective enough for some particular applications. In some embodiments the deposition on the first surface of the substrate relative to the second surface of the substrate is at least about 50% selective, which may be selective enough for some particular application.

In some embodiments after a dielectric has been selectively deposited 320, 321 on a second surface of a substrate 330, 331 relative to a selectively deposited Ru surface of the same substrate any passivation layer or surface treatment that may be present on the selectively deposited Ru surface may optionally be removed according to any of the methods described herein above. In some embodiments passivation of the first surface can be performed during each dielectric deposition cycle, as described herein above. For example, an alkylamine passivation compound or HCOOH, or both may contact the substrate during a dielectric deposition cycle, for example $GeO_2$, to passivate the first surface.

Although the dual selective deposition processes 300, 301 illustrated above proceeded with selective deposition of Ru before the selective deposition of a dielectric, one of skill in the art will understand that a dual selective deposition process may begin with the selective deposition of either Ru or a dielectric prior to the selective deposition of a second material.

Example 1

Conditions for lack of Ru deposition have been observed, in particular for processes using $Ru(EtCp)_2$ as an Ru precursor and $O_2/O_3$ as a second reactant on $SiO_2$ and other dielectric surfaces like MgO, $GeO_2$, $Al_2O_3$. In addition Ru deposition tends not to occur when attempting ALD with $Ru(EtCp)_2$ as a Ru precursor and $O_2/O_3$ as a second reaction without a long incubation period, that is many ALD cycles can occur without any growth on the dielectric surface. In general, it has been observed that $Ru(EtCp)_2$ does not react with Si—OH groups. Additionally, other Ru precursors disclosed herein may bring Ru to the dielectric surface during a first cycle, but will then have a long growth incubation time before any Ru film growth starts. Without being bound by any one particular theory, it is thought that Ru thin film growth requires Ru particles that are large enough to dissociate $O_2$, which will not occur at the dielectric surface.

As Ru is selectively deposited on a first surface of the substrate relative to a second dielectric surface of the same substrate, a dielectric material is preferably selectively deposited on a second, dielectric surface of the substrate relative to the deposited Ru surface of the same substrate. Two different Ru surface terminations have been tested for selectivity with regards to dielectric deposition, namely a Cp (cyclopentadienyl) ligand termination and an oxygen termination. For alkyl amide type metal precursors as disclosed herein above, an oxygen terminated selectively deposited Ru surface was observed to be the most de-active against selective dielectric deposition as disclosed herein above.

Tables 1 and 2 show the LEIS analysis results below; after 5 cycles of $GeO_2$ deposition the fraction of Ge on the surface is still very low.

TABLE 1

Surface fraction of Ru and Ge after $GeO_2$ ALD on a EtCp terminated Ru surface.

| Number of $GeO_2$ ALD Cycles | Ru Surface Fraction | Ge as fraction of surface area |
|---|---|---|
| 0 | 97.2 | 0 |
| 1 | 90.1 | 3.5 |
| 2 | 104.9 | 4.9 |
| 5 | 103.7 | 15.8 |
| 10 | 82.4 | 26.2 |
| 20 | 45.1 | 46.6 |
| 250 | 0 | 100 |

TABLE 2

Surface fraction of Ru and Ge after $GeO_2$ ALD on a $O_2$ terminated Ru surface.

| Number of $GeO_2$ ALD Cycles | Ru Surface Fraction | Ge as fraction of surface area |
|---|---|---|
| 0 | 94 | 0 |
| 1 | 94.2 | 0.1 |
| 2 | 100.3 | 1.5 |
| 5 | 105.8 | 4 |
| 10 | 85.8 | 9.1 |
| 20 | 75.6 | 16.2 |
| 50 | 35.6 | 45.6 |
| 250 | 0 | 100 |

Without being bound by any one particular theory, it is possible that Cp surface terminations leave uncoordinated Ru sites for alkyl amide type precursors to interact with, which is some embodiments can be passivated by an alkylamine pulse prior to selective deposition of an oxide. In some embodiments uncoordinated Ru sites may be passivated by contacting the substrate with a passivating agent during every dielectric selective deposition cycle, for example a compound comprising an alkylamine can contact the substrate during every $GeO_2$ or $SiO_2$ selective deposition cycle.

Again, without being bound by any one theory, it is possible that the oxygen used in an Ru selective deposition process may oxidize a Cu surface. Furthermore, In some embodiments Ru selective deposition temperature may be relatively high and the two metals can intermix, stopping the Ru film growth. Therefore, in a modified process flow it may be preferably for a thin W layer to be selectively deposited from $WF_6$ and disilane prior to starting Ru selective deposition. However, to achieve selective deposition of W on the Cu surface relative to the dielectric surface, the dielectric surface is preferably deactivated by removing the OH groups with a silylation compound, such as $Me_3SiNMe_2$.

Dual Selective Growth of Cu or CuO and Dielectric

Figure 4:
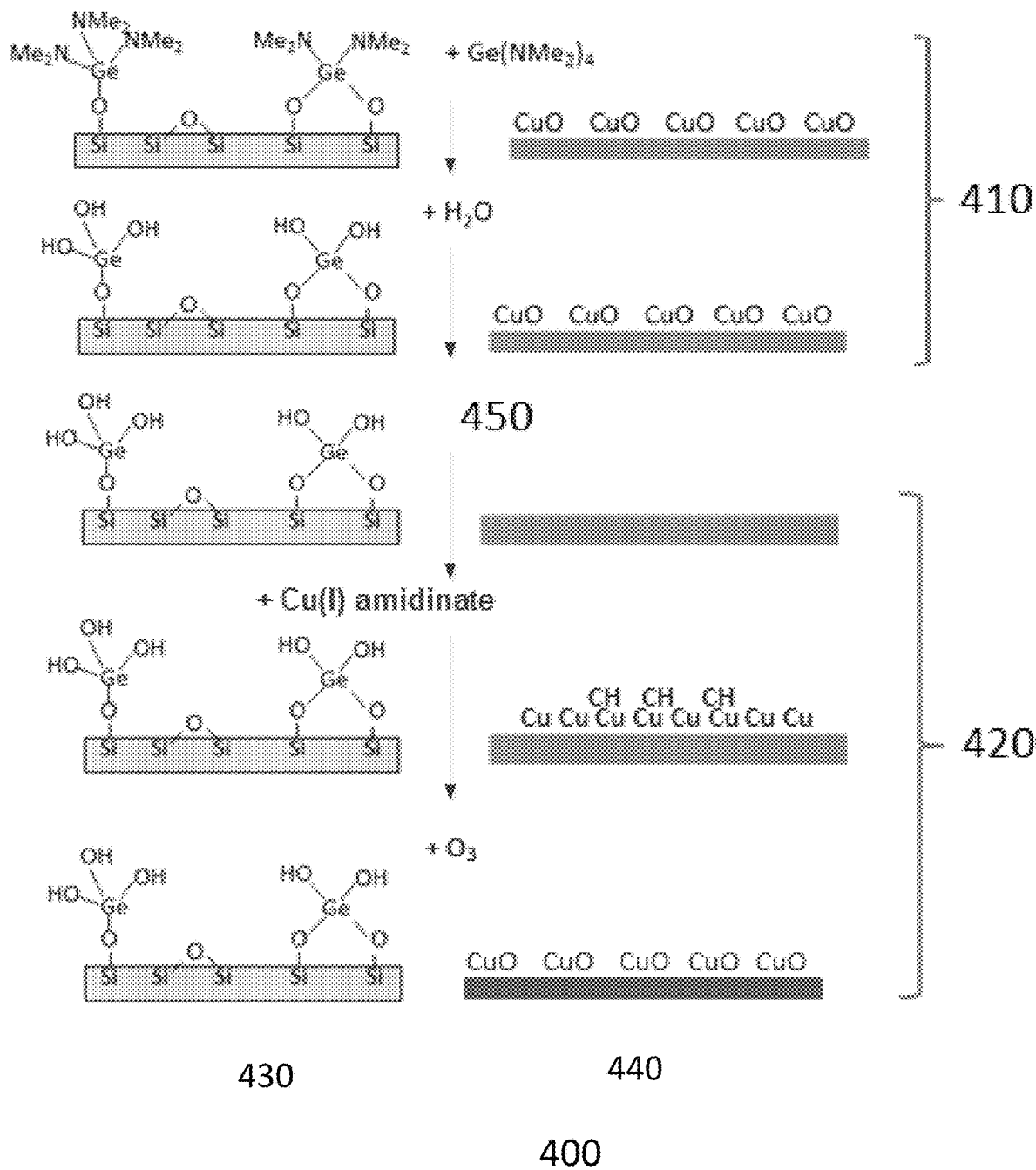
FIG. 4 illustrates dual selective deposition of Cu or CuO on a first surface of a substrate and $GeO_2$ on a second surface of the same substrate according to an embodiment.

Referring to FIG. 4, and in some embodiments dual selective deposition of Cu and a dielectric 400 can be accomplished on a substrate comprising a first metal surface 440 and a second, different surface 430. In some embodiments Cu can be selectively deposited 420 on the first metal surface 440 by a selective deposition process as described herein above. In some embodiments the Cu precursor used in the dual selective deposition 420 process is Cu amidinate.

In some embodiments the first metal surface 440 comprises a CuO surface. In some embodiments the CuO surface is reduced to a Cu surface prior to selective deposition of Cu 420 by exposure to a reducing agent 450 according to methods described herein above. In some embodiments the second surface 430 of the substrate may comprise a dielectric surface as described herein above. In some embodiments the second surface 430 of the substrate may comprise, for example a $SiO_2$, MgO, $GeO_2$, or $Al_2O_3$ surface. In some embodiments the second surface 430 of the substrate may comprise OH, $NH_x$, or $SH_x$ terminations. In some embodiments either the first or second surface may optionally be treated to enhance selective deposition according to the methods described herein above prior to beginning selective deposition.

In some embodiments a dielectric is selectively deposited 410 on the second surface 430 of the substrate relative to the first surface 440 of the same substrate according to methods described herein above. In some embodiments the selectively deposited dielectric may comprise $GeO_2$, as is depicted in FIG. 4. In some embodiments the selectively deposited dielectric may comprise $SiO_2$. In some embodiments $GeO_2$ is selectively deposited 410 on a second surface 430 of the substrate using a selective deposition process as described above wherein the Ge precursor comprises $Ge(NMe_2)_4$ and the second reactant comprises $H_2O$.

In some embodiments, the selective deposition of the dielectric 410 continues until a desired thickness of dielectric material is obtained on the second surface 430. In some embodiments selective deposition of the dielectric material 410 continues until a desired number of deposition cycles is completed. For example, in some embodiments up to about 1-50 deposition cycles for selectively depositing the dielectric material are carried out.

In some embodiments after selective deposition of a dielectric 410 on a second surface of the substrate the substrate may optionally be treated 450 to enhance selective deposition according to the methods described herein above. In some embodiments this may comprise exposing the first surface 440 to a reducing agent. In some embodiments a CuO surface may be exposed to HCOOH to thereby be reduced to a Cu surface.

In some embodiments Cu is selectively deposited 420 on a first surface 440 of the substrate relative to the selectively deposited dielectric surface of the same substrate. In some embodiments Cu is selectively deposited by decomposition of Cu amidinate as described herein above.

In some embodiments, the selective deposition of Cu 420 continues until a desired thickness of Cu is obtained on the first surface. In some embodiments deposition on the first surface 440 of the substrate relative to the second surface 430 of the substrate, and/or on the second surface 430 of the substrate relative to the first surface 440 of the substrate is at least about 90% selective, at least about 95% selective, at least about 96%, 97%, 98% or 99% or greater selective. In some embodiments deposition only occurs on the first surface 440 and does not occur on the second surface 430 or only occurs on the second surface and does not occur on the first surface.

In some embodiments deposition on the first surface 440 of the substrate relative to the second surface 430 of the substrate and/or on the second surface 430 of the substrate relative to the first surface 440 is at least about 80% selective, which may be selective enough for some particular applications. In some embodiments the deposition on the first surface of the substrate relative to the second surface of the substrate is at least about 50% selective, which may be selective enough for some particular application.

In some embodiments after Cu has been selectively deposited 420 on a first surface 440 of a substrate relative to a selectively deposited dielectric surface of the same substrate any passivation layer or surface treatment that may be present on the selectively deposited dielectric surface may optionally be removed according to any of the methods described herein above. Additionally, in some embodiments the selectively deposited Cu film may be oxidized to form a CuO surface according to methods described herein above.

Although dual selective deposition process 400 illustrated above began with selective deposition of a dielectric 410 before the selective deposition of Cu 420, one of skill in the art will understand that a dual selective deposition process may begin with the selective deposition of either Cu or a dielectric prior to the selective deposition of a second material.

Example 2

Conditions for lack of $GeO_2$ deposition have been observed, in particular for deposition processes using Ge alkylamide and $H_2O$ on a CuO surface as compared to a W surface. As illustrated by Tables 3 and 4 below, after 10 cycles of $GeO_2$ deposition the fraction of Ge on the CuO surface is essentially negligible (Table 3), whereas $GeO_2$ deposition has definitively occurred after 10 cycles on a W surface (Table 4).

TABLE 3

Surface fraction of Cu and Ge after $GeO_2$ ALD on Cu(O).

| Number of $GeO_2$ ALD Cycles | Cu (At. % fraction) | Ge (At. % fraction) |
|---|---|---|
| 5 | 35 | 0 |
| 10 | 30 | 0 |
| 50 | 12 | 12 |
| 250 | 2 | 24 |

TABLE 4

Surface fraction of W and Ge after $GeO_2$ ALD on W.

| Number of $GeO_2$ ALD Cycles | W (At. % fraction) | Ge (At. % fraction) |
|---|---|---|
| 5 | 15 | 6 |
| 10 | 12 | 12 |
| 50 | 4 | 24 |
| 250 | 0 | 26 |

Further analysis was performed via LEIS, which showed essentially no $GeO_2$ film growth after 20 $GeO_2$ ALD cycles.

As for the selectivity of Cu precursors, Cu(I) amidinates have shown non-reactivity towards $SiO_2$ surfaces, particularly Si—OH terminated surfaces. Without being bound by a particular theory, it is believed that the similarities between $GeO_2$ and $SiO_2$ leads to similar surface behavior with respect to Cu(I) amidinates.

Dual Selective Growth of Sb and W

Figure 5:
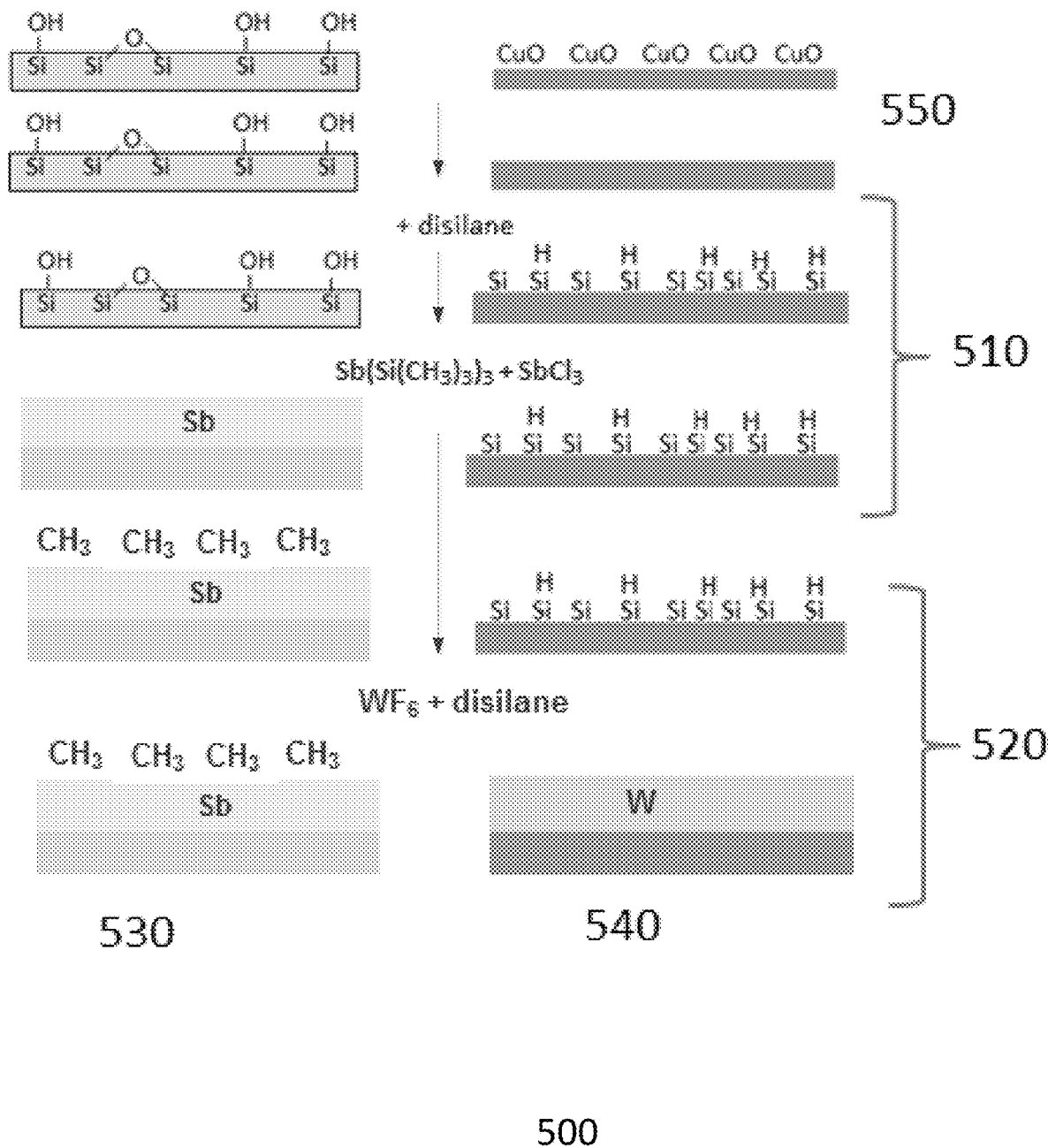
FIG. 5 illustrates dual selective deposition of Sb on a first surface of a substrate and W on a second surface of the same substrate according to an embodiment.

Referring to FIG. 5, and in some embodiments dual selective deposition of W and Sb 500 can be accomplished on a substrate comprising a first surface 540 and a second different surface 530. In some embodiments Sb can be selectively deposited on a second surface 530 by a selective deposition process 510 as described herein above. In some embodiments the Sb precursors used in the selective deposition process 510 are $Sb(Si(CH_3)_3)_3$ and $SbCl_3$. In some embodiments W can be selectively deposited on a first surface 540 by a selective deposition process 520 as described herein above. In some embodiments the first precursor used in the selective deposition process is disilane and the W precursor is $WF_6$.

In some embodiments dual selective deposition of W and Sb 500 can be accomplished on a substrate comprising a first metal surface 540 and a second, dielectric surface 530. In some embodiments W and Sb can be selectively deposited on a substrate comprising a first dielectric surface and a second, different surface. In some embodiments the first surface 540 may comprise Cu, or CuO. In some embodiments the first surface may comprise a silicon surface. In some embodiments the first silicon surface can comprise Si—H terminations. In some embodiments the second surface 530 an comprise a hydrophilic surface. In some embodiments the second surface 530 can comprise an OH, $NH_x$, or $SH_x$ terminated surface. In some embodiments the second surface 530 can comprise a $SiO_2$ or other dielectric surface.

In some embodiments the substrate is optionally treated 550 to enhance selective deposition according to the methods described herein above prior to beginning selective deposition. In some embodiments the second, CuO surface is exposed to a reducing agent and reduced to a Cu surface at 550 according to methods described herein above prior to the beginning of a selective deposition process. In some embodiments a previously reduced metal surface may additionally be deactivated according to the methods described herein above. In some embodiments the previously reduced surface may be deactivated by exposure to disilane to produce a Si—H terminated surface.

In some embodiments Sb is selectively deposited 510 on the second surface 530 of the substrate relative to the first surface 540 of the same substrate according to methods described herein above. In some embodiments the Sb precursors used in the selective deposition process are $Sb(Si(CH_3)_3)_3$ and $SbCl_3$.

In some embodiments, the selective deposition of Sb 510 continues until a desired thickness of Sb is obtained on the second surface 530. In some embodiments selective deposition of Sb 510 continues until a desired number of deposition cycles is completed. For example, in some embodiments up to about 1-50 deposition cycles for selectively depositing Sb are carried out.

In some embodiments after selective deposition of Sb 510 on a second surface 530 of the substrate may optionally be treated to enhance selective deposition according to the methods described herein above.

In some embodiments W is selectively deposited 520 on a first surface 540 of the substrate relative to the selectively deposited Sb surface of the same substrate. In some embodiments W is selectively deposited 520 according to methods described herein above. In some embodiments the first precursor used in the selective deposition 520 process is disilane and the W precursor is $WF_6$.

In some embodiments, the selective deposition of W 520 continues until a desired thickness of W is obtained on the first surface. In some embodiments deposition on the first surface 540 of the substrate relative to the second surface 530 of the substrate, and/or on the second surface 530 of the substrate relative to the first surface 540 of the substrate is at least about 90% selective, at least about 95% selective, at least about 96%, 97%, 98% or 99% or greater selective. In some embodiments deposition only occurs on the first surface and does not occur on the second surface or only occurs on the second surface and does not occur on the first surface.

In some embodiments deposition on the first surface 540 of the substrate relative to the second surface 530 of the substrate and/or on the second surface of the substrate relative to the first surface is at least about 80% selective, which may be selective enough for some particular applications. In some embodiments the deposition on the first surface of the substrate relative to the second surface of the substrate is at least about 50% selective, which may be selective enough for some particular application.

In some embodiments after W has been selectively deposited 520 on a first surface 540 of a substrate relative to a selectively deposited Sb surface of the same substrate any passivation layer or surface treatment that may be present on the selectively deposited Sb surface may optionally be removed according to any of the methods described herein above.

Although dual selective deposition process 500 illustrated above began with selective deposition of Sb 510 before the selective deposition of W 520, one of skill in the art will understand that a dual selective deposition process may begin with the selective deposition of either W or Sb prior to the selective deposition of a second material.

Dual Selective Growth of Ni(O) and $GeO_2$

Figure 6:
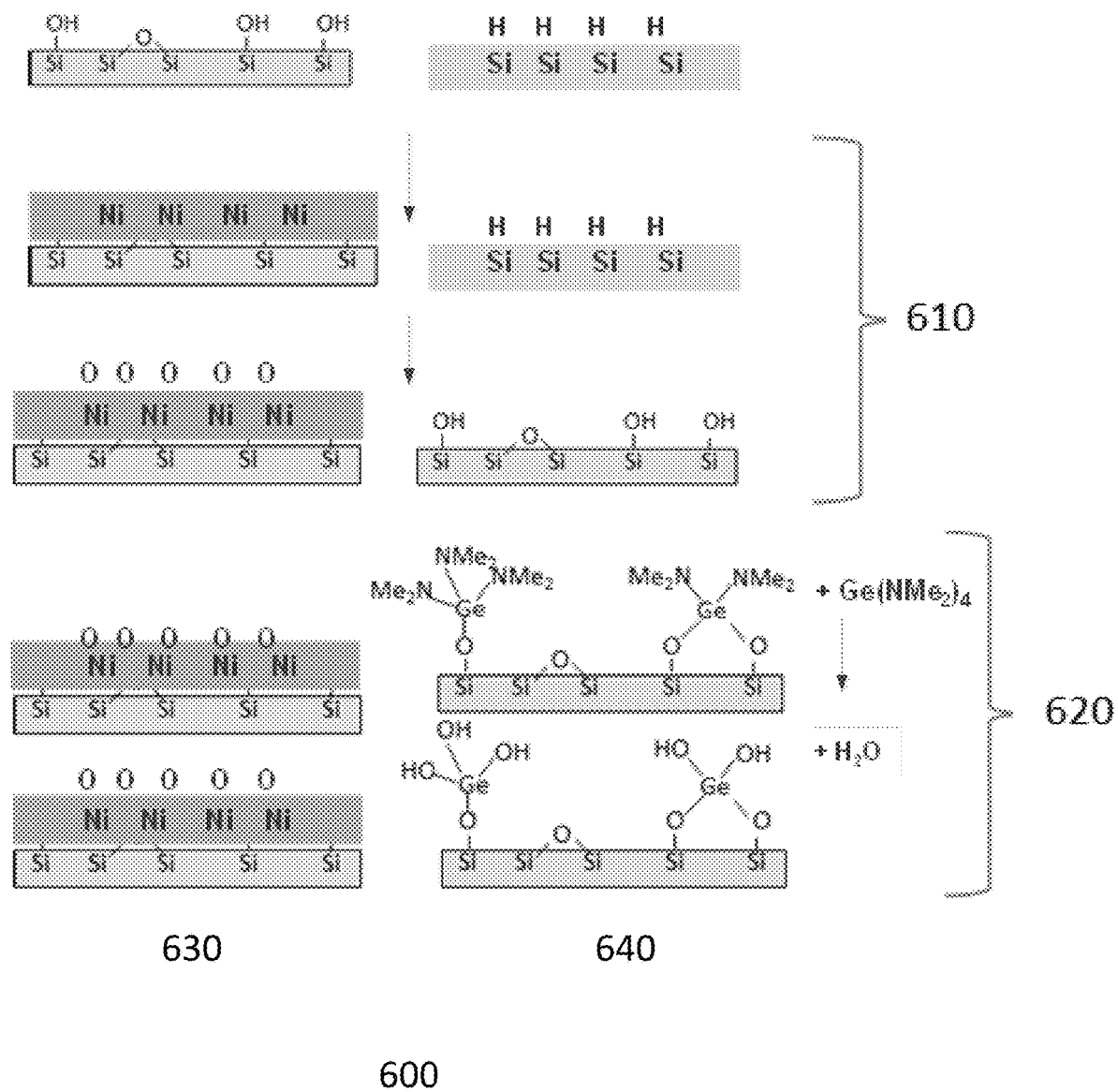
FIG. 6 illustrates dual selective deposition of Ni or NiO on a first surface of a substrate and $GeO_2$ on a second surface of the same substrate according to an embodiment.

Referring to FIG. 6, and in some embodiments dual selective deposition 600 of $GeO_2$ and Ni or NiO can be accomplished on a substrate comprising a first surface 640 and a second, different surface 630. In some embodiments $GeO_2$ can be selectively deposited on a first surface 640 by a selective deposition process 620 as described herein above. In some embodiments Ni or NiO can be selectively deposited on the second surface 630 by a selective deposition process 610 as described herein above. In some embodiments the Ni precursor used in the selective deposition process 610 comprises a nickel betadiketiminato compound, such bis(4-N-ethylamino-3-penten-2-N-ethyliminato)nickel (II) [Ni(EtN-EtN-pent)2]. In some embodiments the Ge precursor used in a selective deposition process 620 comprises $Ge(NMe_2)_4$ and the second reactant comprises $H_2O$. In some embodiments Ni or NiO is preferably selectively deposited prior to the selective deposition of $GeO_2$.

In some embodiments the first surface 640 comprises a dielectric material. In some embodiments the first surface 640 comprises Si—H surface terminations. In some embodiments the first surface comprises a metal. In some embodiments the second surface 630 comprises a hydrophilic surface. In some embodiments the hydrophilic surface comprises a dielectric surface, such as $SiO_2$. In some embodiments the hydrophilic surface comprises OH, $NH_x$, or $SH_x$ terminations. In some embodiments the substrate surface may optionally be treated to enhance selective deposition according to the methods described herein above.

In some embodiments Ni or NiO is selectively deposited 610 on a second surface 630 of the substrate relative to the selectively deposited dielectric surface of the same substrate. In some embodiments Ni or NiO is selectively deposited 610 by decomposition of bis(4-N-ethylamino-3-penten-2-N-ethyliminato)nickel (II) as described herein above. In some embodiments NiO is selectively deposited by adsorption of Ni compounds, such as bis(4-N-ethylamino-3-penten-2-N-ethyliminato)nickel (II) followed by oxidation of the Ni compound to form NiO. In some embodiments NiO is selectively deposited by self-limiting adsorption of Ni compounds, such as bis(4-N-ethylamino-3-penten-2-N-ethyliminato)nickel (II) as described herein above followed by oxidation of the Ni compound to form up to molecular layer of NiO.

In some embodiments, the selective deposition of Ni or NiO 610 continues until a desired thickness of Ni or NiO is obtained on the second surface 630.

In some embodiments deposition on the first surface 640 of the substrate relative to the second surface 630 of the substrate, and/or on the second surface 630 of the substrate relative to the first surface 640 of the substrate is at least about 90% selective, at least about 95% selective, at least about 96%, 97%, 98% or 99% or greater selective. In some embodiments deposition only occurs on the first surface and does not occur on the second surface or only occurs on the second surface and does not occur on the first surface.

In some embodiments deposition on the first surface of the substrate relative to the second surface of the substrate and/or on the second surface of the substrate relative to the first surface is at least about 80% selective, which may be selective enough for some particular applications. In some embodiments the deposition on the first surface of the substrate relative to the second surface of the substrate is at least about 50% selective, which may be selective enough for some particular application.

In some embodiments the substrate is oxidized following the selective deposition of Ni 610 according to methods described herein above. In some embodiments the oxidation produces OH surface terminations on the first surface 640 of the substrate. In some embodiments the oxidation oxidizes the selectively deposited Ni to form Ni(O).

In some embodiments $GeO_2$ is selectively deposited 620 on a first surface 640 of the substrate using a selective deposition process as described above wherein the Ge precursor comprises $Ge(NMe_2)_4$ and the second reactant comprises $H_2O$. In some embodiments, the selective deposition of $GeO_2$ 620 continues until a desired thickness of $GeO_2$ is obtained on the first surface. In some embodiments selective deposition of $GeO_2$ 620 continues until a desired number of deposition cycles is completed. For example, in some embodiments up to about 1-50 deposition cycles for selectively depositing $GeO_2$ are carried out.

In some embodiments after $GeO_2$ has been selectively deposited 620 on a first surface 640 of a substrate relative to a selectively deposited Ni surface of the same substrate any passivation layer or surface treatment that may be present on the selectively deposited Ni or Ni(O) surface may optionally be removed according to any of the methods described herein above.

Although dual selective deposition process 600 illustrated above began with selective deposition of Ni 610 before the selective deposition of $GeO_2$ 620, one of skill in the art will understand that a dual selective deposition process may begin with the selective deposition of either $GeO_2$ or Ni prior to the selective deposition of a second material.

Example 3

A nickel surface can be oxidized to passivate it against subsequent germanium oxide deposition, forming Ni(O). LEIS analysis showed some incubation, no growth, or very little growth of $GeO_2$ on a Ni(O) surface:

TABLE 5

Surface fraction of Ni and Ge after GeO$_2$ ALD on Ni(O) surface.

| Number of GeO$_2$ ALD Cycles | Ni Surface Fraction (%) | Ge Surface Fraction (%) |
|---|---|---|
| 1 | 100 | 0 |
| 2 | 96 | 0 |
| 5 | 62 | 2 |
| 10 | 76 | 2 |
| 20 | 32 | 4 |
| 50 | 52 | 40 |
| 250 | 0 | 60 |

Dual Selective Growth of Ni and W

Figure 7A:
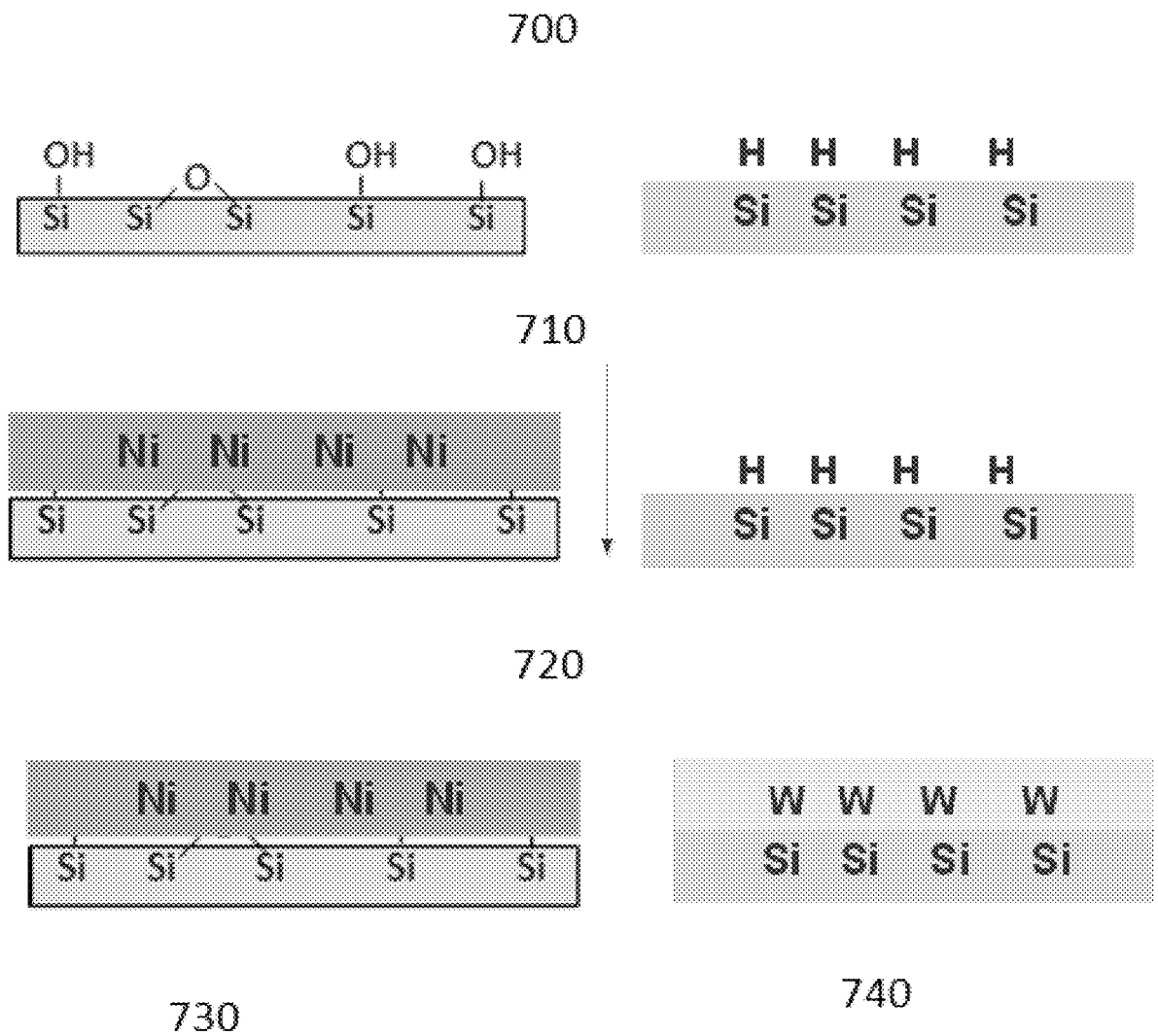
FIG. 7A illustrates dual selective deposition of Ni on a first surface of a substrate and W on a second surface of the same substrate according to an embodiment.
Figure 7B:
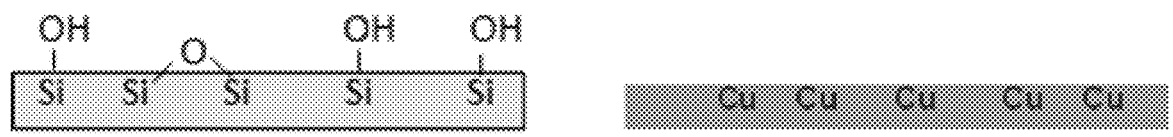
FIG. 7B illustrates dual selective deposition of Ni on a first surface of a substrate and W on a second surface of the same substrate according to another embodiment.
Figure 7B:
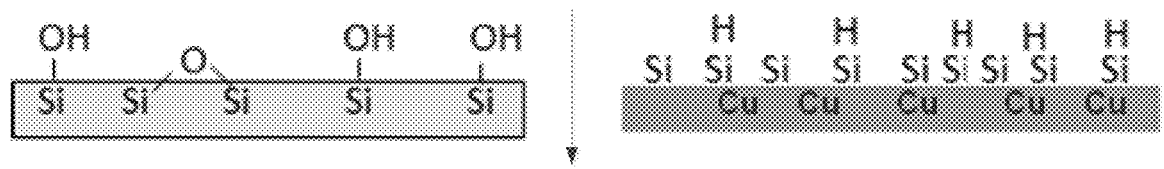
Figure 7B:
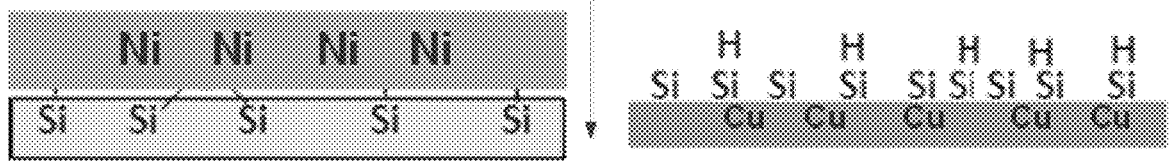
Figure 7B:

Referring to FIG. 7A and FIG. 7B, and in some embodiments dual selective deposition of W and Ni 700, 701 can be accomplished on a substrate comprising a first surface 740, 741 and a second different surface 730, 731. In some embodiments Ni can be selectively deposited on a second surface 730, 731 by a selective deposition process 710, 711 as described herein above. In some embodiments the Ni precursor used in the selective deposition process 710, 711 comprises a nickel betadiketiminato compound, such bis(4-N-ethylamino-3-penten-2-N-ethyliminato)nickel (II) [Ni(EtN-EtN-pent)2]. In some embodiments W can be selectively deposited on a first surface 740, 741 by a selective deposition process 720, 721 as described herein above. In some embodiments the first precursor used in the selective deposition process is disilane and the W precursor is WF$_6$.

Referring to FIG. 7A, and in some embodiments W and Ni can be selectively deposited 700 on a substrate comprising a first dielectric surface 740 and a second, different surface 730. Referring to FIG. 7B, and in some embodiments dual selective deposition of W and Ni 701 can be accomplished on a substrate comprising a first metal surface 741 and a second, dielectric surface 731. In some embodiments the first surface 741 may comprise Cu, or CuO. In some embodiments the first surface 740 may comprise a silicon surface. In some embodiments the first silicon surface 740 can comprise Si—H terminations. In some embodiments the second surface 730, 731 can comprise a hydrophilic surface. In some embodiments the second surface can comprise an OH, NH$_x$, or SH$_x$ terminated surface. In some embodiments the second surface can comprise a SiO$_2$ or other dielectric surface.

In some embodiments the substrate is optionally treated to enhance selective deposition 751 according to the methods described herein above prior to beginning selective deposition. In some embodiments the second, CuO surface is exposed to a reducing agent and reduced to a Cu surface according to methods described herein above prior to the beginning of a selective deposition process. In some embodiments a previously reduced metal surface may additionally be deactivated according to the methods described herein above. In some embodiments the previously reduced surface may be deactivated by exposure to disilane 751 to produce a Si—H terminated surface.

In some embodiments Ni is selectively deposited 710, 711 on the second surface 730, 731 of the substrate relative to the first surface 740, 741 of the same substrate according to methods described herein above. In some embodiments the Ni precursor used in the selective deposition process comprises a nickel betadiketiminato compound, such bis(4-N-ethylamino-3-penten-2-N-ethyliminato)nickel (II) [Ni(EtN-EtN-pent)2].

In some embodiments, the selective deposition of Ni 710, 711 continues until a desired thickness of Ni is obtained on the second surface. In some embodiments selective deposition of Ni 710, 711 continues until a desired number of deposition cycles is completed. For example, in some embodiments up to about 1-50 deposition cycles for selectively depositing Ni are carried out.

In some embodiments after selective deposition of Ni on a second surface of the substrate the substrate may optionally be treated to enhance selective deposition according to the methods described herein above.

In some embodiments W is selectively deposited 720, 721 on a first surface 740, 741 of the substrate relative to the selectively deposited Ni surface of the same substrate. In some embodiments W is selectively deposited 720, 721 according to methods described herein above. In some embodiments the first precursor used in the selective deposition process is disilane and the W precursor is WF$_6$.

In some embodiments, the selective deposition of W 720, 721 continues until a desired thickness of W is obtained on the first surface. In some embodiments deposition on the first surface 740, 741 of the substrate relative to the second surface 730, 731 of the substrate, and/or on the second surface 730, 731 of the substrate relative to the first surface 740, 741 of the substrate is at least about 90% selective, at least about 95% selective, at least about 96%, 97%, 98% or 99% or greater selective. In some embodiments deposition only occurs on the first surface and does not occur on the second surface or only occurs on the second surface and does not occur on the first surface.

In some embodiments deposition on the first surface of the substrate relative to the second surface of the substrate and/or on the second surface of the substrate relative to the first surface is at least about 80% selective, which may be selective enough for some particular applications. In some embodiments the deposition on the first surface of the substrate relative to the second surface of the substrate is at least about 50% selective, which may be selective enough for some particular application.

In some embodiments after W has been selectively deposited 720, 721 on a first surface of a substrate 740, 741 relative to a selectively deposited Ni surface of the same substrate any passivation layer or surface treatment that may be present on the selectively deposited Ni surface may optionally be removed according to any of the methods described herein above.

Although the dual selective deposition processes 700, 701 illustrated above began with selective deposition of Ni 710, 711 before the selective deposition of W 720, 721, one of skill in the art will understand that a dual selective deposition process may begin with the selective deposition of either W or Ni prior to the selective deposition of a second material.

Dual Selective Growth of Al and SiO$_2$

Figure 8:
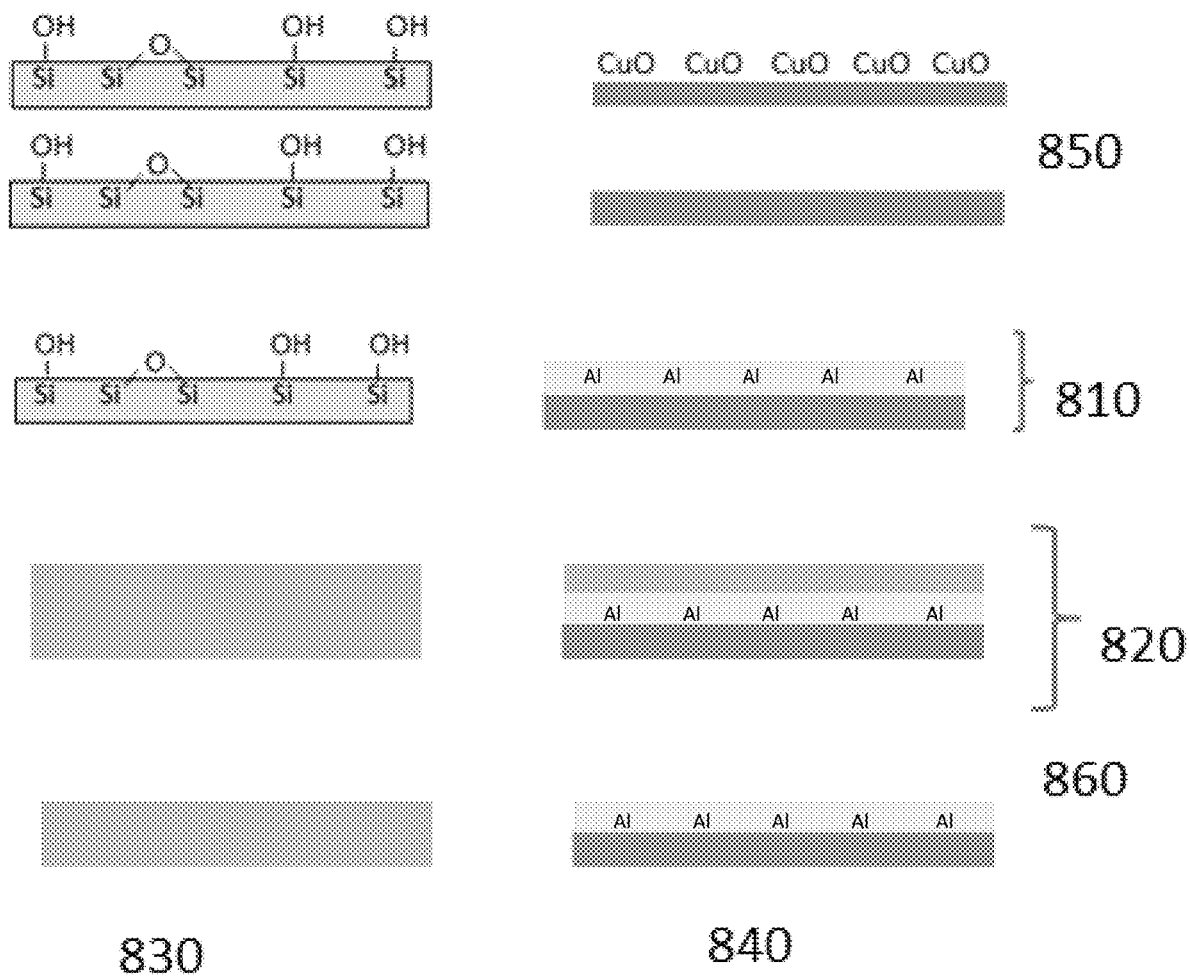
FIG. 8 illustrates dual selective deposition of Al on a first surface of a substrate and $SiO_2$ on a second surface of the same substrate according to an embodiment.

Referring to FIG. 8, and in some embodiments dual selective deposition of an Al film and a SiO$_2$ film 800 can be accomplished on a substrate comprising a first metal surface 840 and a second dielectric surface 830. In some embodiments Al can be selectively deposited on the first metal surface 840 by a selective deposition process 810 as described herein above. In some embodiments the Al precursor used in the dual selective deposition process comprises DMAH or DMEAA.

In some embodiments Al is selectively deposited 810 on a first metal surface 840 of a substrate. In some embodiments the first metal surface 840 comprises a CuO surface. In some embodiments the CuO surface is reduced to a Cu surface prior to selective deposition of Al by exposure 850 to a reducing agent according to methods described herein above.

In some embodiments the second surface 830 of the substrate may comprise a dielectric surface as described herein above. In some embodiments the second surface 830 of the substrate may comprise, for example a $SiO_2$. In some embodiments the second surface of the substrate may comprise MgO, $GeO_2$, or $Al_2O_3$ surface. In some embodiments the second surface of the substrate may comprise OH, $NH_x$, or $SH_x$ terminations.

In some embodiments, the selective deposition of Al 810 continues until a desired thickness of Al is obtained on the first surface. In some embodiments selective deposition of the Al continues until a desired number of deposition cycles is completed. For example, in some embodiments up to about 1-50 deposition cycles for selectively depositing Al are carried out.

In some embodiments, after Al has been selectively deposited on a first surface 840 of a substrate relative to a second, dielectric surface 830 of the same substrate, the Al surface may optionally be passivated against deposition of $SiO_2$ by any of the methods described herein above. Additionally, in some embodiments any passivation treatment that was optionally provided on the second surface may optionally be removed. In some embodiments the second surface may optionally be activated according to methods described herein above.

After any optional surface treatment has been provided, $SiO_2$ is selectively deposited 820 on the second surface 830 of the substrate relative to the selectively deposited Al surface of the same substrate according to methods described herein above. In some embodiments $SiO_2$ is selectively deposited 820 on a second surface 830 of the substrate using a selective deposition process as described above wherein the Si precursor comprises $H_2Si(NEt_2)_2$ and the second reactant comprises $O_3$.

In some embodiments, the selective deposition of $SiO_2$ 820 continues until a desired thickness of $SiO_2$ material is obtained on the second surface 830. In some embodiments selective deposition of the $SiO_2$ material continues until a desired number of deposition cycles is completed. For example, in some embodiments up to about 1-50 deposition cycles for selectively depositing the $SiO_2$ material are carried out.

In some embodiments deposition on the first surface 840 of the substrate relative to the second surface 830 of the substrate, and/or on the second surface 830 of the substrate relative to the first surface 840 of the substrate is at least about 90% selective, at least about 95% selective, at least about 96%, 97%, 98% or 99% or greater selective. In some embodiments deposition only occurs on the first surface and does not occur on the second surface or only occurs on the second surface and does not occur on the first surface.

In some embodiments deposition on the first surface of the substrate relative to the second surface of the substrate and/or on the second surface of the substrate relative to the first surface is at least about 80% selective, which may be selective enough for some particular applications. In some embodiments the deposition on the first surface of the substrate relative to the second surface of the substrate is at least about 50% selective, which may be selective enough for some particular application.

In some embodiments after $SiO_2$ has been selectively deposited 820 on a second surface 830 of a substrate relative to a selectively deposited Al surface of the same substrate any passivation layer or surface treatment that may be present on the selectively deposited Al surface may optionally be removed according to any of the methods described herein above. In some embodiments etching of the Al surface 860 is optional and may be desired, for example, to remove any $SiO_2$ that has been deposited on the Al surface.

Although dual selective deposition process 800 illustrated above began with selective deposition of Al 810 before the selective deposition of $SiO_2$ 820, one of skill in the art will understand that a dual selective deposition process may proceed with the selective deposition of either $SiO_2$ or Al prior to the selective deposition of a second material.

What is claimed is:

1. A method comprising:
   selectively depositing a first dielectric material on a first dielectric surface of a substrate relative to a second metal surface of the substrate by a vapor deposition process comprising at least one deposition cycle comprising alternately and sequentially contacting the substrate with a first precursor and a second reactant; and
   selectively depositing a second material on the second metal surface of the substrate relative to the first dielectric surface of the substrate by a vapor deposition process comprising at least one deposition cycle comprising alternately and sequentially contacting the substrate with a third precursor and a fourth reactant, wherein the second material comprises a second dielectric material that is different from the first dielectric material, and
   wherein the second dielectric material is selected from germanium oxide, antimony oxide, bismuth oxide, magnesium oxide, aluminum oxide, silicon oxide and titanium oxide.

2. The method of claim 1, wherein the first dielectric material comprises germanium oxide, antimony oxide, bismuth oxide, magnesium oxide, aluminum oxide, silicon oxide, nickel oxide, iron oxide, titanium oxide or cobalt oxide.

3. The method of claim 1, wherein the first dielectric surface of the substrate and the second metal surface of the substrate are adjacent.

4. The method of claim 1, wherein the first precursor comprises a metal precursor and the second reactant comprises an oxygen source.

5. The method of claim 4, wherein the metal precursor is selected from the group consisting of metal betadiketonate compounds, metal betadiketiminato compounds, metal aminoalkoxide compounds, metal amidinate compounds, metal cyclopentadienyl compounds, and metal carbonyl compounds.

6. The method of claim 4, wherein the oxygen source is selected from a group consisting of: water, ozone, molecular oxygen, $N_2O$, NO, $NO_2$, $ClO_2$, $HClO_4$, peracids, alcohols, oxygen radicals, hydroxyl radical, and $H_2O_2$.

7. The method of claim 1, wherein the first dielectric material is deposited on the first dielectric surface of the substrate relative to the second metal surface of the substrate with a selectivity of at least about 80%.

8. The method of claim 1, wherein the second material is deposited on the second metal surface of the substrate relative to the first dielectric surface of the substrate with a selectivity of at least about 80%.

9. The method of claim 1, further comprising passivating the second metal surface of the substrate prior to selectively depositing the first dielectric material on the first dielectric surface.

10. The method of claim 1, further comprising treating the first dielectric surface to inhibit deposition of the second material thereon prior to depositing the second material on the second metal surface.

11. The method of claim 1, wherein at least one of selectively depositing the first dielectric material and selectively depositing the second material comprises an atomic layer deposition (ALD) process.

12. The method of claim 1, wherein one of selectively depositing the first dielectric material and selectively depositing the second material comprises a chemical vapor deposition (CVD) process.

13. The method of claim 1, wherein the first dielectric surface comprises $SiO_2$, $MgO$, $GeO_2$, or $Al_2O_3$.

14. The method of claim 1, wherein the second metal surface comprises a metal selected from a group consisting of Cu, Ru, Al, W, Ni, Co and Sb.

15. The method of claim 1, wherein the second metal surface is oxidized to provide a metal oxide surface prior to depositing the first dielectric material on the first dielectric surface.

16. The method of claim 1, wherein the first dielectric material is selectively deposited on the first dielectric surface of the substrate and the second material is selectively deposited on the second metal surface of the substrate in the same reactor.

17. The method of claim 1, wherein the first dielectric material is selectively deposited on the first dielectric surface of the substrate and the second material is selectively deposited on the second metal surface of the substrate without further processing in between selective deposition of the first dielectric material and selective deposition of the second material.

18. The method of claim 1, wherein the first material is selectively deposited on the first dielectric surface of a substrate and the second material is selectively deposited on the second metal surface of the substrate without an airbreak in between selective deposition of the first dielectric material and selective deposition of the second material.

* * * * *